US011823980B2

(12) United States Patent
Liu et al.

(10) Patent No.: US 11,823,980 B2
(45) Date of Patent: Nov. 21, 2023

(54) PACKAGE STRUCTURE AND MANUFACTURING METHOD THEREOF

(71) Applicant: Taiwan Semiconductor Manufacturing Company, Ltd., Hsinchu (TW)

(72) Inventors: Tzuan-Horng Liu, Taoyuan (TW); Hao-Yi Tsai, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 120 days.

(21) Appl. No.: 17/389,282

(22) Filed: Jul. 29, 2021

(65) Prior Publication Data

US 2023/0031430 A1 Feb. 2, 2023

(51) Int. Cl.
| | |
|---|---|
| *H01L 23/48* | (2006.01) |
| *H01L 23/498* | (2006.01) |
| *H01L 23/538* | (2006.01) |
| *H01L 25/10* | (2006.01) |
| *H01L 21/48* | (2006.01) |
| *H01L 21/56* | (2006.01) |
| *H01L 23/00* | (2006.01) |

(52) U.S. Cl.
CPC .......... *H01L 23/481* (2013.01); *H01L 21/486* (2013.01); *H01L 21/4857* (2013.01); *H01L 21/565* (2013.01); *H01L 23/49816* (2013.01); *H01L 23/49822* (2013.01); *H01L 23/49838* (2013.01); *H01L 23/5383* (2013.01); *H01L 23/5386* (2013.01); *H01L 24/08* (2013.01); *H01L 24/24* (2013.01); *H01L 25/105* (2013.01); *H01L 2224/08148* (2013.01); *H01L 2224/24225* (2013.01); *H01L 2225/1023* (2013.01); *H01L 2225/1041* (2013.01); *H01L 2225/1058* (2013.01); *H01L 2924/1431* (2013.01); *H01L 2924/1434* (2013.01); *H01L 2924/183* (2013.01)

(58) Field of Classification Search
CPC ............ H01L 23/481; H01L 23/49816; H01L 23/49838; H01L 23/5383; H01L 23/5886
See application file for complete search history.

(56) References Cited

U.S. PATENT DOCUMENTS

| | | |
|---|---|---|
| 8,993,380 B2 | 3/2015 | Hou et al. |
| 9,281,254 B2 | 3/2016 | Yu et al. |

(Continued)

*Primary Examiner* — Nathan W Ha
(74) *Attorney, Agent, or Firm* — JCIPRNET

(57) ABSTRACT

A package structure is provided. The package structure includes a first semiconductor package and a second semiconductor package connected to the first semiconductor package. The first semiconductor package includes an integrated circuit. The integrated circuit includes a first semiconductor die and a plurality of second semiconductor dies, the plurality of second semiconductor dies are stacked on the first semiconductor die, wherein at least one of orthogonal projections of the plurality of second semiconductor dies is partially overlapped an orthogonal projection of the first semiconductor die. The integrated circuit further includes through vias formed aside the first semiconductor and arranged in a non-overlapped region of the at least one of the orthogonal projections of the plurality of second semiconductor dies with the orthogonal projection of the first semiconductor die. A manufacturing method of a package structure is also provided.

20 Claims, 48 Drawing Sheets

(56) References Cited

U.S. PATENT DOCUMENTS

| | | |
|---|---|---|
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Yu et al. |
| 9,666,502 B2 | 5/2017 | Chen et al. |
| 9,735,131 B2 * | 8/2017 | Su .................. H01L 25/50 |
| 2019/0287904 A1* | 9/2019 | Seidemann .......... H01L 24/09 |
| 2019/0326161 A1* | 10/2019 | Kelly ................ H01L 23/3107 |
| 2019/0326272 A1* | 10/2019 | Wilkerson .......... H01L 23/3675 |
| 2019/0385977 A1* | 12/2019 | Elsherbini .............. H01L 25/16 |
| 2021/0272930 A1* | 9/2021 | Choi .................. H01L 25/50 |
| 2022/0084922 A1* | 3/2022 | Lan ................... H01L 21/4857 |
| 2022/0108968 A1* | 4/2022 | Kim ................. H01L 23/642 |
| 2022/0139439 A1* | 5/2022 | Okutsu ................ H01L 23/50 |
| | | 365/226 |
| 2022/0199562 A1* | 6/2022 | Waidhas .............. H01L 25/50 |
| 2022/0223531 A1* | 7/2022 | Masuda .............. H01L 23/562 |
| 2022/0223557 A1* | 7/2022 | Chen .................. H01L 25/0657 |
| 2022/0230946 A1* | 7/2022 | Shih ................. H01L 23/49822 |
| 2022/0270976 A1* | 8/2022 | Sun .................. H01L 25/0655 |
| 2022/0302008 A1* | 9/2022 | Yen ................... H01L 24/49 |
| 2022/0302010 A1* | 9/2022 | Shen ................ H01L 23/49822 |
| 2022/0302066 A1* | 9/2022 | Cho .................... H01L 23/293 |
| 2022/0328416 A1* | 10/2022 | Yen .................... H01L 21/4889 |
| 2022/0375865 A1* | 11/2022 | Pietambaram ...... H01L 25/0655 |
| 2022/0375882 A1* | 11/2022 | Darmawikarta ........ H01L 28/10 |

* cited by examiner

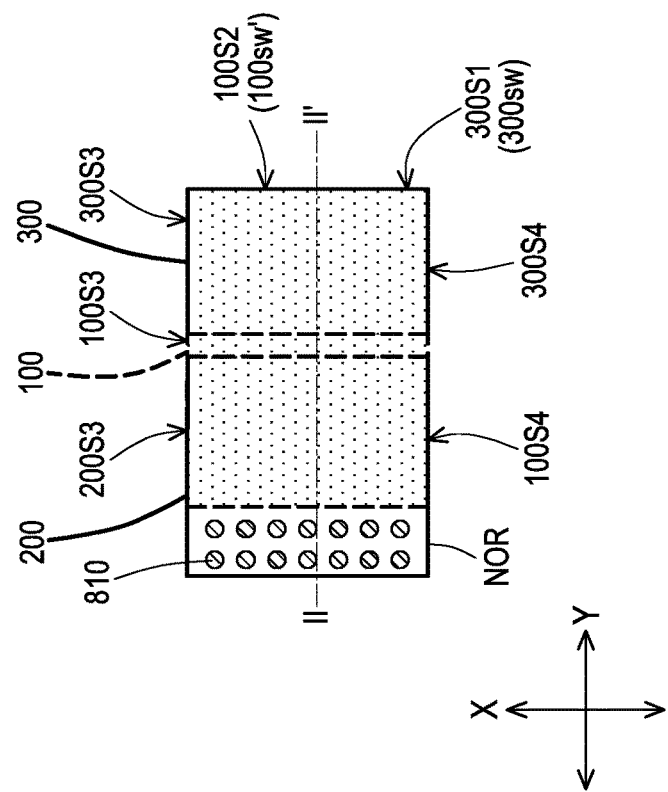
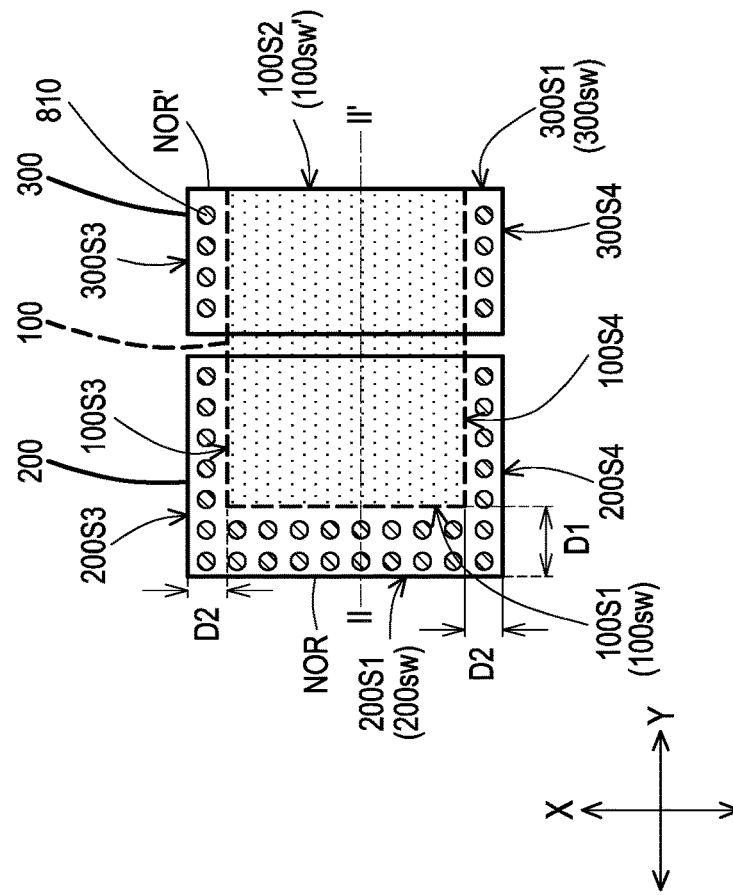
FIG. 30B
FIG. 30A

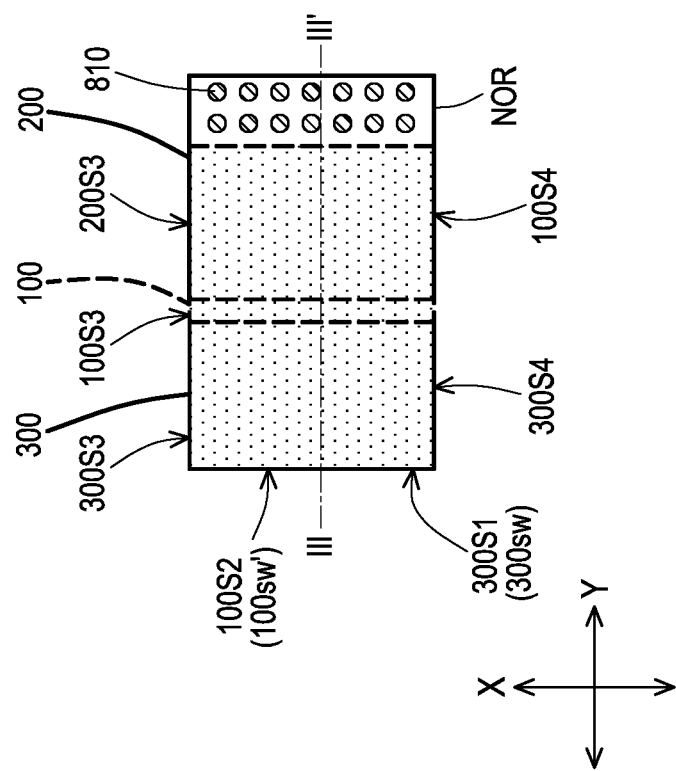
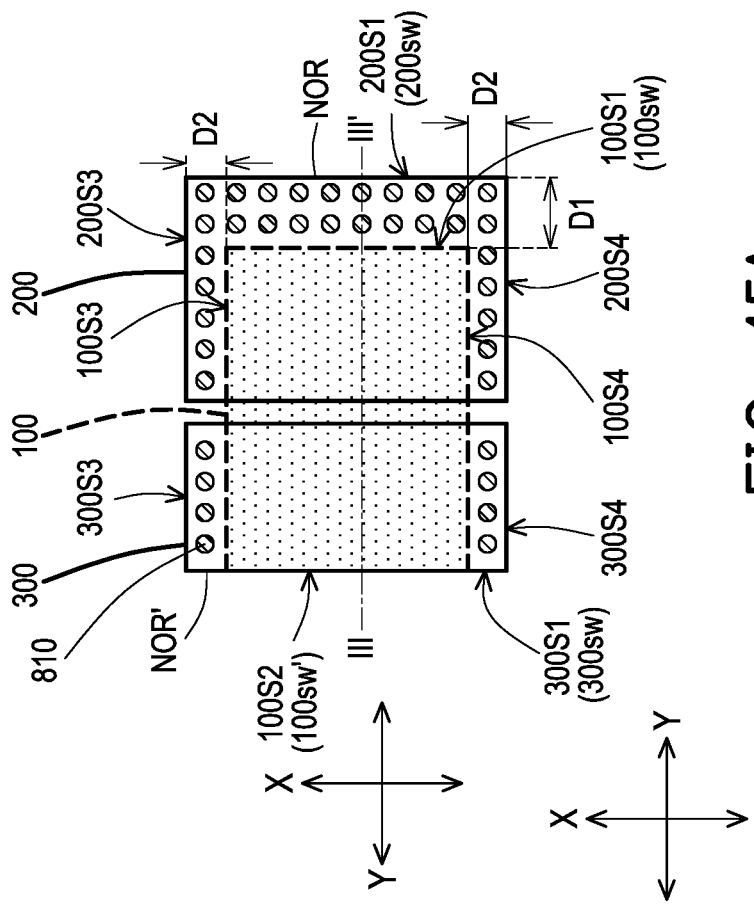
FIG. 45A
FIG. 45B

PACKAGE STRUCTURE AND MANUFACTURING METHOD THEREOF

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. As the demand for miniaturization, higher speed and greater bandwidth, as well as lower power consumption and latency has grown recently, there has grown a need for smaller and more creative packaging techniques of semiconductor dies. Currently, System-on-Integrated-Chip (SoIC) components are becoming increasingly popular for their multi-functions and compactness. However, there are challenges related to packaging process of the SoIC components.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 30A through FIG. 30C are schematic top views illustrating relative positions of semiconductor dies and through insulation vias (TIVs) in a package structure in accordance with some embodiments of the disclosure.

FIG. 45A through FIG. 45C are schematic top views illustrating relative positions of semiconductor dies and through insulation vias (TIVs) in a package structure in accordance with some embodiments of the disclosure.

DETAILED DESCRIPTION

Figure 1:
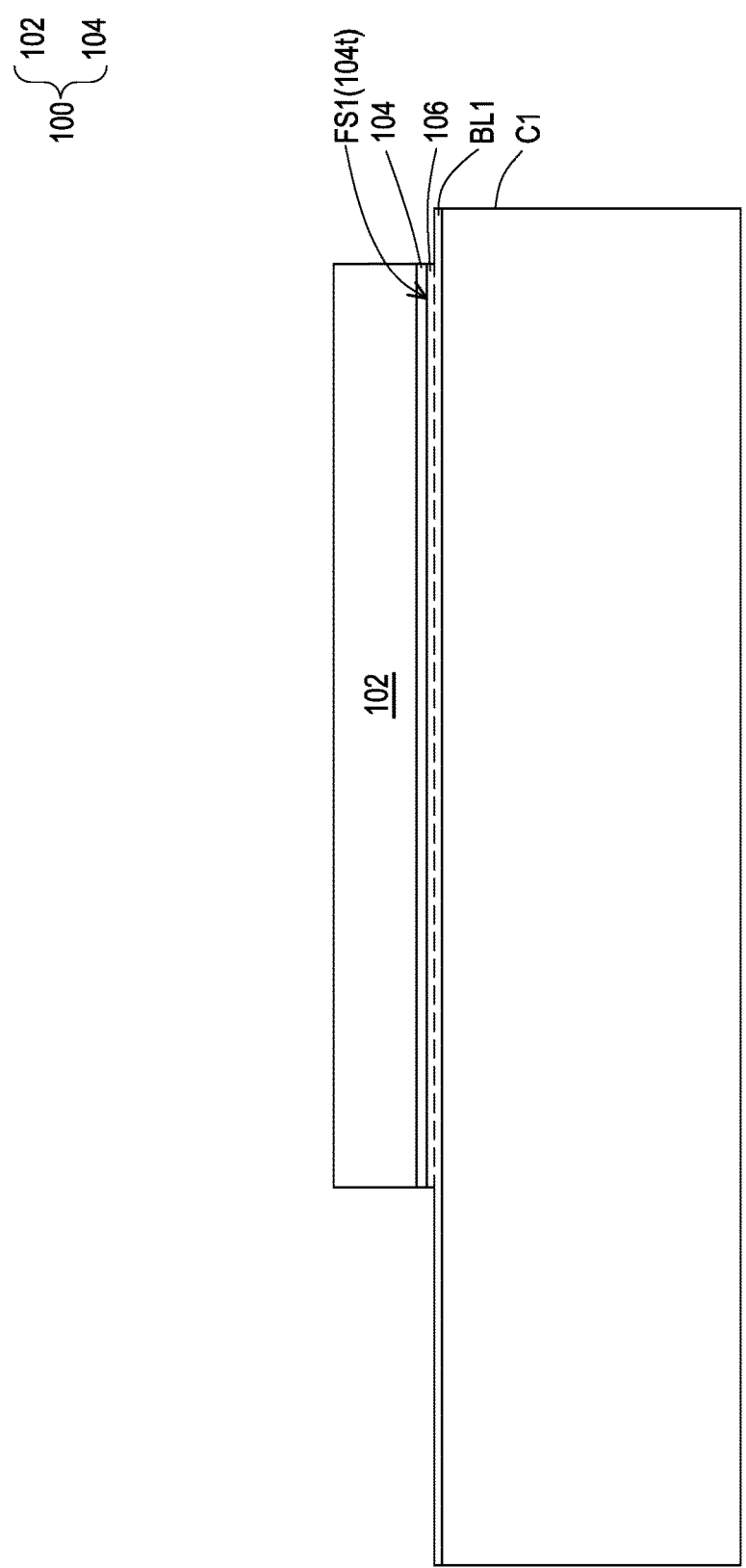
FIG. 1 through FIG. 14 are schematic cross-sectional views illustrating intermediate steps during a process for forming a package structure in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Embodiments discussed herein may be discussed in a specific context, namely a semiconductor package structure, such as a system-on-integrated chip (SoIC) package in an integrated fan-out (InFO) package structure, and a method of forming the same. The disclosed embodiments include a SoIC package including an integrated circuit. The integrated circuit may include a first semiconductor die and a plurality of second semiconductor dies hybrid bonded to the first semiconductor die, wherein at least one of orthogonal projections of the plurality of second semiconductor dies is partially overlapped an orthogonal projection of the first semiconductor die, and a plurality of through vias are formed aside the first semiconductor for external electrical connection of the plurality of the second dies The various embodiments provide different package structures in which the through substrate vias (or through silicon vias) of the semiconductor die are absent for reduction of process cost.

Figure 14:
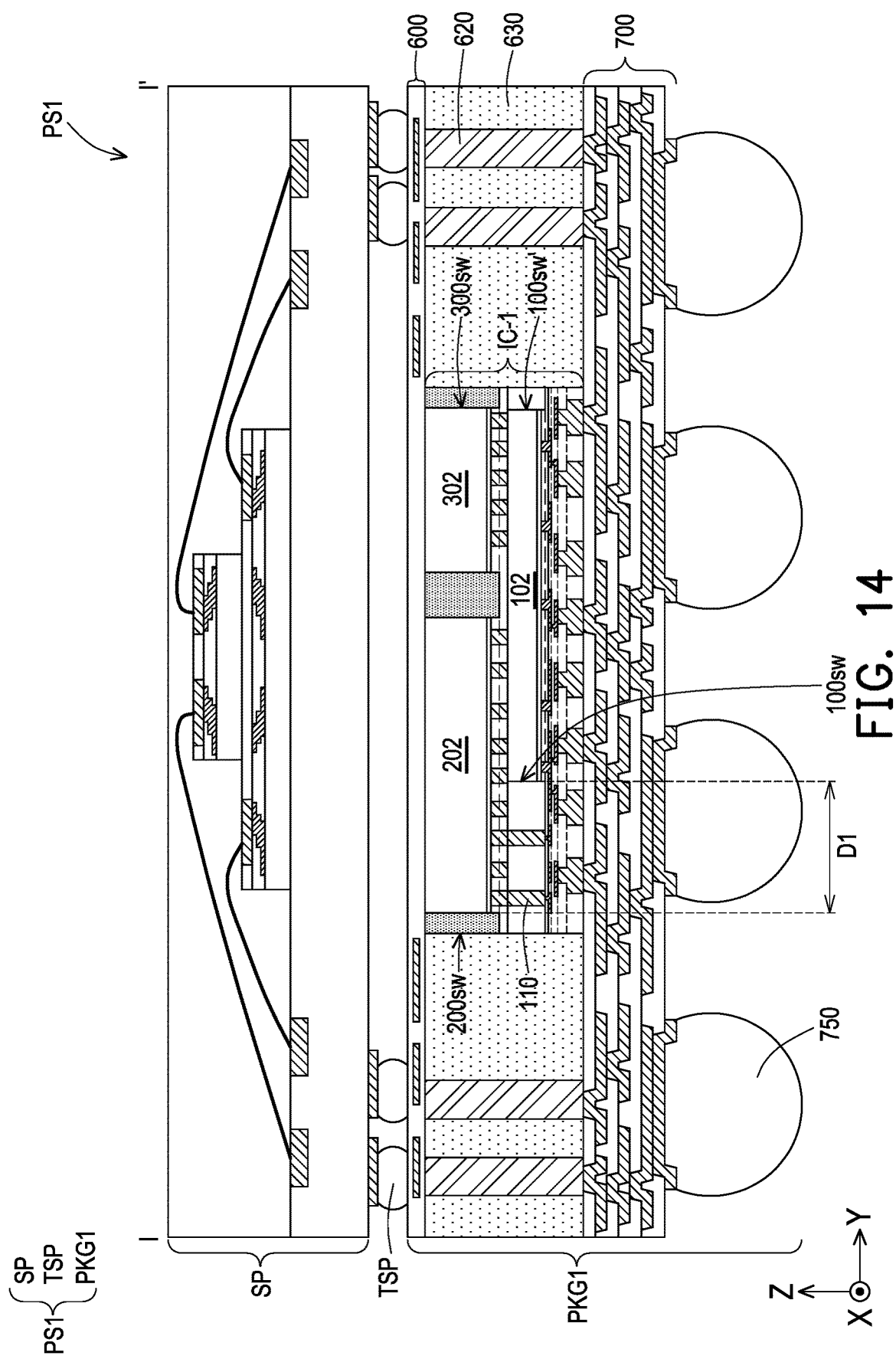
Figure 15B:
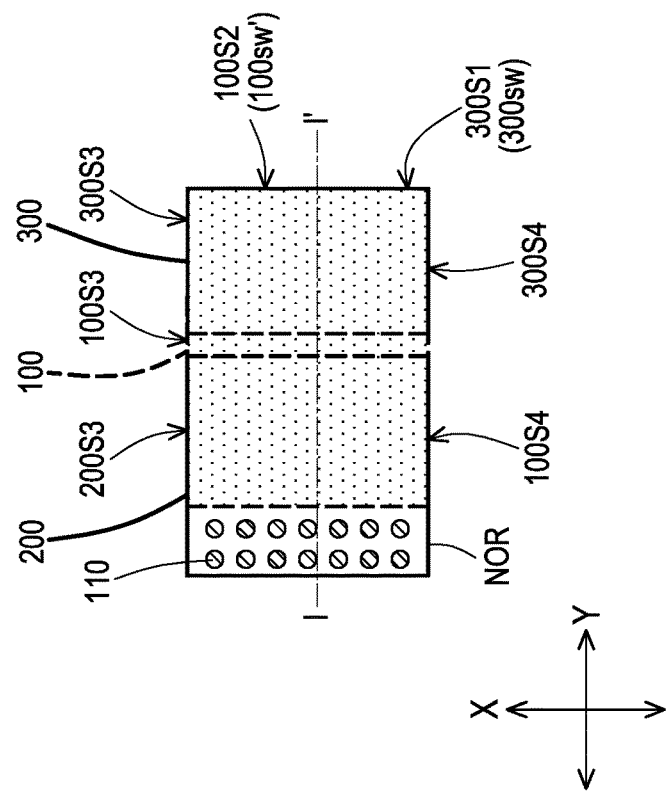
FIG. 15A through FIG. 15C are schematic top views illustrating relative positions of semiconductor dies and through dielectric vias (TDVs) in a package structure in accordance with some embodiments of the disclosure.
Figure 15A:
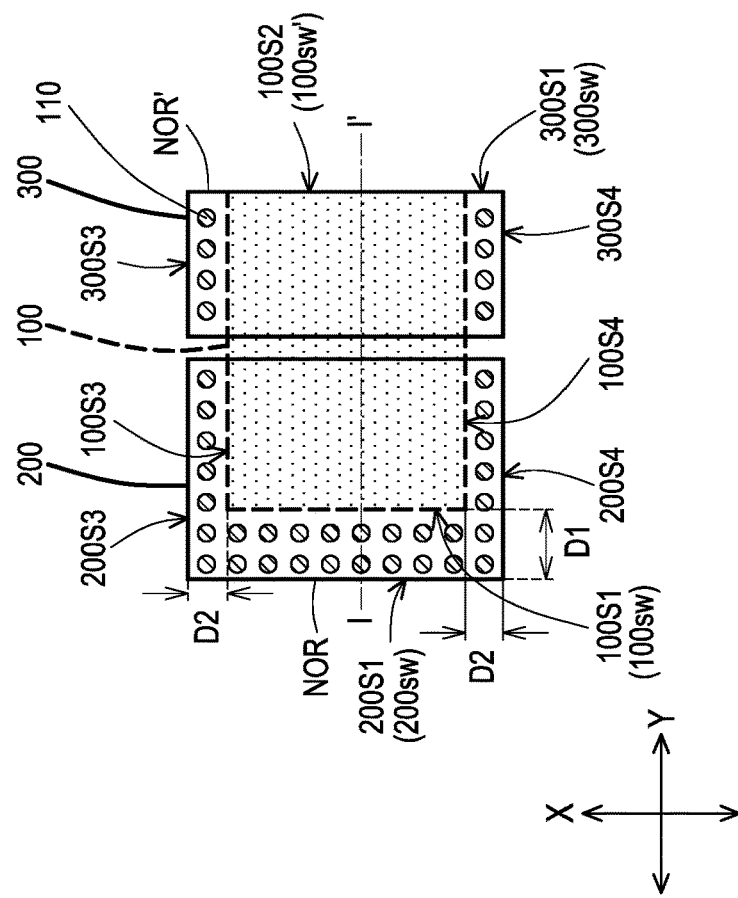
Figure 15C:
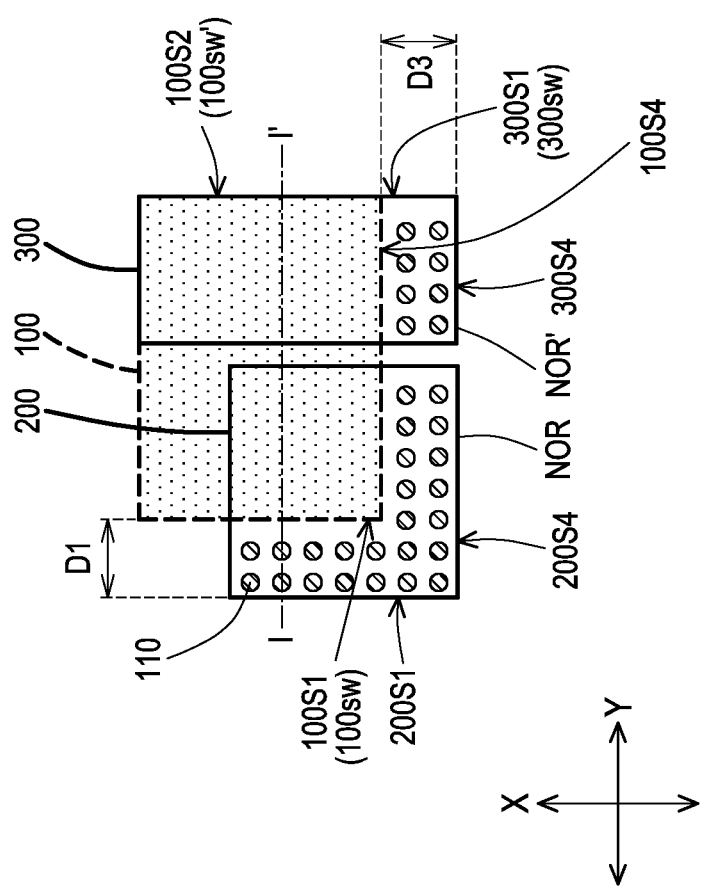

FIG. 1 through FIG. 14 are schematic cross-sectional views illustrating intermediate steps during a process for forming a package structure in accordance with some embodiments of the disclosure. FIG. 15A through FIG. 15C are schematic top views illustrating relative positions of semiconductor dies and through dielectric vias (TDVs) in a package structure in accordance with some embodiments of the disclosure. In FIG. 1 through FIG. 14, one semiconductor chip or die is shown to represent plural semiconductor chips or dies of the wafer, and one semiconductor package is shown to represent plural semiconductor packages obtained following the semiconductor manufacturing method, the disclosure is not limited thereto. In some embodiments, the manufacturing method is part of a wafer level packaging process. It is to be noted that the process steps described herein cover a portion of the manufacturing processes used to fabricate a semiconductor package. The embodiments are intended to provide further explanations, but are not used to limit the scope of the disclosure.

Referring to FIG. 1, a carrier substrate C1 including a bonding layer BL1 formed on a surface thereof is provided. The carrier substrate C1 may be a semiconductor wafer, and the bonding layer BL1 may be a bonding layer prepared for fusion bond. In some embodiments, the bonding layer BL1 is a deposited layer formed over the top surface of the carrier substrate C1. In some alternative embodiments, the bonding layer BL1 is a portion of the carrier substrate C1 for fusion bond. For example, the material of the carrier substrate C1 includes silicon or other suitable semiconductor materials, and the material of the bonding layer BL1 includes silicon, silicon dioxide or other suitable bonding materials. In some other embodiments, the bonding layer BL1 is a native oxide layer naturally grown on the surface of the carrier substrate C1.

As illustrated in FIG. 1, a first semiconductor die 100 is provided and bonded to the top surface of the bonding layer BL1. The first semiconductor die 100 may be a known good die singulated and selected to be bonded onto the carrier substrate C1. In some embodiments, the first semiconductor die 100 may be a logic die such as a central processing unit (CPU), a graphics processing unit (GPU), a system-on-a-chip (SoC); an application-specific die such as a field-programmable gate array (FPGA), or the like. In some alternative embodiments, the first semiconductor die 100 is a memory die with a controller or without a controller, where the memory die includes a single-form die such as a dynamic random access memory (DRAM) die, a static random access memory (SRAM) die, a magnetoresistive random-access memory (MRAM), a NAND flash memory, a high band-width memory (HBM) module, or the like. The type of the first semiconductor die 100 may be selected and designated based on the demand and design requirement, and thus is not specifically limited in the disclosure.

The first semiconductor die 100 may include a semiconductor substrate 102 and a device layer 104. In some embodiments, the semiconductor substrate 102 may be made of elemental semiconductor materials, such as crystalline silicon, diamond, or germanium; compound semiconductor materials, such as silicon carbide, gallium arsenic, indium arsenide, or indium phosphide; or alloy semiconductor materials, such as silicon germanium, silicon germanium carbide, gallium arsenic phosphide, or gallium indium phosphide. In some alternative embodiments, the semiconductor substrate 102 includes an epitaxial layer. In some embodiments, the device layer 104 is formed on a surface of the semiconductor substrate 102 and a top surface 104t of the device layer 104 may be referred to as a front side surface (e.g., active surface) FS1 of the first semiconductor die 100. The device layer 104 may include a wide variety of devices. In some embodiments, the devices include active components, passive components, or a combination thereof. The functions of the devices may include memory, processors, sensors, amplifiers, power distribution, input and/or output circuitry, or the like. In some alternative embodiments, the devices may include integrated circuits devices. The devices are, for example, transistors, capacitors, resistors, diodes, photodiodes, fuse devices, or other similar devices.

Still referring to FIG. 1, a bonding layer 106 is formed on the first semiconductor die 100 at the front side surface FS1. In some embodiments, a material of the bonding layer 106 may be similar to the material of the bonding layer BL1 of the carrier substrate C1. The first semiconductor die 100 is placed on the top surface of the bonding layer BL1 such that the bonding layer 106 of the first semiconductor die 100 faces the bonding layer BL1, and the bonding layer 106 of the first semiconductor die 100 is in contact with the top surface of the bonding layer BL1. After the first semiconductor die 100 is picked up and placed on the bonding layer BL1, a chip-to-wafer fusion bonding process may be performed such that a fusion bonding layer is formed between the carrier substrate C1 and the first semiconductor die 100. The bonding layer BL1 may be directly bonded to the bonding layer 106 of the first semiconductor die 100. In other words, there is no intermediate layer formed between the bonding layer BL1 and the bonding layer 106 of the first semiconductor die 100. The above-mentioned fusion bonding layer formed between the bonding layer BL1 and the bonding layer 106 of the first semiconductor die 100 may be or include a Si—Si fusion bonding, a Si—$SiO_2$ fusion bonding, a $SiO_2$—$SiO_2$ fusion bonding or other suitable fusion bonding.

Figure 2:
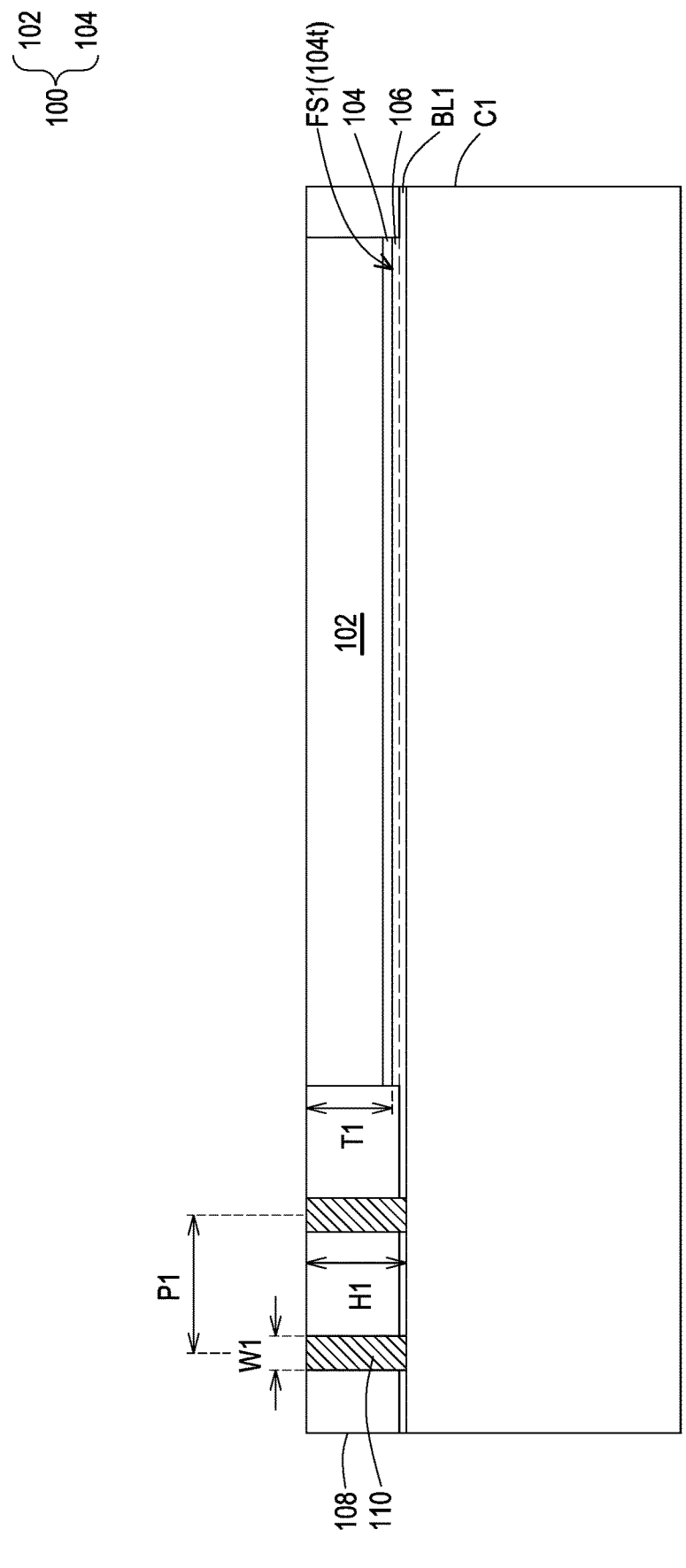

Referring to FIG. 2, after the first semiconductor die 100 is bonded to the bonding layer BL1, the first semiconductor die 100 is thinned to have a desired thickness T1. For example, the thickness T1 of the first semiconductor die 100 may range from about 10 µm to about 30 µm, although lesser and greater thicknesses may also be used. In FIG. 2, a dielectric layer 108 is formed over the bonding layer BL1 and the first semiconductor die 100. In some embodiments, the dielectric layer 108 may be referred to as a gap-filling layer. In some embodiments, the dielectric layer 108 is formed of silicon oxide, which may be formed of tetraethyl orthosilicate (TEOS), while other dielectric materials such as silicon carbide, silicon oxynitride, silicon oxy-carbo-nitride, phosphosilicate glass (PSG), borosilicate glass (BSG), boron-doped phosphosilicate glass (BPSG), or the like may also be used. The dielectric layer 108 may be formed using chemical vapor deposition (CVD), high-density plasma chemical vapor deposition (HDPCVD), flowable CVD, spin-on coating, or the like.

Still referring to FIG. 2, a planarization process such as a chemical mechanical polishing (CMP) process or a mechanical grinding process is performed to remove excess portions of the dielectric layer 108, so that the first semiconductor die 100 is exposed. In addition, a plurality of through dielectric vias (TDVs) 110 is formed in the dielectric layer 108 aside the first semiconductor die 100 after the planarization process is performed. The formation of TDVs 110 is obtained by etching the dielectric layer 108 to form openings (not shown) and then filling the openings with conductive material, in accordance with some embodiments. For example, a photoresist (not shown) is formed and patterned, and the patterned photoresist is used as an etching mask etching the dielectric layer 108 to form the openings. The openings may extend through the dielectric layer 108. In some embodiments, the dielectric layer 108 comprises an oxide, and the etching may be performed through dry etching. In some embodiments, the formation of the TDVs 110 includes performing a plating process such as an electrical-chemical plating process or an electro-less plating process. The TDVs 110 may include a metallic material such as tungsten, aluminum, copper, or the like. A conductive barrier layer (such as titanium, titanium nitride, tantalum, tantalum nitride, or the like) may also be formed underlying the metallic material. A planarization such as a CMP is performed to remove excess portions of the plated metallic material, and the remaining portions of the metallic material form the TDVs 110.

In some embodiments, the TDVs 110 are formed aside the first semiconductor die 100 in an array (as shown in FIGS. 15A-15C). In some other embodiments, the TDVs 110 are formed to have round top-view shapes. However, the disclosure is not limited thereto. In some alternative embodiments, the TDVs 110 may exhibit polygonal shapes or other suitable shapes from the top view. In some other embodiments, the TDVs 110 may have substantially straight and vertical sidewalls, but the disclosure is not limited thereto. In some embodiments, in a direction Z parallel to a normal direction of the carrier substrate C1, a height H1 of the TDVs 110 is slightly greater than the thickness T1 of the first semiconductor die 100. In some embodiments, in a direction X perpendicular to the direction Z, widths W1 of the TDVs 110 range from about 3 µm to about 6 µm. In the case that the TDVs 110 have round top-view shapes (as shown in FIGS. 15A-15C), the widths W1 are diameters of the TDVs 110 accordingly. In the case that the TDVs 110 have polygonal shapes from the top view, the width W1 may be maximum dimensions of the TDVs 110. In some other embodiments, a pitch P1 of two adjacent TDVs 110 (see FIGS. 15A-15C) may range from about 6 µm to about 12 µm.

Figure 3:
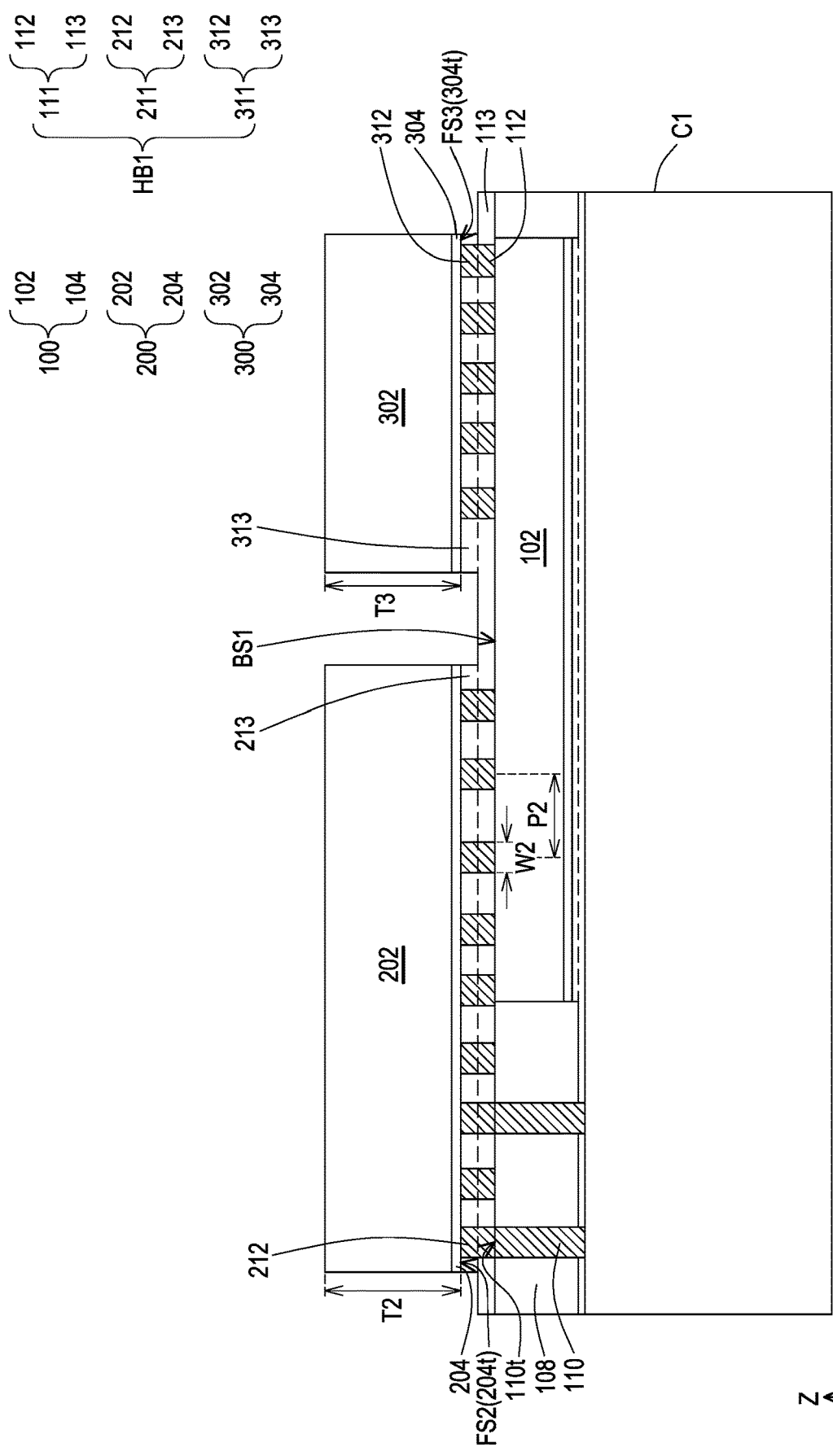

Referring to FIG. 3, a second semiconductor die 200 and a third semiconductor die 300 are provided and stacked on the first semiconductor die 100 to form a die stack structure. The die stack structure is formed by bonding the second semiconductor die 200 and the third semiconductor die 300 to the first semiconductor die 100 through hybrid bonding. Prior to bonding the second semiconductor die 200 and the third semiconductor die 300 to the first semiconductor die 100, a bonding structure 111 is formed on a back side surface BS1 of the first semiconductor die 100, the dielectric layer 108 and on top surfaces 110t of the TDVs 110. The bonding structure 111 includes conductive pads 112 and a dielectric layer 113. In some embodiments, the conductive pads 112 are embedded in the dielectric layer 113. For example, the conductive pads 112 are laterally encapsulated by the dielectric layer 113. In some embodiments, the dielectric layer 113 may be formed by depositing a dielectric material layer on the back side surface BS1 of the first semiconductor die 100, the dielectric layer 108 and on the top surfaces 110t of the TDVs 110, and patterning the dielectric material layer to form a plurality of openings in the dielectric material layer. The openings formed in the dielectric layer 113 expose portions of the TDVs 110 and portions of the back side surface BS1 of the first semiconductor die 100. After the dielectric layer 113 is patterned, a conductive material layer may be deposited on the dielectric layer 113 and filled into the openings of the dielectric layer 113. Then, a polishing process (e.g., a CMP process) is performed to partially remove the conductive material layer until a top surface of the dielectric layer 113 is exposed. After performing the polishing process, the conductive pads 112 are formed in the openings of the dielectric layer 113. In some embodiments, the material of the conductive pads 112 includes copper or other suitable metallic material while the material of the dielectric layer 113 includes silicon oxide, silicon nitride, silicon oxynitride, or other suitable dielectric materials.

In some embodiments, the type of the second semiconductor die 200 may be similar to the first semiconductor die 100, such as a logic die (e.g., CPU, GPU, FPGA), a memory die (e.g., SRAM, DRAM), or the like. In some other embodiments, the third semiconductor die 300 may be a logic die such as CPU, GPU; a memory die such as SRAM; an integrated passive device (IPD); or a dummy die. It will be appreciated that the third semiconductor die 300 may be similar to the second semiconductor die 200, thus the second semiconductor die 200 and the third semiconductor die 300 may also be collectively referred to a plurality of second semiconductor dies in accordance with some embodiments.

A thickness T2 of the second semiconductor die 200 and a thickness T3 of the third semiconductor die 300 may be substantially the same. In some embodiments, greater thicknesses of the thicknesses T2, T3 may be used for better heat dissipation. In other words, the thicknesses T2, T3 of the semiconductor dies 200, 300 may be greater than the thickness T1 of the first semiconductor die 100. For example, the thicknesses T2, T3 may range from about 150 µm to about 250 µm, although lesser and greater thicknesses may also be used. Similar to the first semiconductor die 100, the second semiconductor die 200 and the third semiconductor die 300 respectively include semiconductor substrates 202, 302 and device layers 204, 304. The device layers 204, 304 are respectively formed on the semiconductor substrates 202, 302 and top surfaces 204t, 304t of the device layers 204, 304 may be respectively referred to as front side surfaces (e.g., active surfaces) FS2, FS3 of the second semiconductor die 200 and the third semiconductor die 300. In some embodiments, the semiconductor substrates 202, 302 may be similar to the semiconductor substrate 102 of the first semiconductor die 100. In some other embodiments, the device layers 204, 304 may be similar to the device layer 104 of the first semiconductor die 100. In some alternative embodiments, the device layer 304 is omitted if the third semiconductor die 300 is a dummy die. Bonding structures 211, 311 for subsequent hybrid bonding may be respectively formed on the front side surfaces FS2, FS3 of the second semiconductor die 200 and the third semiconductor die 300. In the illustrated embodiment, the bonding structures 211, 311 include conductive pads 212 embedded in a dielectric layer 213, and conductive pads 312 embedded in a dielectric layer 313, respectively. The materials of the conductive pads 212, 312 are similar to the material of the conductive pads 112 while the materials of the dielectric layers 213, 313 are similar to the material of the dielectric layer 113.

Still referring to FIG. 3, the second semiconductor die 200 and the third semiconductor die 300 are flipped upside down and placed on the bonding structure 111. The front side surfaces FS2, FS3 of the second semiconductor die 200 and the third semiconductor die 300 are facing toward the back side surface BS1 of the first semiconductor die 100 and the top surfaces 110t of TDVs 110. The placement is conducted in a way that the conductive pads 212, 312 are substantially aligned and in physical contact with the conductive pads 112 while the dielectric layers 213, 313 are also in physical contact with the dielectric layer 113. After stacking the second semiconductor die 200 and the third semiconductor die 300 onto the bonding structure 111, the hybrid bonding is performed. In some embodiments, the hybrid bonding may include a thermal treatment for dielectric bonding and a thermal annealing for conductor bonding. The dielectric bonding is the direct bonding between the dielectric layers 113, 213 and 313 while the conductor bonding is the direct bonding between the conductive pads 212, 312 and the respective conductive pads 112. Subsequent to the hybrid bonding being performed, the second semiconductor die 200 and the third semiconductor die 300 are bonded to the first semiconductor die 100 in a "face-to-back" manner. In some embodiments, the bonding structure formed between the bonding structure 111 and the bonding structures 211, 311 are collectively referred to as a hybrid bonding structure HB1. In some alternative embodiments, widths W2 of the bonding pads (such as the conductive pads 112, 212 and/or the conductive pads 112, 312) may range from about 1 µm to about 4 µm. In some other embodiments, a pitch P2 of two adjacent aforementioned bonding pads may range from about 3 µm to about 121 µm.

As shown in FIG. 3, the second semiconductor die 200 is partially stacked on the first semiconductor die 100. That is, an orthogonal projection of the second semiconductor die 200 is partially overlapped with an orthogonal projection of the first semiconductor die 100. In other words, the second semiconductor die 200 may overhang above the first semiconductor die 100. As such, a portion of the conductive pads 212 are bonded to the conductive pads 112 formed on the back side surface BS1 of the first semiconductor die 100 while the other portion of the conductive pads 212 are bonded to the conductive pads 112 formed outside the first semiconductor die 100. Furthermore, some of the conductive pads 112 formed outside the first semiconductor die 100 are in physical contact with the TDVs 110, providing an electrical connection between the second semiconductor die 200 and the TDVs, and thus establishing an electrical pathway between the second semiconductor die 200 and a subsequently formed redistribution structure (see FIG. 7).

Figure 4:
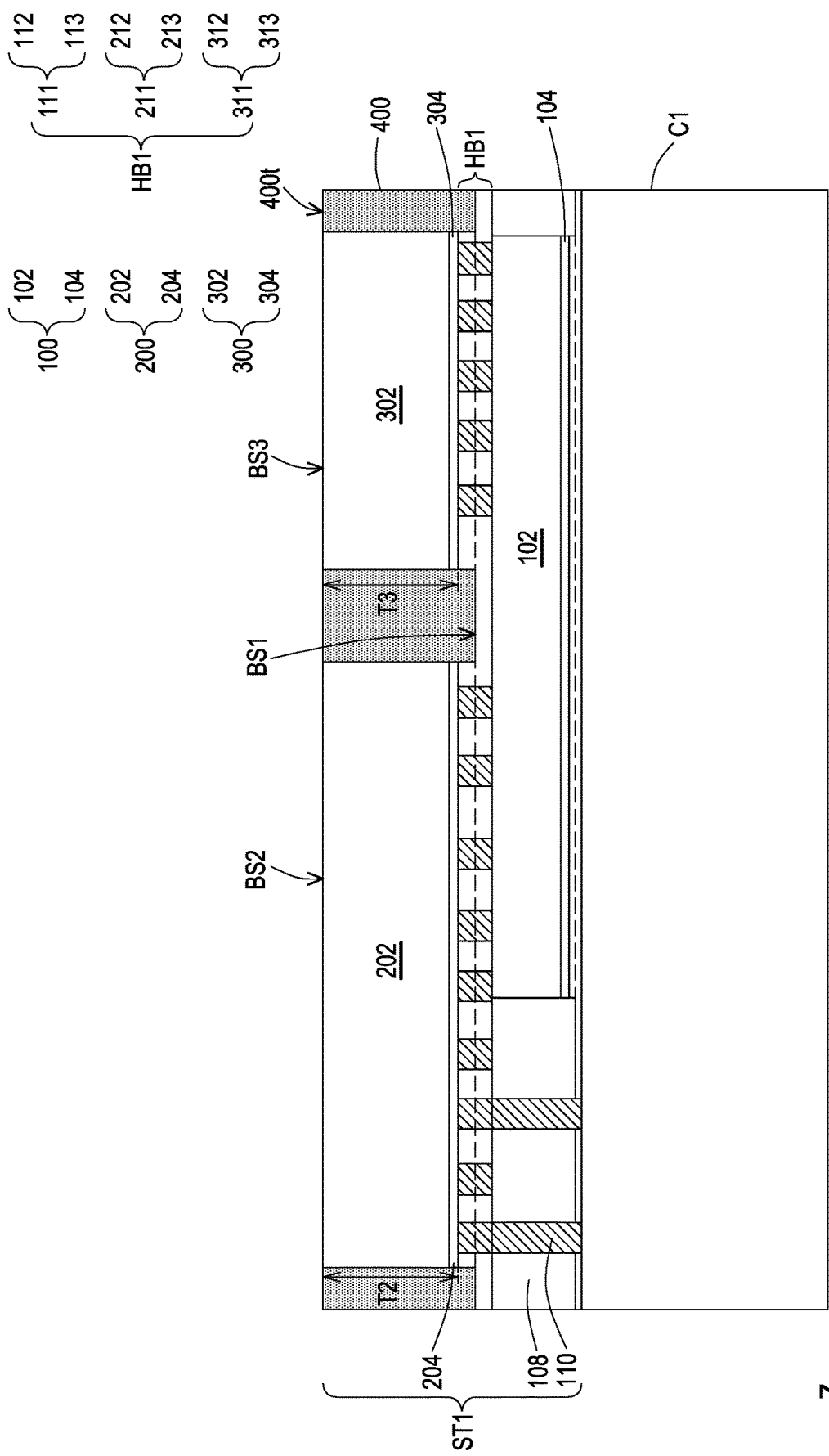

In FIG. 4, a first encapsulant 400 is formed over and laterally encapsulates the second semiconductor die 200 and the third semiconductor die 300. For example, the first encapsulant 400 is formed to fill in the gaps between the second semiconductor die 200 and the adjacent third semiconductor die 300. In some embodiments, the first encapsulant 400 includes a molding compound, a molding underfill, a resin (such as epoxy), or the like. In some alternative embodiments, the first encapsulant 400 may include silicon oxide and/or silicon nitride. The first encapsulant 400 may be formed through CVD, plasma-enhanced chemical vapor deposition (PECVD), atomic layer deposition (ALD), or the like. In some embodiments, the first encapsulant 400 is free of filler. In some other embodiments, the first encapsulant 400 is over-molded and a planarization process is performed until back side surfaces BS2, BS3 of the second semiconductor die 200 and the third semiconductor die 300 are exposed. For example, a thickness of the first encapsulant 400 is substantially equal to the thickness T2, T3 of the second semiconductor die 200 and the third semiconductor die 300. Meanwhile, the top surface 400t of the first encapsulant 400 is substantially coplanar with the back side surfaces BS2, BS3 of the second semiconductor die 200 and the third semiconductor die 300. In some embodiments, the planarization process includes a mechanical grinding process and/or a CMP process. In some embodiments, the semiconductor dies 100, 200, 300, the TDVs 110, the hybrid bonding structure HB1, the dielectric layer 108 and the first encapsulant 400 are collectively referred to as a die stack structure ST1.

Figure 5:
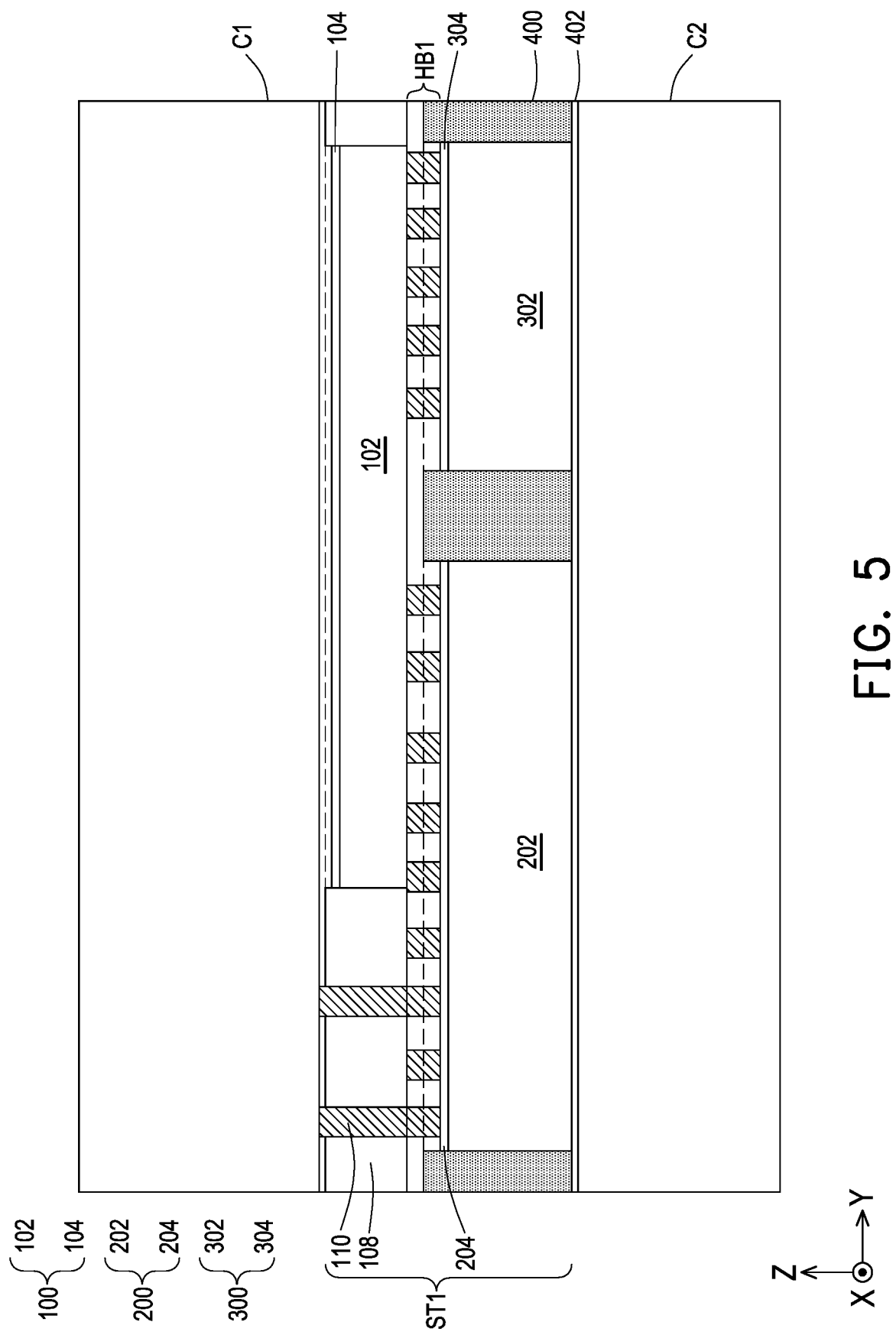

Referring to FIG. 5, another carrier substrate C2 is provided, and a release layer (not shown) is formed on the carrier substrate C2. The carrier substrate C2 may be a glass carrier substrate, a ceramic carrier substrate, or the like. The release layer may be formed of a polymer-based material, which may be removed along with the carrier substrate C2 from the structure that will be formed in subsequent steps. In some embodiments, the release layer is an epoxy-based thermal-release material, which loses its adhesive property when heated, such as a light-to-heat-conversion (LTHC) release coating. In other embodiments, the release layer may be an ultra-violet (UV) glue, which loses its adhesive property when exposed to UV lights. The release layer may be dispensed as a liquid and cured, may be a laminate film laminated onto the carrier substrate C2, or may be the like.

Still referring to FIG. 5, the die stack structure ST1 and the underlying carrier substrate C1 are flipped upside down and adhered to the carrier substrate C2 by an adhesion layer 402. The adhesion layer 402 may be any suitable adhesive, epoxy, die attach film (DAF), or the like. The adhesion layer 402 may be applied to a surface of the die stack structure ST1 or over the surface of the carrier substrate C2 (e.g., over the release layer).

Figure 6:
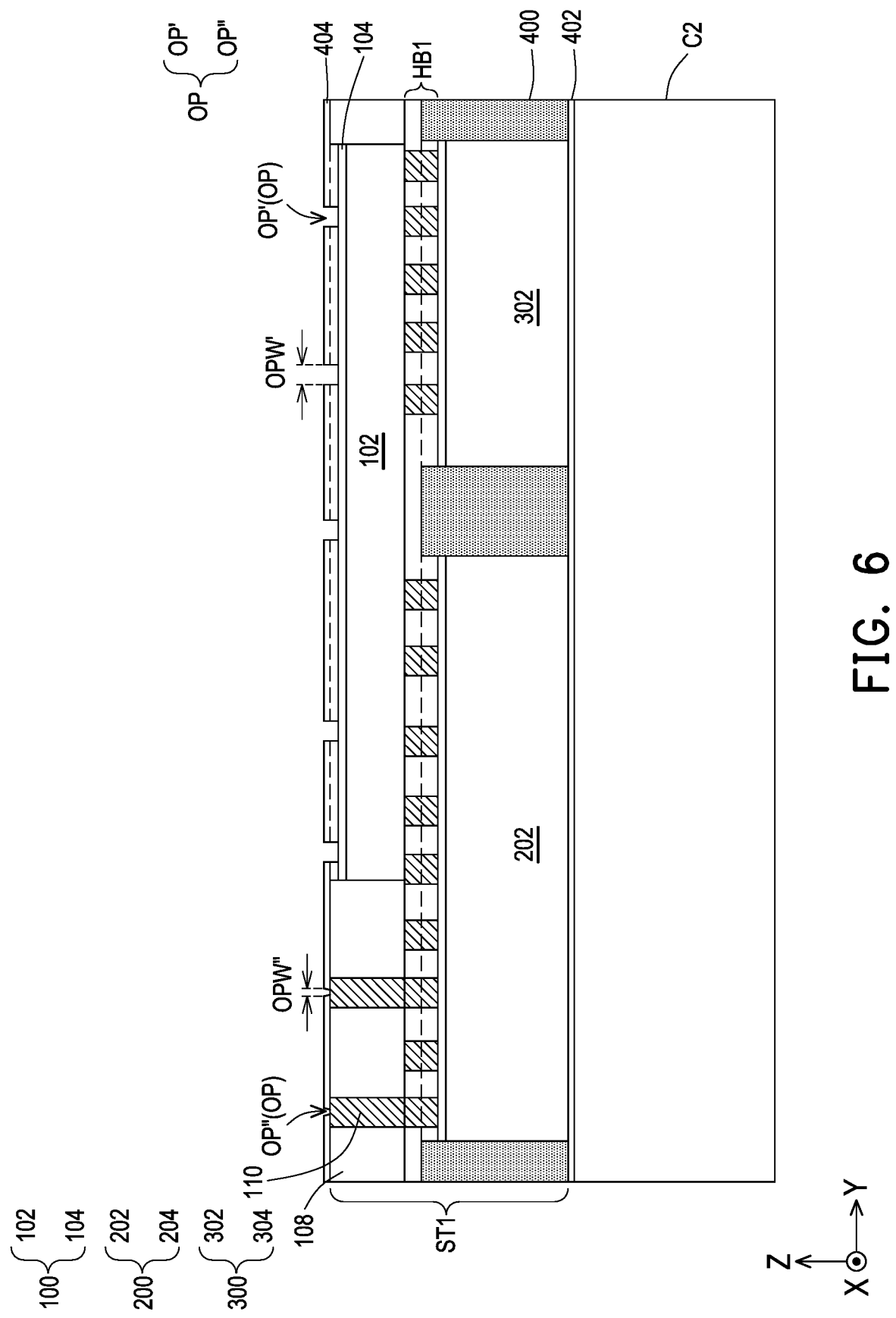

In FIG. 6, the carrier substrate C1 is removed and a passivation layer 404 is formed. The passivation layer 404 is formed over the front side FS1 of the first semiconductor die 100, the dielectric layer 108 and the TDVs 110. The passivation layer 404 may be a silicon oxide layer, a silicon nitride layer, a silicon oxynitride layer or a dielectric layer formed of any suitable dielectric materials. The passivation layer 404 is patterned and etched then to form openings OP that partially expose the device layer 104 of the first semiconductor die 100 and the TDVs 110. As shown in FIG. 6, a bottom width OPW' of openings OP' exposing the device layer 104 is greater than a bottom width OPW" of openings OP" exposing the TDVs 110, for example.

Figure 7:
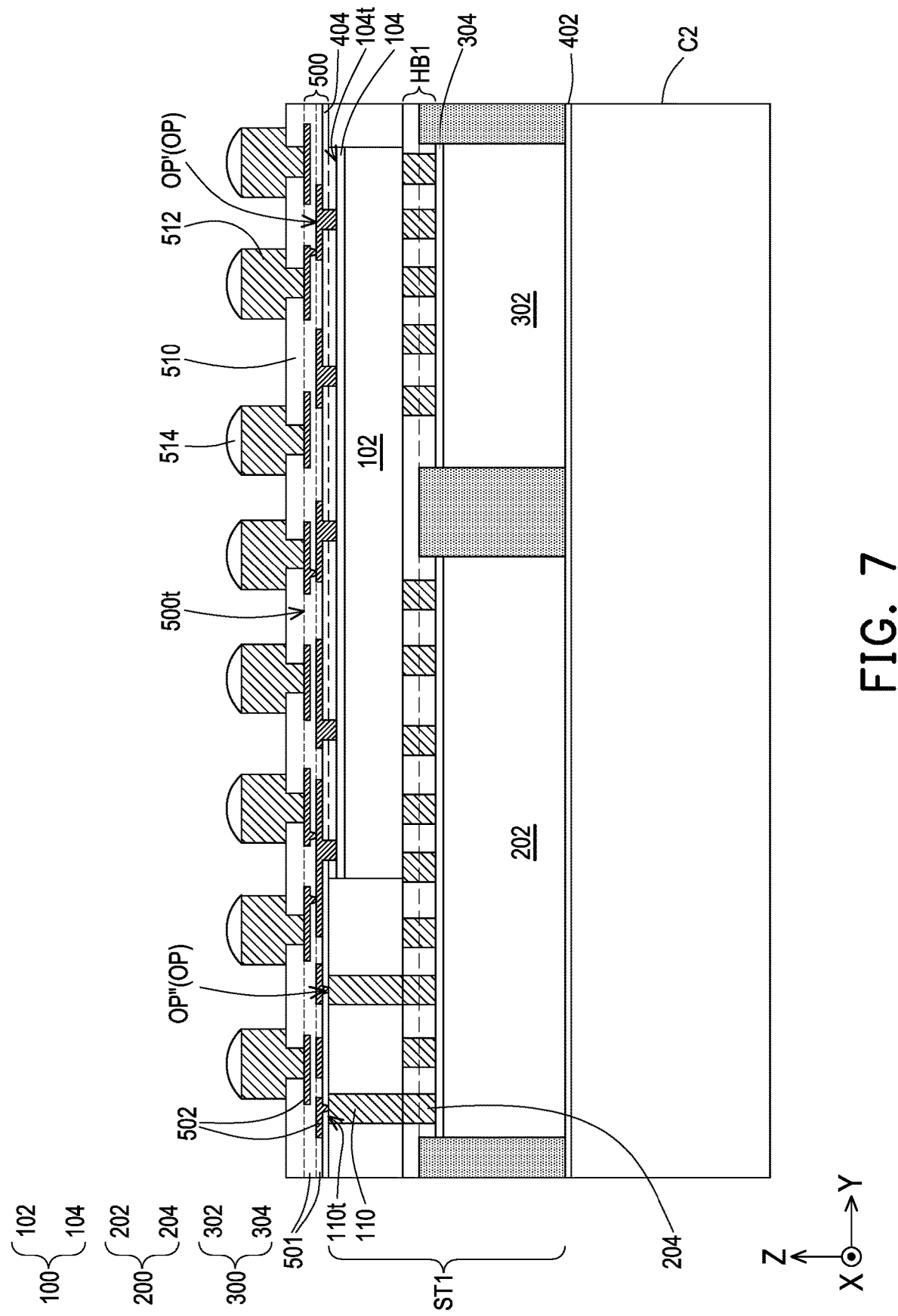

Referring to FIG. 7, a first redistribution structure 500 is formed over the die stack structure STJ (e.g., over the passivation layer 404). In some embodiments, the first redistribution structure 500 is electrically connected to the first semiconductor die 100 and the TDVs 110. The first redistribution structure 500 includes a plurality of inter-dielectric layers 501 and a plurality of redistribution conductive patterns 502 stacked alternately. The plurality of redistribution conductive patterns 502 are electrically connected to the conductive components (not shown) embedded in the device layer 104 of the first semiconductor die 100 and the TDVs 110 embedded in the dielectric layer 108. In some embodiments, the bottommost redistribution conductive patterns 502 extend into the openings OP of the underlying passivation layer 404 to be in physical contact with the top surface 104t of the device layer 104 and the top surfaces 110t of the TDVs 110. The first redistribution structure 500 is shown as an example having two layers of metallization patterns. More or fewer dielectric layers and metallization patterns may be formed in the first redistribution structure 500.

In some embodiments, the plurality of inter-dielectric layers 501 are formed of a photo-sensitive material such as polybenzoxazole (PBO), polyimide (PI), benzocyclobutene (BCB), or the like, which may be patterned using a lithography mask. The plurality of inter-dielectric layers 501 may be formed by spin coating, lamination, CVD, the like, or a combination thereof. In some embodiments, the plurality of redistribution conductive patterns 502 may be formed of conductive material such as copper, titanium, tungsten, aluminum, or the like. The plurality of redistribution conductive patterns 502 may be formed by plating, such as electroplating or electroless plating, or the like.

After forming the first redistribution structure 500, a first protection layer 510 is formed on a top surface 500t of the first redistribution structure 500. A portion of the topmost redistribution conductive patterns 502 is exposed by the first protection layer 510 and serves as an external connection of the die stack structure ST1. The first protection layer 510 includes an insulating material such as silicon oxide, silicon nitride, polymer, or a combination thereof. The polymer is, for instance, PBO, polyimide, BCB, a combination thereof, or the like. The first protection layer 510 has openings exposing a portion of the topmost redistribution conductive patterns 502. In some alternative embodiments, the first protection layer 510 is a PI layer, of which the temperature of the curing process is about 200° C., and the PI layer may also referred to as a low temperature PI (LTPI) layer.

Still referring to FIG. 7, conductive pillars 512 and test pads 514 are formed on the first protection layer 510 and in the openings of the first protection layer 510. The conductive pillars 512 may include copper, nickel, combinations thereof, or other suitable metal, and may be formed by plating process, such as electroplating, electroless plating or the like. The conductive pillars 512 are physically and electrically connected with the topmost redistribution conductive patterns 502 exposed by the openings of the first protection layer 510. In some embodiments, the test pads 514 are formed on the conductive pillars 512 for verification testing such as electrical testing in the subsequent process. The test pads 514 include conductive materials. In some embodiments, the test pads 514 may be lead-free conductive materials. In some alternative embodiments, the test pads 514 may be a solder layer including tin or tin alloy. The test pads 514 may be formed by plating process, such as electroplating, electroless plating or the like. The cross-sectional shapes of the conductive pillars 512 and/or the test pads 514 may be square, rectangular, rounded or the like, or other suitable shape. The top surfaces of the conductive pillars 512 and/or the test pads 514 may be flat, rounded, arced, or the like, but the disclosure is not limited thereto. In some embodiments, sidewalls of the test pads 514 are substantially aligned with sidewalls of the conductive pillars 512.

Once the conductive pillars 512 and the test pads 514 are formed, the die stack structure ST1 may be tested with a probe contact (not shown). The testing may allow for the yield of the die stack structure ST1 to be monitored. Further processing may be halted in response to the die stack structure ST1 failing testing.

Figure 8:
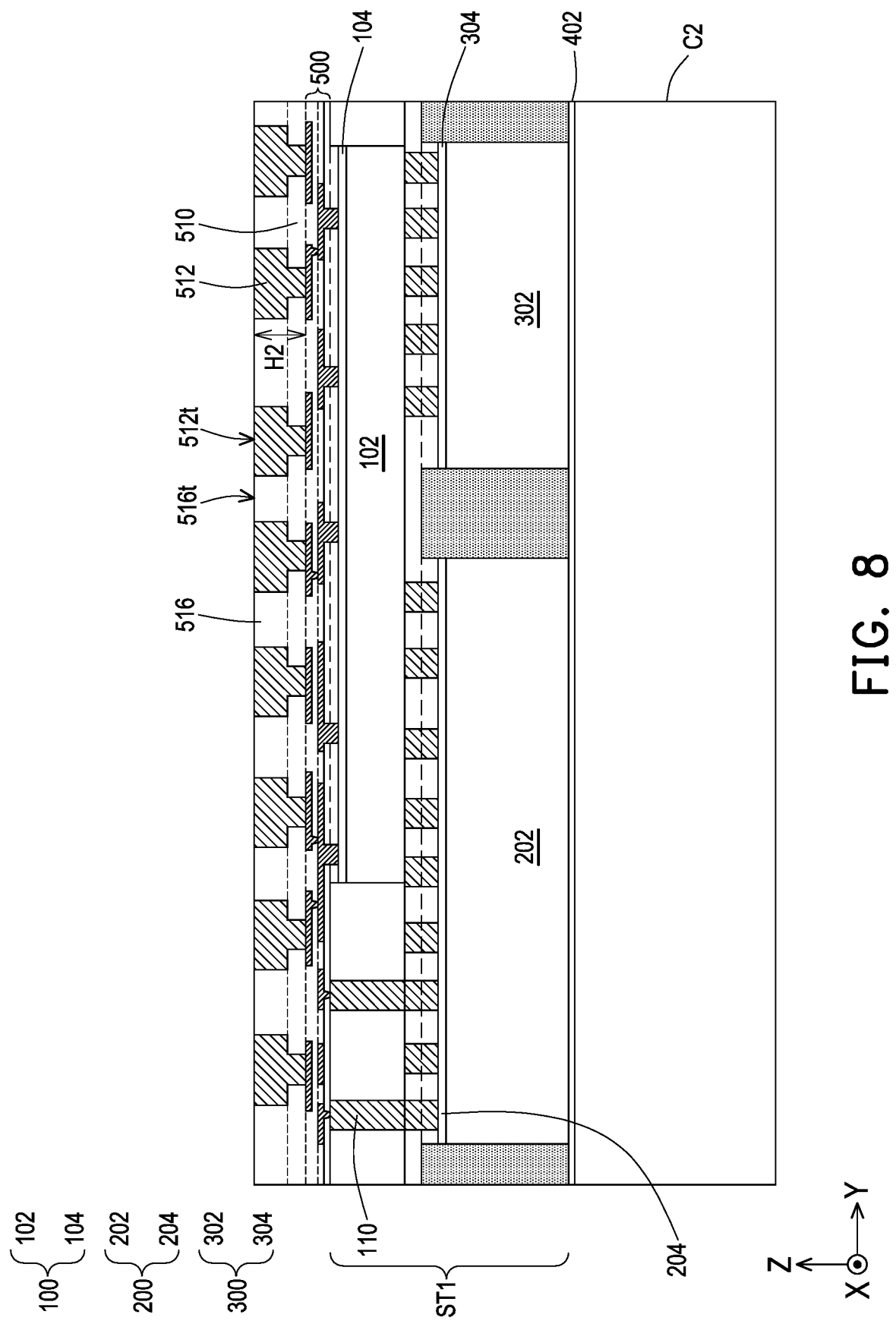

In FIG. 8, the test pads 514 are removed with a selective etching process. The selective etching process is selective to the material of the test pads 514. After the removal of the test pads 514, the conductive pillars 512 are remained and served as the connectors electrically connecting to the redistribution structure formed in subsequent steps (See FIG. 13) for external connection. A second protection layer 516 is then formed on the first protection layer 510 and filled up the gaps formed between the conductive pillars 512. The second protection layer 516 may be formed of a material similar to the material of the first protection layer 510. In some embodiments, a top surface 516t of the second protection layer 516 is substantially leveled with top surfaces 512t of the conductive pillars 512. In some alternative embodiments, a height H2 of the conductive pillars 512 may range from about 10 μm to about 20 μm.

Figure 9:
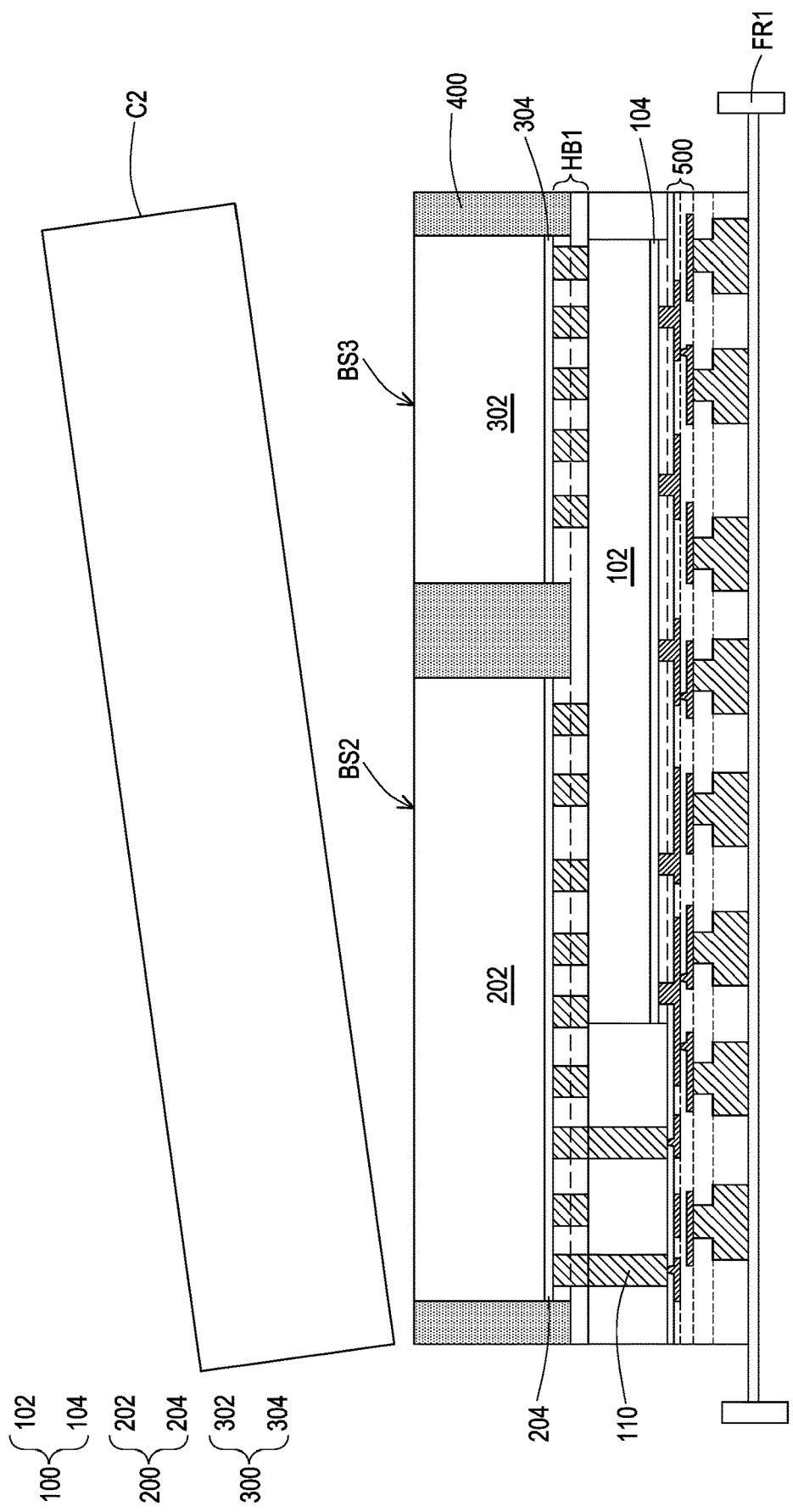

In FIG. 9, the structure of FIG. 8 is flipped upside down and placed on a frame structure FR1. The carrier substrate C2 is removed from the underlying structure through a de-bonding process. In some embodiments, the carrier substrate C2 is removed by performing a laser irradiation which causes the decomposition of the release layer on the carrier substrate C2 so that the carrier substrate C2 is easily separated from the adhesion layer 402. Subsequent to separating the carrier substrate C2 from the adhesion layer 402, the adhesion layer 402 is removed through a grinding process or buffering process, for example, such that the back side surfaces BS2, BS3 of the second semiconductor die 200 and the third semiconductor die 300 are revealed.

Figure 10:
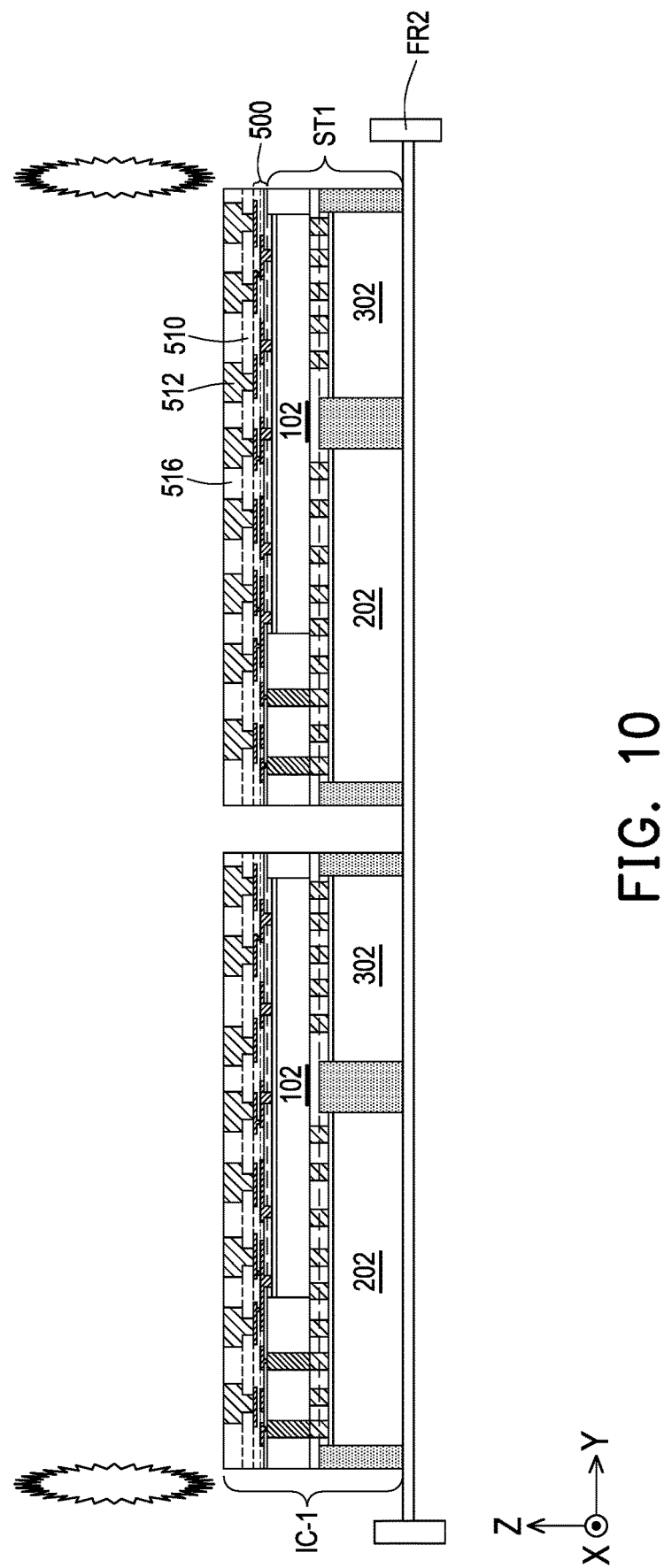

Further, the de-bonded structure is flipped upside down and placed on another frame structure FR2, followed by performing a singulation process to obtain multiple singulated structures as shown in FIG. 10. The singulated structures may also be referred to as integrated circuits IC-1. In some embodiments, each integrated circuit IC-1 includes one of the die stack structure ST1 and the first redistribution structure 500 stacked thereon; the protection layers 510, 516 and the conductive pillars 512 embedded in the protection layers 510, 516. In some embodiments, the singulation process typically involves dicing with a rotating blade or a laser beam. In other words, the singulation process is, for example, a laser cutting process, a mechanical cutting process, or other suitable processes. In the illustrated embodiment, the dicing process or the singulation process may be performed on a tape (e.g. dicing tape) supported by a frame.

Figure 11:
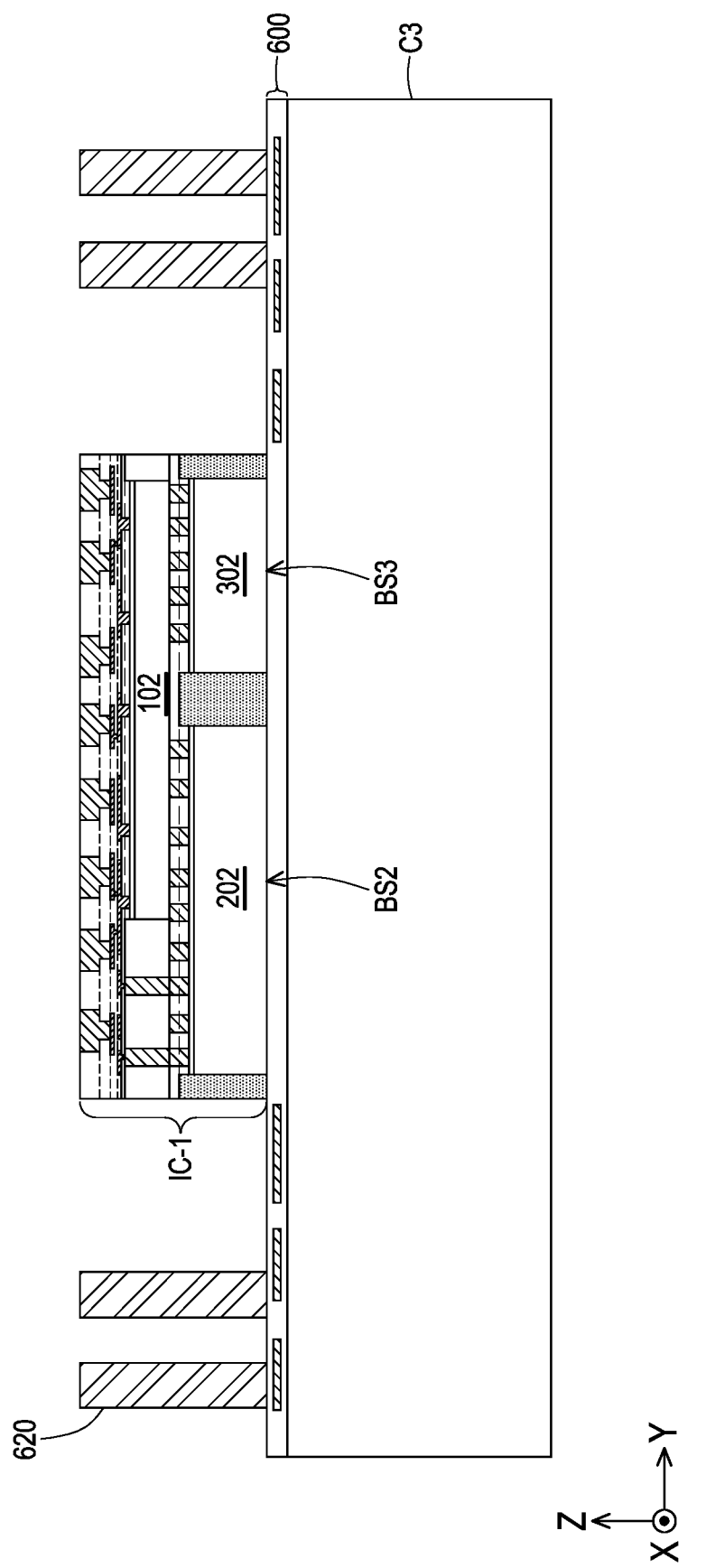

Referring to FIG. 11, the integrated circuit IC-1 is picked and placed on a carrier substrate C3. The second semiconductor die 200 and the third semiconductor die 300 are positioned between the carrier substrate C3 and the first semiconductor die 100 and are attached to the carrier substrate C3 with an adhesion layer (not shown). In some embodiments, the carrier substrate C3 is a glass substrate with a redistribution structure 600 formed thereon. The redistribution structure 600 may include at least one redistribution conductive pattern and at least one inter-dielectric layer stacked alternately. As illustrated in FIG. 11, the back side surfaces BS2, BS3 of the second semiconductor die 200 and the third semiconductor die 300 are adhered to the redistribution structure 600 through the adhesion layer (not shown) without forming an electric transmission path between the second semiconductor die 200, the third semiconductor die 300 and the redistribution structure 600, but the disclosure is not limited thereto.

In addition, prior to attaching the integrated circuit IC-1 onto the carrier substrate C3, one or more conductive pillars, which may be referred to through insulation vias (TIVs) 620 hereafter in the disclosure, are formed on the redistribution structure 600 aside the integrated circuit IC-1. In some embodiments, the TIVs 620 may be formed by filling the openings of a patterned mask (not shown) with conductive material. In some embodiments, the conductive material of the TIVs 620 includes cobalt (Co), tungsten (W), copper (Cu), titanium (Ti), tantalum (Ta), aluminum (Al), zirconium (Zr), hafnium (H), a combination thereof, or other suitable metallic materials. In some embodiments, the conductive material may be formed by a plating process. The plating process may be, for example, electro-plating, electroless-plating, immersion plating, or the like. In some alternative embodiments, other suitable methods may be utilized to form the TIVs 620. For example, pre-fabricated TIVs 620 (e.g., pre-fabricated conductive pillars) may be picked-and-placed and bonded onto the redistribution structure 600.

Figure 12:
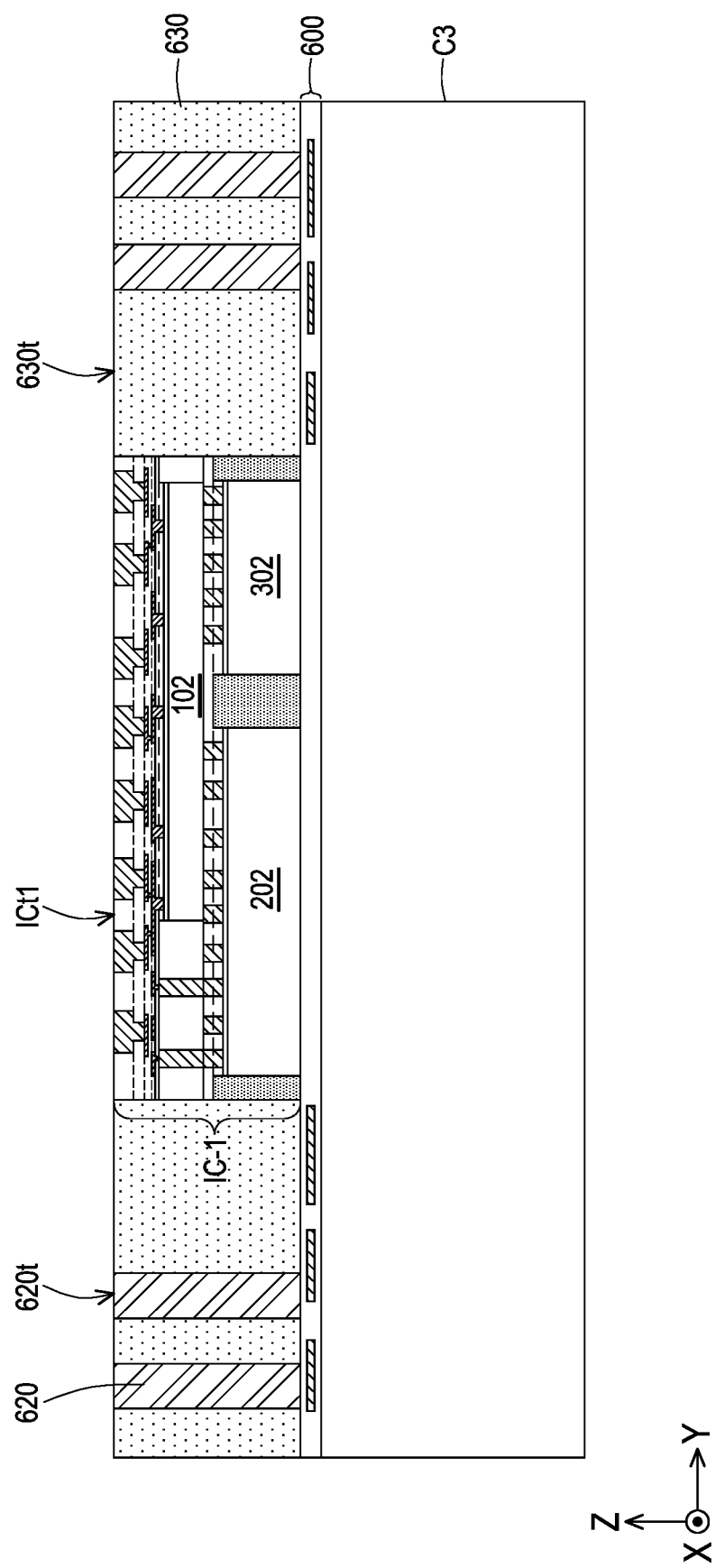

In FIG. 12, a second encapsulant 630 is formed on the redistribution structure 600, encapsulating the TIVs 620 and the integrated circuit IC-1. In some embodiments, a material of the second encapsulant 630 includes a molding compound, a polymeric material, such as polyimide, epoxy resin, acrylic resin, phenol resin, BCB, PBO, a combination thereof, or other suitable polymer-based dielectric materials. In some embodiments, the second encapsulant 630 is formed through an over-molding process, for example, through a compression molding process. In some embodiments, the second encapsulant 630 may be formed through an over-molding process, initially covering the TIVs 620 and the integrated circuit IC-1, and may be subsequently thinned until top surfaces 620t of the TIVs 620 and a top surface ICt1 of the integrated circuit IC-1 are exposed. In some embodiments, the planarization of the second encapsulant 630 includes performing a mechanical grinding process and/or a CMP process. Following planarization, the top surfaces 620t of the TIVs 620, the top surface ICt1 of the integrated circuit IC-1, and the top surface 630t of the second encapsulant 630 may be substantially at the same level height.

Figure 13:
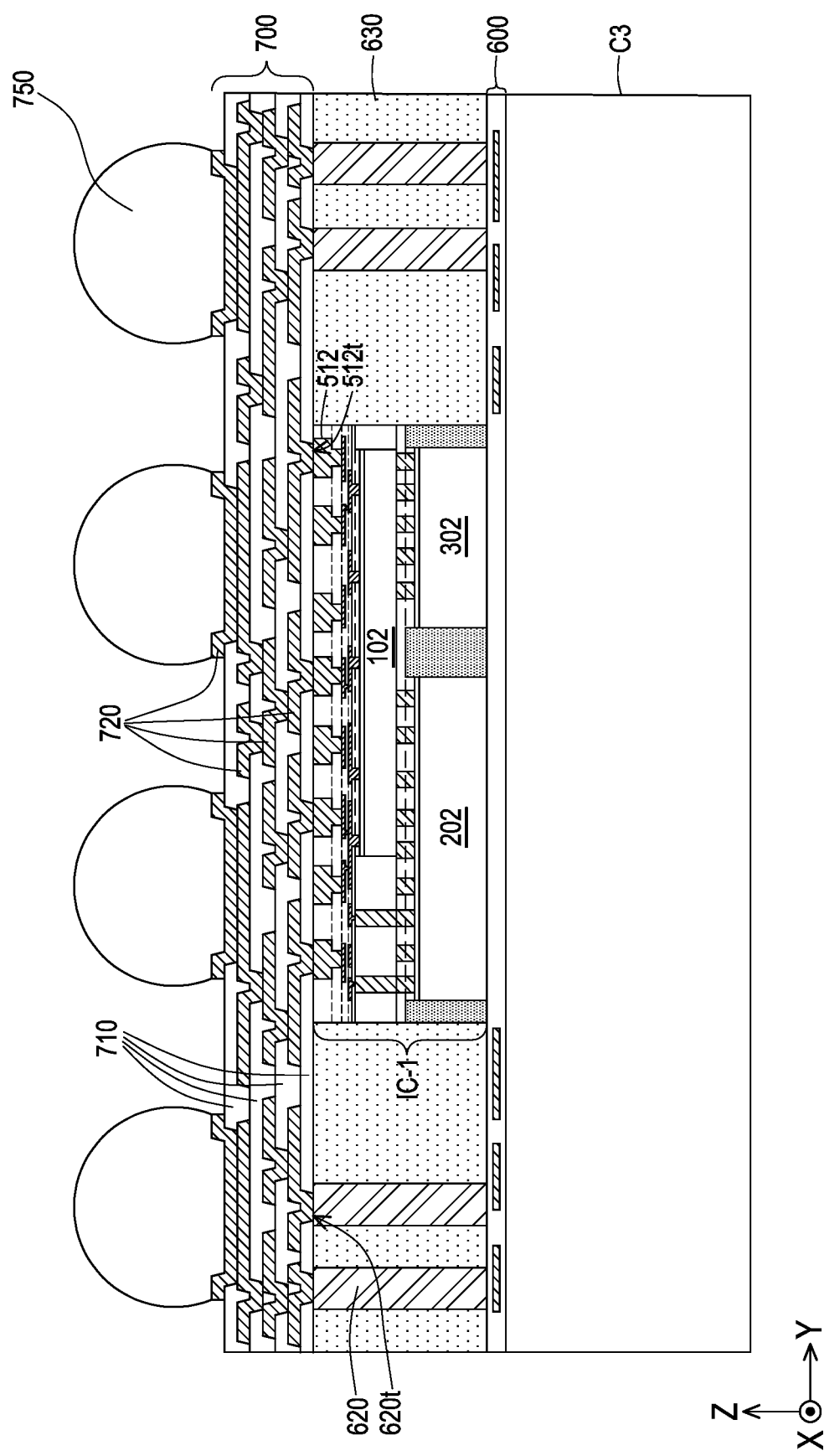

Referring to FIG. 13, a second redistribution structure 700 and a plurality of conductive terminals 750 are sequentially formed over the integrated circuit IC-1, the TIVs 620, and the second encapsulant 630. In some embodiments, the second redistribution structure 700 is electrically connected to the conductive pillars 512 of the integrated circuit IC-1 and the TIVs 620. The second redistribution structure 700 includes a plurality of inter-dielectric layers 710 and a plurality of redistribution conductive patterns 720 stacked alternately. The redistribution conductive patterns 720 are electrically connected to the conductive pillars 512 of the integrated circuit IC-1 and the TIVs 620 embedded in the second encapsulant 630. In some embodiments, the bottom-most inter-dielectric layer 710 has a plurality of openings exposing the top surfaces 512t of the conductive pillars 512 and the top surfaces 620t of the TIVs 620. The bottommost redistribution conductive patterns 720 extend into the openings of the bottommost inter-dielectric layer 710 to be in physical contact with the top surfaces 512t of the conductive pillars 512 and the top surfaces 620t of the TIVs 620.

As illustrated in FIG. 13, the topmost redistribution conductive patterns 720 include a plurality of pads. In some embodiments, the aforementioned pads include a plurality of under-ball metallurgy (UBM) patterns for ball mount. In some embodiments, a material of the inter-dielectric layers 710 and a process for forming the inter-dielectric layers 710 may be similar to those of the inter-dielectric layers 501 of the first redistribution structure 500. In some embodiments, a material of the redistribution conductive patterns 720 and a process for forming the redistribution conductive patterns 720 may be similar to those of the redistribution conductive patterns 502 of the first redistribution structure 500.

In some embodiments, the conductive terminals 750 are disposed on the second redistribution structure 700. For example, the conductive terminals 750 are placed on the topmost redistribution conductive patterns 720 (the UBM patterns) of the second redistribution structure 700. In some embodiments, the conductive terminals 750 include solder balls. In some embodiments, the conductive terminals 750 may be placed on the UBM patterns through a ball placement process or other suitable processes.

After forming the second redistribution structure 700 and the conductive terminals 750, the carrier substrate C3 is removed from the overlying structure through a de-bonding process. The remaining structure may be referred to as a semiconductor package PKG1. As illustrated in FIG. 14, the semiconductor package PKG1 is connected to another semiconductor package SP to construct a package structure PS1. The package structure PS1 is a package-on-package (PoP) structure which includes two or more semiconductor packages stacking with one another. A plurality of conductive terminals TSP are provided at a side of the semiconductor package SP and bonded onto the semiconductor package PKG1. In some embodiments, the conductive terminals TSP include solder balls. The conductive terminals TSP may be bonded on the second redistribution structure 700 of the semiconductor package PKG1. The conductive terminals TSP and the conductive terminals 750 are located at opposite sides of the semiconductor package PKG1. In some embodiments, the semiconductor package SP may be a DRAM package, and the semiconductor package PKG1 may be a logic package, but the disclosure is not limited thereto.

With respect to the relative positions of the semiconductor dies 100, 200, 300 and the TDVs 110 in the package structure PS1, referring to FIG. 14 and FIGS. 15A-15C. For example, FIG. 14 may be the schematic cross-sectional view taken along a cross-sectional lines I-I' depicted in FIGS. 15A-15C. It will be appreciated that FIGS. 15A-15C merely illustrate the semiconductor dies 100, 200, 300 and the TDVs 110 for simplicity.

In some embodiments, orthogonal projections (solid line) of the second semiconductor die 200 and the third semiconductor die 300 are respectively partially overlapped with an orthogonal projection (dashed line) of the first semiconductor die 100 on the same horizontal plane, as shown in FIGS. 15A and 15C. As illustrated in FIG. 15A, in the direction X, a side 200S1 of the orthogonal projection of the second semiconductor die 200 extends from a side 100S1 of the orthogonal projection of the first semiconductor die 100 by a distance D1; and in a direction Y perpendicular to the direction X, a side 200S3 and another side 200S4 opposite to the side 200S3 of the orthogonal projection of the second semiconductor die 200 respectively extend from respective sides 100S3 and 100S4 of the orthogonal projection of the first semiconductor die 100 by a distance D2. Similarly, a side 300S3 and another side 300S4 opposite to the side 300S3 of the orthogonal projection of the third semiconductor die 300 respectively extend from respective sides 100S3 and 100S4 of the orthogonal projection of the first semiconductor die 100 by a distance D2. In some particular embodiments, the distance D1 may be greater than the distance D2; however, the disclosure is not limited thereto. For example, as shown in FIG. 15C, the side 200S4 of the orthogonal projection of the second semiconductor die 200 and the side 300S4 of the orthogonal projection of the third semiconductor die 300 may extend from the side 100S4 of the orthogonal projection of the first semiconductor die 100 by another distance D3, in which the distance D3 is substantially equal to the distance D1. In some other embodiments, the orthogonal projection of the third semiconductor die 300 may be completely overlapped with the orthogonal projection of the first semiconductor die 100. For example, the sides 300S1, 300S3, 300S4 of the orthogonal projection of the third semiconductor die 300 are substantially aligned with the respective sides 100S2, 100S3, 100S4 of the orthogonal projection of the first semiconductor die 100, as seen from FIG. 15B. That is, as shown in the cross-sectional view of FIG. 14, a sidewall 200sw of the second semiconductor die 200 may generally keep the distance D1 outwards from a sidewall 100sw of the first semiconductor die 100; and a sidewall 300sw of the third semiconductor die 300 may be substantially aligned with another sidewall 100sw' of the first semiconductor die 100. However, the relative positions and the overlapping between the semiconductor dies 100, 200, 300 may be varied based on the design requirements, and thus is not specifically limited in the disclosure. Further, as mentioned above, the TDVs 110 are formed aside the first semiconductor die 100. As such, the TDVs 110 may be located in non-overlapped regions NOR, NOR' of the semiconductor dies 200 and 300 in an array for external electrical connections, for example. Take FIG. 15B as an example: the TDVs 110 are formed in a 2×7 array in the non-overlapped regions NOR.

Figure 29:
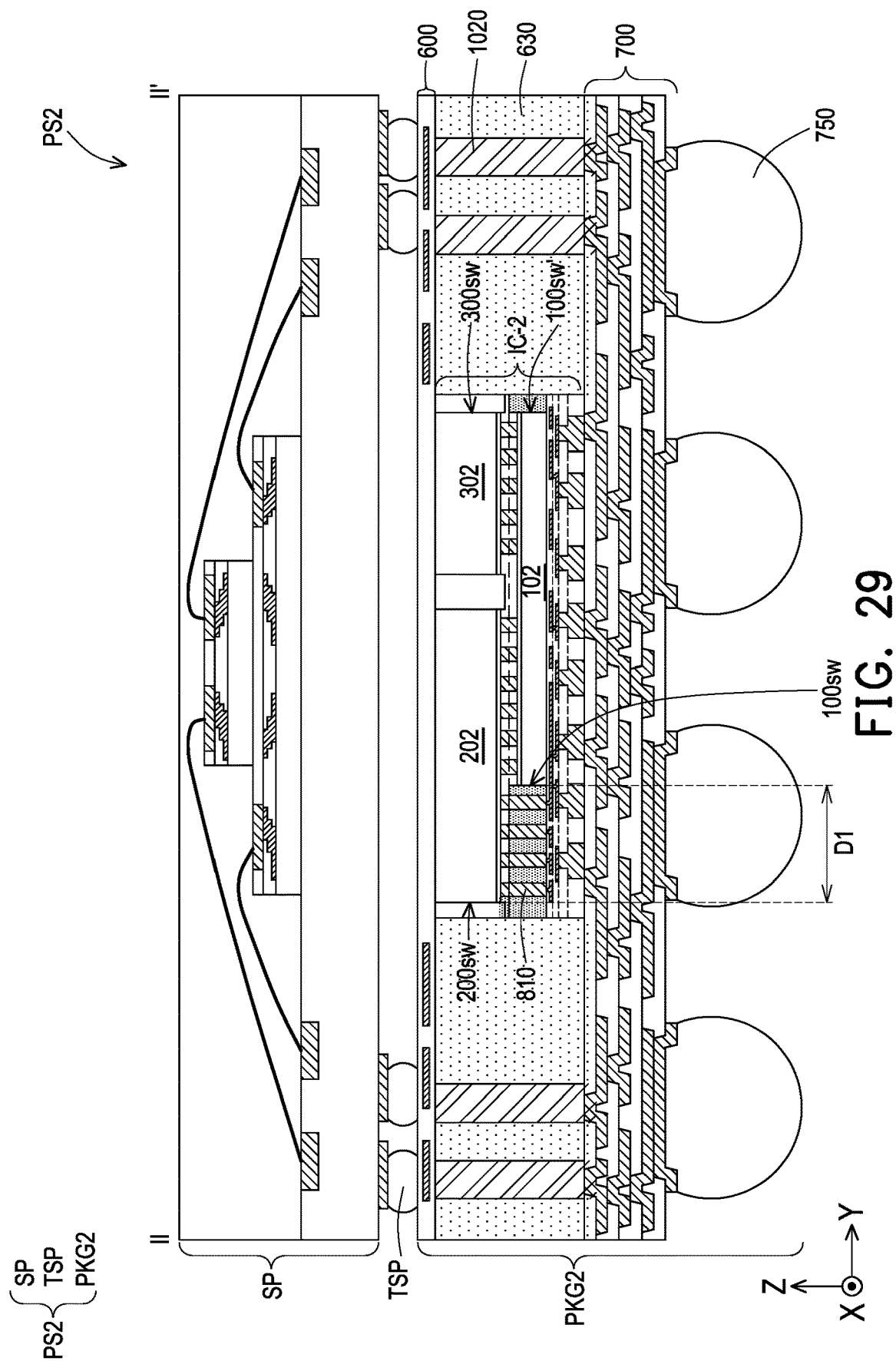
Figure 30C:
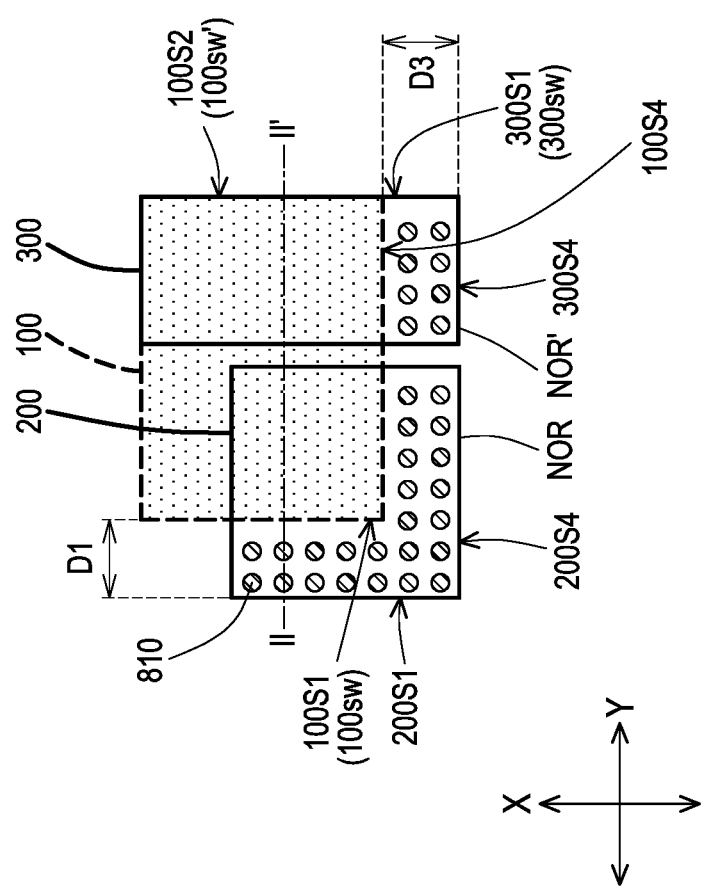

FIG. 16 through FIG. 29 are schematic cross-sectional views illustrating intermediate steps during a process for forming a package structure in accordance with some embodiments of the disclosure. FIG. 30A through FIG. 30C are schematic top views illustrating relative positions of semiconductor dies and through insulation vias (TIVs) in a package structure in accordance with some embodiments of the disclosure. Similarly, in FIG. 16 through FIG. 29, one semiconductor package is shown for simplicity, the disclosure is not limited thereto. In addition, like elements are designated with similar numerical reference for ease of understanding and the details thereof are not repeated herein.

Figure 16:
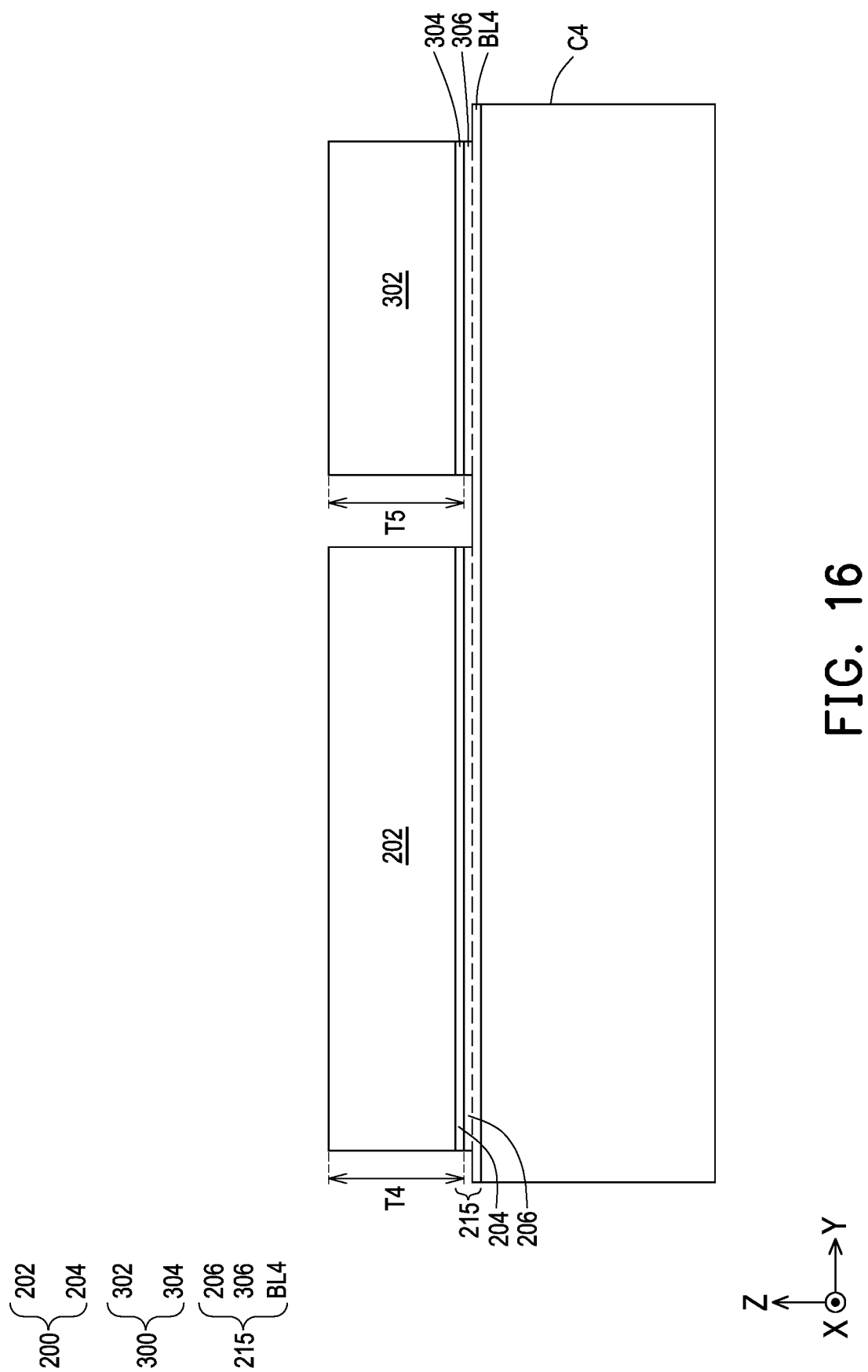
FIG. 16 through FIG. 29 are schematic cross-sectional views illustrating intermediate steps during a process for forming a package structure in accordance with some embodiments of the disclosure.

Referring to FIG. 16, a carrier substrate C4 including a bonding layer BL4 formed on a surface thereof is provided. The bonding layer BL4 may be a deposited layer formed over the top surface of the carrier substrate C4. In some alternative embodiments, the carrier substrate C4 and the bonding layer BL4 are respectively similar to the carrier substrate C1 and the bonding layer BL1 shown in FIG. 1. Next, a second semiconductor die 200 and a third semiconductor die 300 are provided and bonded to the top surface of the bonding layer BL4. The second semiconductor die 200 and the third semiconductor die 300 respectively include semiconductor substrates 202, 302 and device layers 204, 304 formed on the semiconductor substrates 202, 302. In addition, bonding layers 206, 306 are respectively formed on the second semiconductor die 200 and the third semiconductor die 300. In some embodiments, a material of the bonding layers 206, 306 may be similar to the material of the bonding layer BL4 of the carrier substrate C4.

As shown in FIG. 16, the second semiconductor die 200 and the third semiconductor die 300 are placed on the top surface of the bonding layer BL4 aside such that the bonding layers 206, 306 face the bonding layer BL4, and the bonding layers 206, 306 are in contact with the top surface of the bonding layer BL4. After the second semiconductor die 200 and the third semiconductor die 300 are picked up and placed on the bonding layer BL4, a chip-to-wafer fusion bonding process may be performed such that a fusion bonding layer 215 is formed between the carrier substrate C4 and the semiconductor dies 200, 300. For example, the bonding layer BL4 may be directly bonded to the bonding layers 206, 306. The fusion bonding layer 215 may be similar to that formed between the carrier substrate C1 and the first semiconductor die 100 shown in FIG. 1. In some embodiments, the second semiconductor die 200 and the third semiconductor die 300 may respectively has a thickness T4 and a thickness T5, and the thicknesses T4, T5 may range from about 150 μm to about 250 μm, although lesser and greater thicknesses may also be used.

Figure 17:
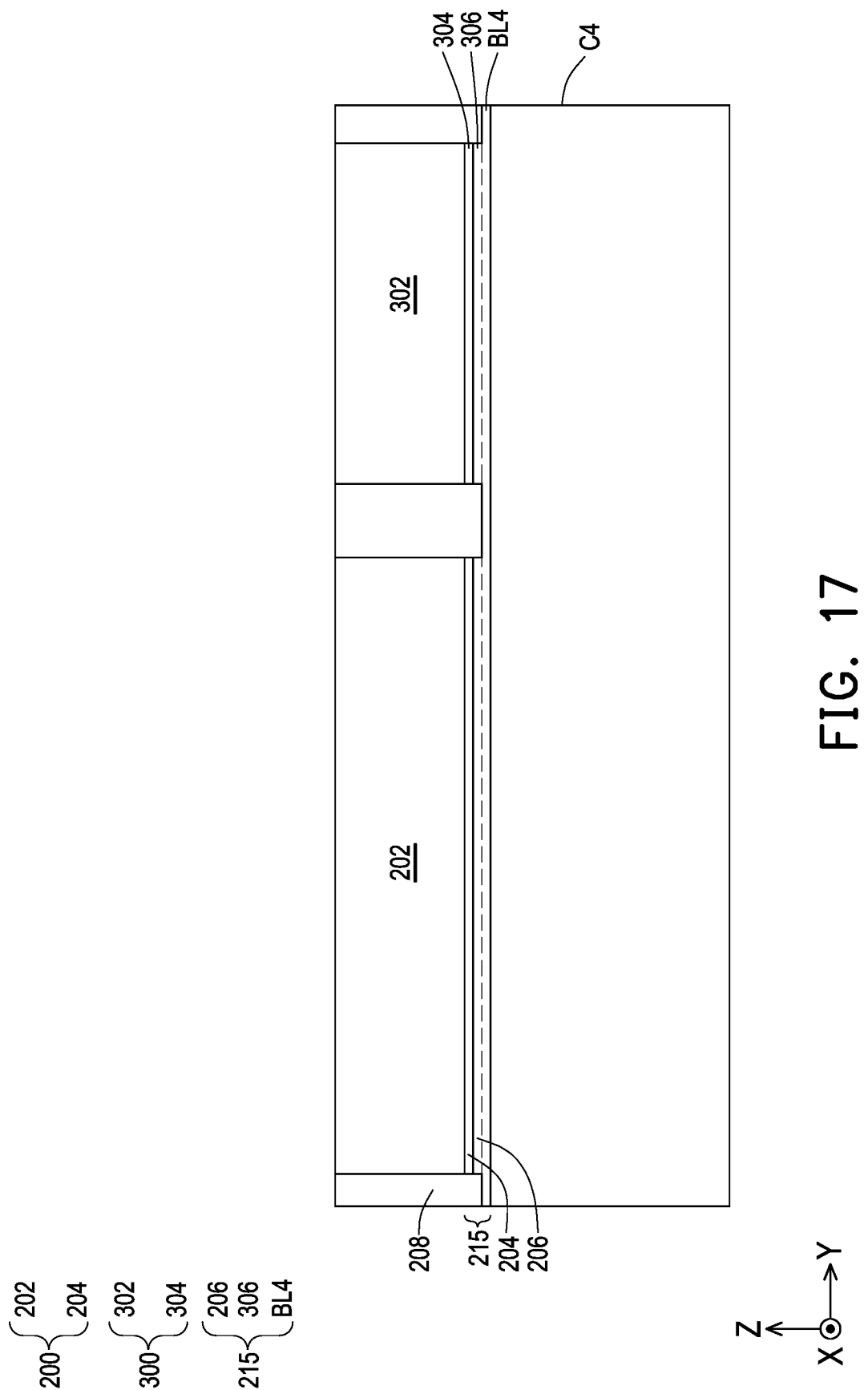

In FIG. 17, a dielectric layer 208 is formed over the bonding layer BL4 and the second semiconductor die 200 and the third semiconductor die 300. In some embodiments, the dielectric layer 208 may be similar to the dielectric layer 108 shown in FIG. 2; hence the details thereof are not repeated herein. Subsequent to the deposition of the dielectric layer 208, a planarization process such as a CMP process or a mechanical grinding process is performed to remove excess portions of the dielectric layer 208, so that the second semiconductor die 200 and the third semiconductor die 300 are exposed.

Figure 18:
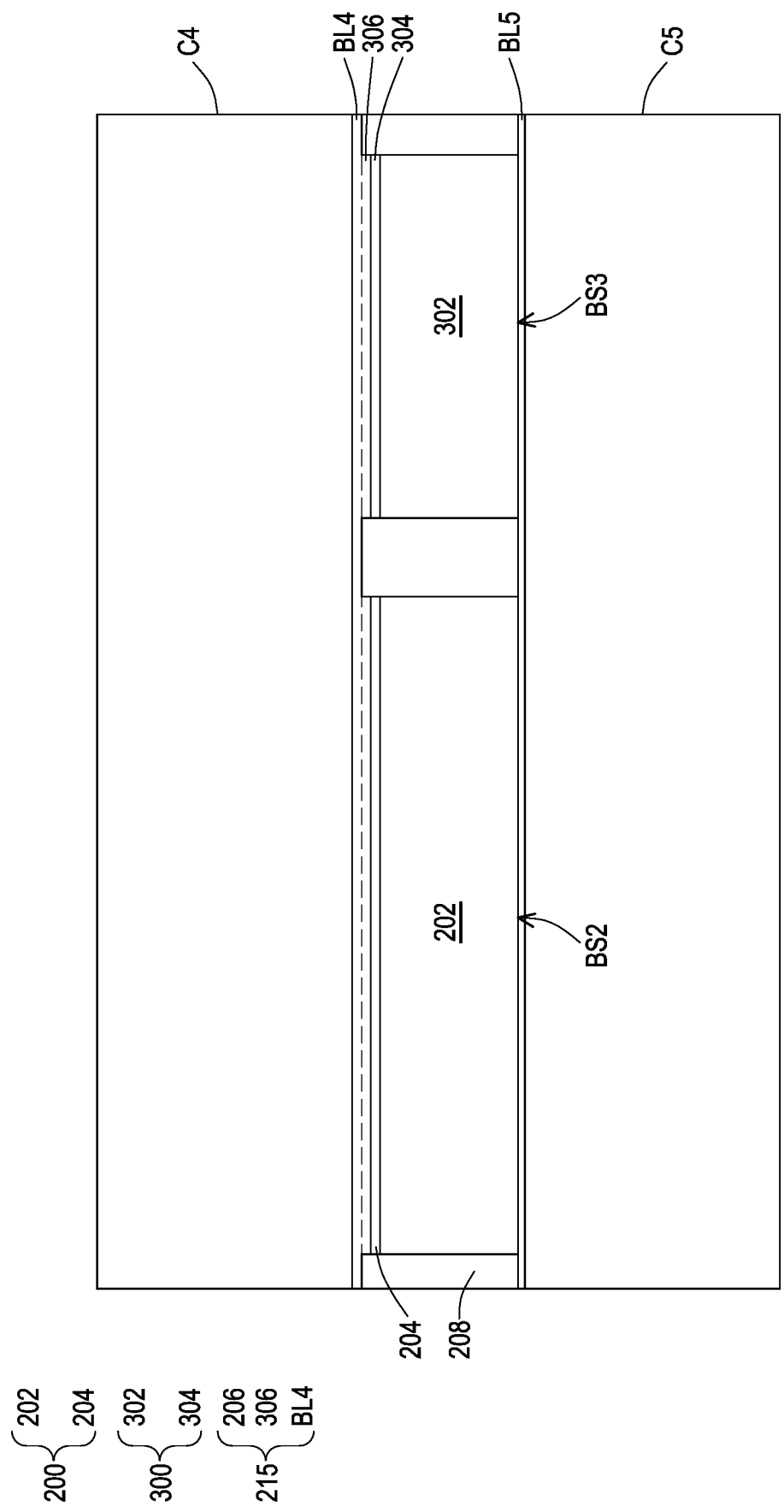

Referring to FIG. 18, another carrier substrate C5 including a bonding layer BL5 formed on a surface thereof is provided. In some embodiments, the carrier substrate C5 and the bonding layer BL5 may be respectively similar to the carrier substrate C4 and the bonding layer BL4. As illustrated in FIG. 18, the structure of FIG. 17 is flipped upside down and then bonded to the carrier substrate C5 through fusion bonding. In some other embodiments, bonding layers (not shown) may be respectively formed on back side surfaces BS2, BS3 of the second semiconductor die 200 and the third semiconductor die 300 for subsequent fusion bonding. In some alternative embodiments, the bonding layers may be omitted from the second semiconductor die 200 and the third semiconductor die 300.

Figure 19:
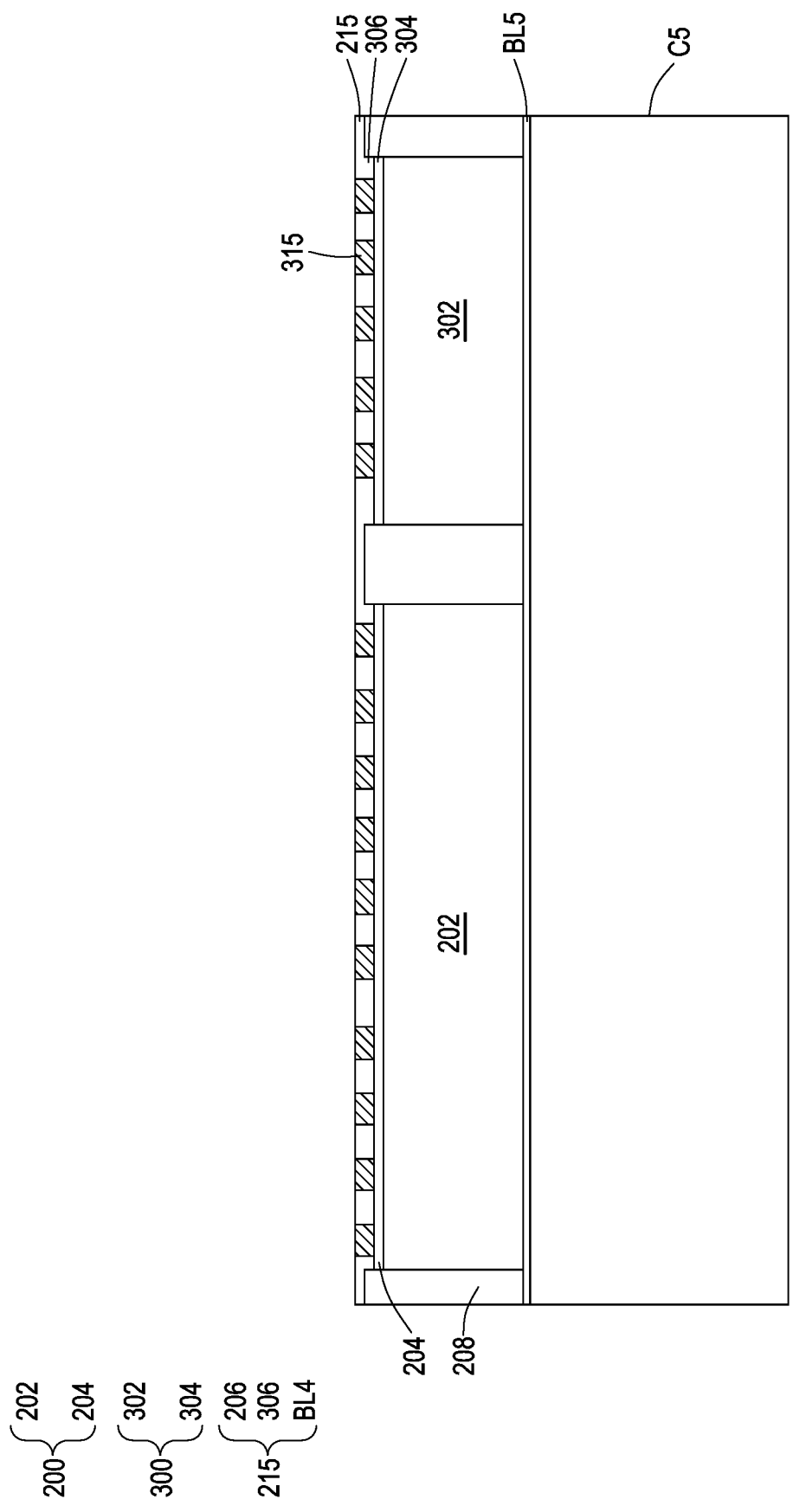

In FIG. 19, the carrier substrate C4 is removed from the underlying structure such that the fusion bonding layer 215 between the carrier substrate C4 and the semiconductor dies 200, 300 is exposed. Further, a plurality of conductive pads 315 are respectively formed in the fusion bonding layer 215 over the second semiconductor die 200 and the third semiconductor die 300. For example, the conductive pads 315 are embedded in and laterally encapsulated by the fusion bonding layer 215. In some embodiments, the conductive pads 315 are formed by filling the conductive materials in the openings of the fusion bonding layer 215 which are patterned and etched. In the illustrated embodiment, the conductive pads 315 and the fusion bonding layer 215 may be collectively referred to as a bonding structure 115.

Figure 20:
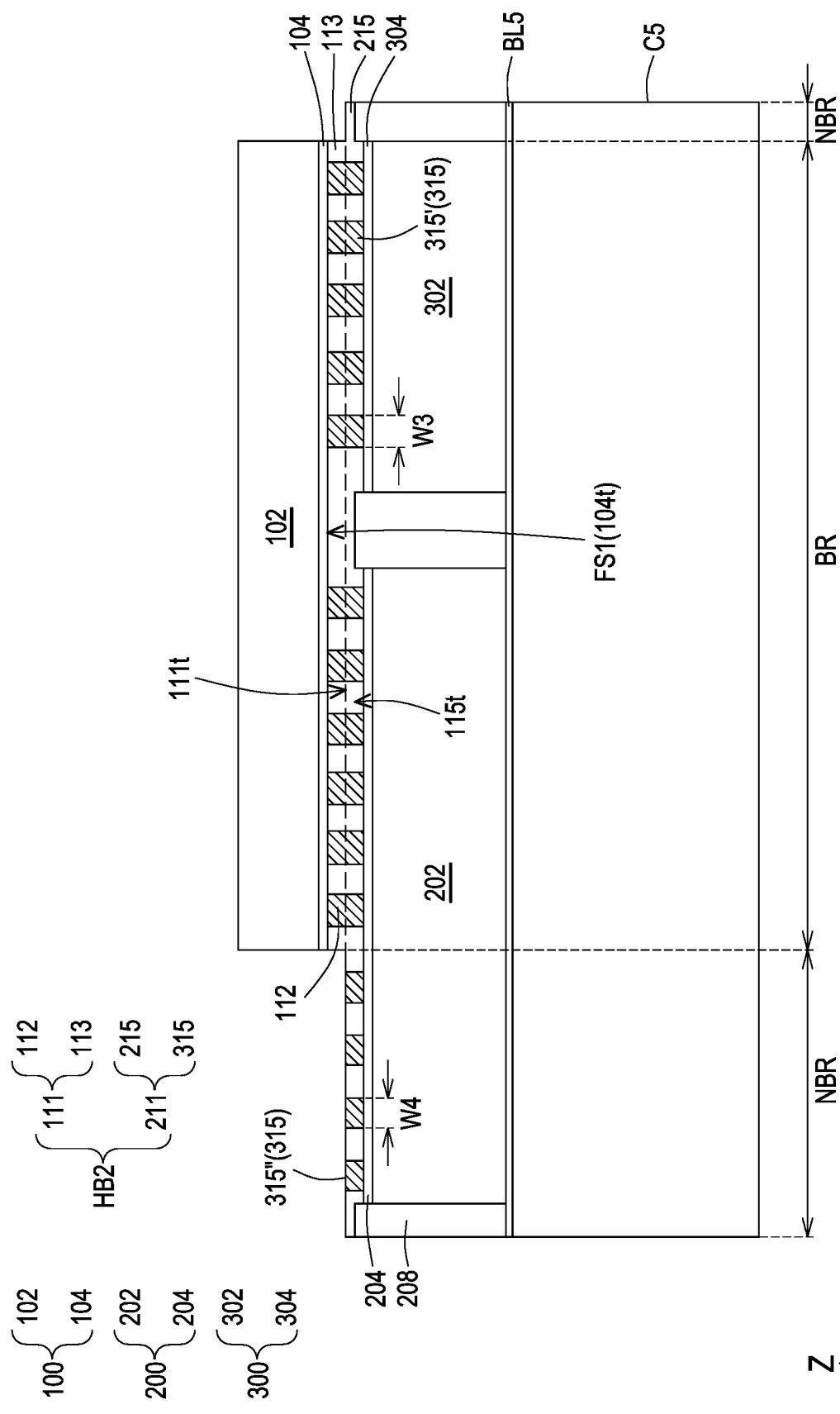

Referring to FIG. 20, a first semiconductor die 100 is provided and the first semiconductor die 100 is then bonded to the second semiconductor die 200 and the third semiconductor die 300. The first semiconductor die 100 may include a semiconductor substrate 102 and a device layer 104. In some embodiments, the device layer 104 is formed on a surface of the semiconductor substrate 102 and a top surface 104t of the device layer 104 may be referred to as a front side surface FS1 of the first semiconductor die 100. In addition, a bonding structure 111 including a dielectric layer 113 and a plurality of conductive pads 112 embedded in the dielectric layer 113 is formed on the front side surface FS1 of the first semiconductor die 100.

As illustrated in FIG. 20, the first semiconductor die 100 is oriented in a manner that a top surface 111t of the bonding structure 111 faces a top surface 115t of the bonding structure 115, and then bonded to the second semiconductor die 200 and the third semiconductor die 300 through hybrid bonding. In other words, the first semiconductor die 100 is bonded to the second semiconductor die 200 and the third semiconductor die 300 in a "face-to-face" manner. For example, the hybrid bonding is conducted in a way that the conductive pads 112 are substantially aligned and in physical contact with the conductive pads 315 while the dielectric layers 113 are also in physical contact with the fusion bonding layer 215. Specifically, as shown in FIG. 20, only a portion of the bonding structure 115 (e.g., at the third semiconductor die 300 and at a portion of the second semiconductor die 200) is bonded to the bonding structure 111 of the first semiconductor die 100. The aforementioned bonded portion is referred to as a bonding region BR and the rest portion of bonding structure 115 is referred to as a non-bonding region NBR. In some embodiments, dimensions of conductive pads 315 in different regions (e.g., conductive pads 315' in the bonding region BR and conductive pads 315" in the non-bonding region NBR) may be different. For example, widths W3 of the conductive pads 315' in the bonding region BR may be substantially equal to or smaller than widths W4 of the conductive pads 315" in the non-bonding region NBR. In some particular embodiments, the widths W3 may be range from about 1 μm to about 4 μm, and widths W4 may be range from about 24 μm to about 34 μm. The difference in width may be due to the consideration of the process window of the subsequently formed through insulation vias (See FIG. 21). In some other embodiments, the bonding structure formed between the bonding structure 111 and the bonding structure 115 are collectively referred to as a hybrid bonding structure HB2.

Figure 21:
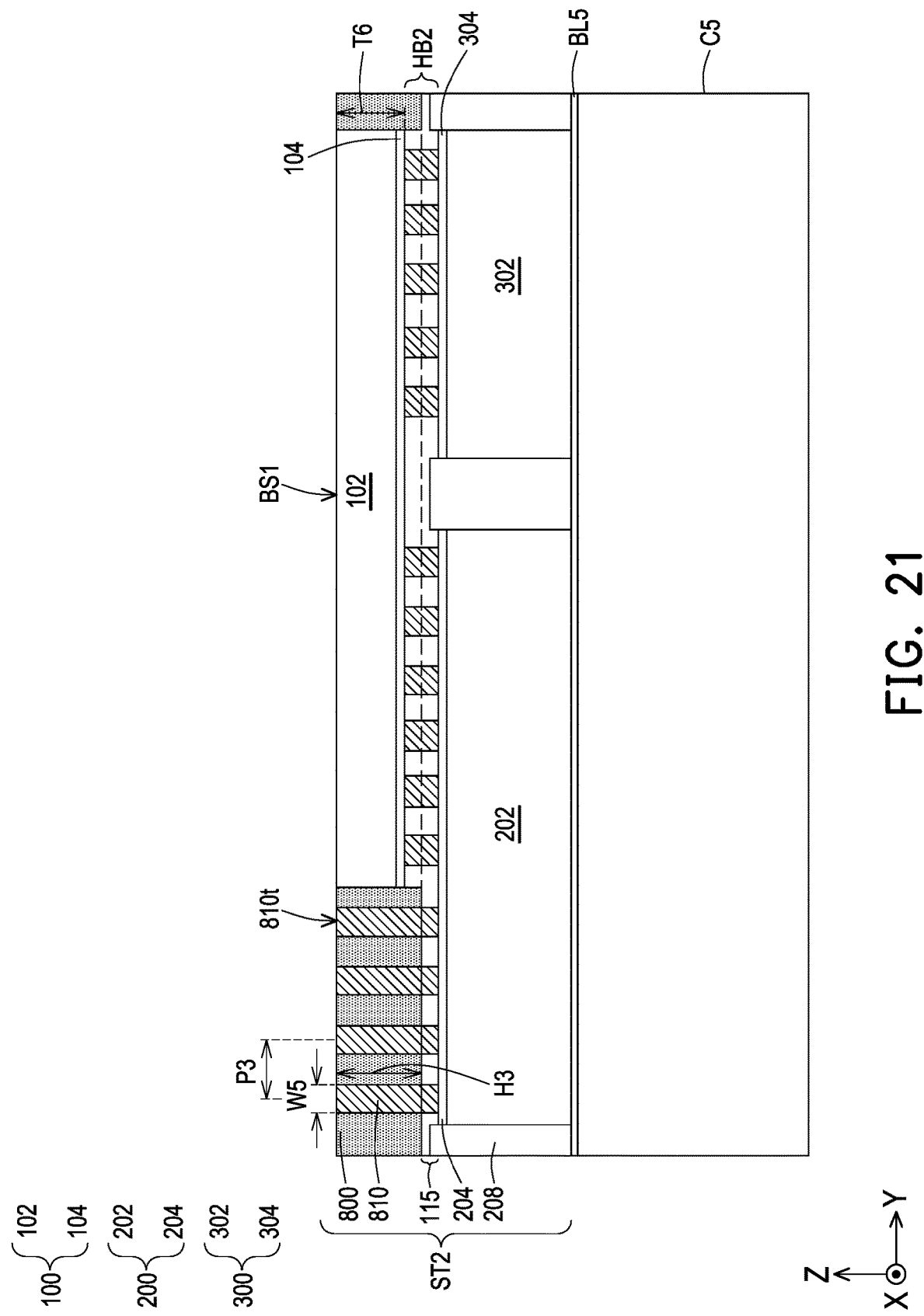

After the first semiconductor die 100 is bonded to the second semiconductor die 200 and the third semiconductor die 300, the first semiconductor die 100 is thinned to have a desired thickness T6. For example, the thickness T6 of the first semiconductor die 100 may range from about 10 μm to about 30 μm, although lesser and greater thicknesses may also be used. Further, a plurality of first through insulation vias (TIVs) 810 are formed on the conductive pads 315" aside the first semiconductor die 100, as shown in FIG. 21. In some embodiments, the first TIVs 810 may be formed of the similar material and formed by similar process of the TIVs 620 of FIG. 11. Similar to the arrangements of the TDVs 110 shown in FIGS. 15A-15C, in some embodiments, the first TIVs 810 are formed aside the first semiconductor die 100 in an array (as shown in FIGS. 30A-30C). Also, in some embodiments, the first TIVs 810 may be formed to have round top-view shapes, polygonal shapes or other suitable shapes from the top view. The first TIVs 810 may have substantially straight and vertical sidewalls, but the disclosure is not limited thereto. In some embodiments, in a direction Z parallel to a normal direction of the carrier substrate C5, a height H3 of the first TIVs 810 is slightly greater than the thickness T6 of the first semiconductor die 100. In some embodiments, in a direction X perpendicular to the direction Z, widths W5 of the first TIVs 810 range from about 20 μm to about 30 μm. In the case that the TDVs 110 have round top-view shapes (as shown in FIGS. 30A-30C), the widths W5 are diameters of the first TIVs 810 accordingly. In the case that the first TIVs 810 have polygonal shapes from the top view, the width W5 may be maximum dimensions of the first TIVs 810. In some other embodiments, a pitch P3 of two adjacent first TIVs 810 may range from about 30 μm to about 50 μm.

Subsequent to the formation of the first TIVs 810, an insulation layer 800 is formed over the first semiconductor die 100, the first TIVs 810 and the bonding structure 115. In some embodiments, the insulation layer 800 includes an insulating material such as silicon oxide, silicon nitride, polymer, or a combination thereof. The polymer is, for instance, PBO, polyimide, BCB, a combination thereof, or the like. In some alternative embodiments, the insulation layer 800 is a LTPI layer. A planarization process such as a CMP process or a mechanical grinding process may be subsequently performed to remove excess portions of the insulation layer 800, so that a back side surface BS1 of the first semiconductor die 100 and top surfaces 810t of the first TIVs 810 are exposed. In some embodiments, the semiconductor dies 100, 200, 300, the first TIVs 810, the hybrid bonding structure HB2, the dielectric layer 208 and the insulation layer 800 are collectively referred to as a die stack structure ST2.

Figure 22:
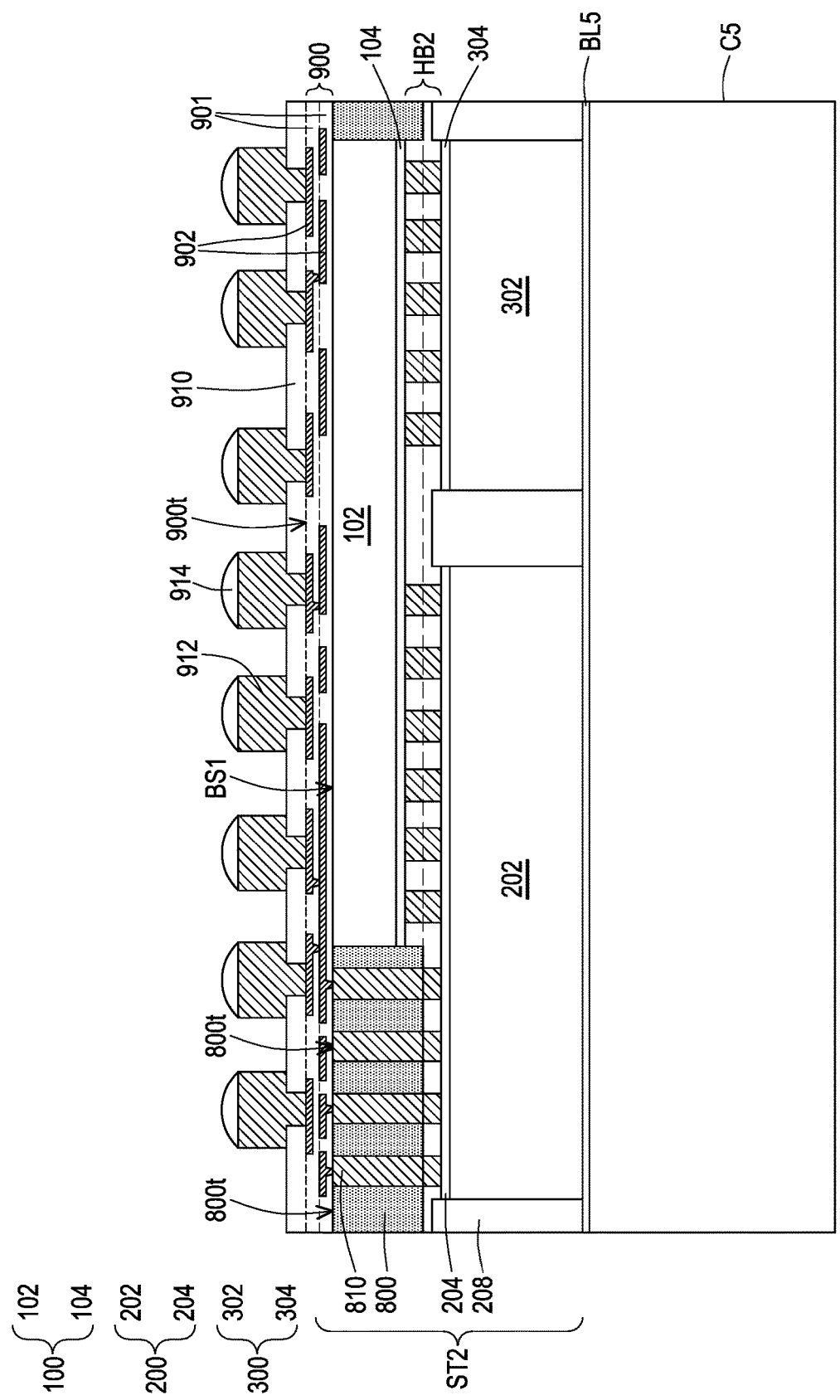

Referring to FIG. 22, a first redistribution structure 900 is formed over the die stack structure ST2 (e.g., over the back side surface BS1 of the first semiconductor die 100, the top surfaces 810t of the first TIVs 810 and top surfaces 800t of the insulation layer 800). In some embodiments, the first redistribution structure 900 may be similar to the first redistribution structure 500 shown in FIG. 7; hence the details thereof are not repeated herein. For example, the first redistribution structure 900 is electrically connected to the first TIVs 810. The first redistribution structure 900 also includes a plurality of inter-dielectric layers 901 and a plurality of redistribution conductive patterns 902 stacked alternately. The plurality of redistribution conductive patterns 902 are electrically connected to the first TIVs 810 embedded in the insulation layer 800. The first redistribution structure 900 is shown as an example having two layers of metallization patterns. More or fewer dielectric layers and metallization patterns may be formed in the first redistribution structure 900.

After forming the first redistribution structure 900, a first protection layer 910 is formed on a top surface 900t of the first redistribution structure 900. A portion of the topmost redistribution conductive patterns 902 is exposed by the first protection layer 910 and serves as an external connection of the die stack structure ST2. In some embodiments, the first protection layer 910 may be similar to the first protection layer 510 shown in FIG. 7. As illustrated in FIG. 22, conductive pillars 912 and test pads 914 are formed on the first protection layer 910 and in the openings of the first protection layer 910. The conductive pillars 912 and the test pads 914 may also be similar to the conductive pillars 512 and the test pads 514 shown in FIG. 7; hence the details thereof are not repeated herein. Once the conductive pillars 912 and the test pads 914 are formed, the die stack structure ST2 may be tested with a probe contact (not shown). The testing may allow for the yield of the die stack structure ST2 to be monitored. Further processing may be halted in response to the die stack structure ST2 failing testing.

Figure 23:
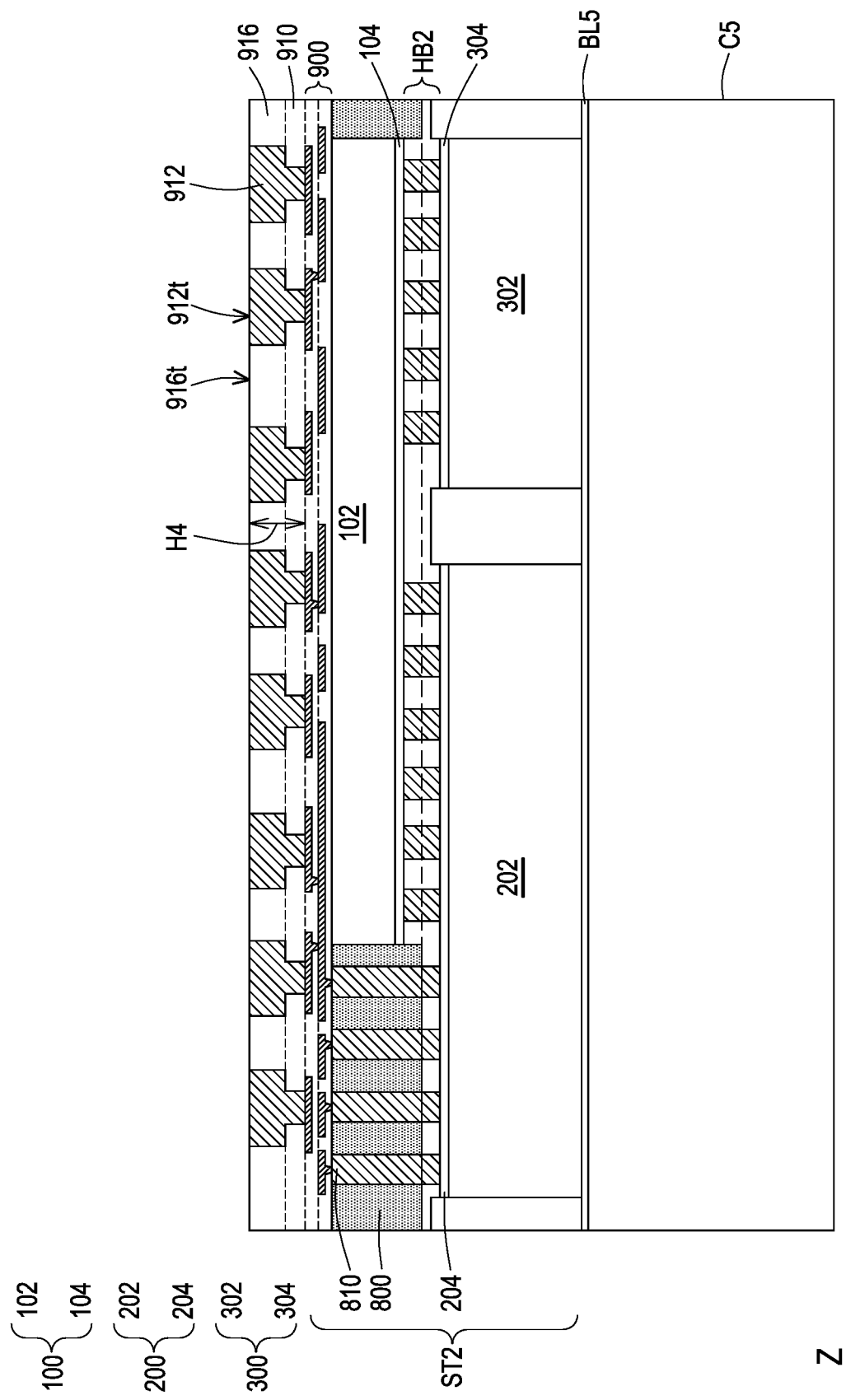

Referring to FIG. 23, the test pads 914 are removed with a selective etching process. After the removal of the test pads 914, the conductive pillars 912 are remained and served as the connectors electrically connecting to the redistribution structure formed in subsequent steps (See FIG. 28) for external connection. A second protection layer 916 is then formed on the first protection layer 910 and filled up the gaps formed between the conductive pillars 912. The second protection layer 916 may be formed of a material similar to the material of the first protection layer 910. In some embodiments, a top surface 916t of the second protection layer 916 is substantially leveled with top surfaces 912t of the conductive pillars 912. In some alternative embodiments, a height H4 of the conductive pillars 912 may range from about 10 μm to about 20 μm.

Figure 24:
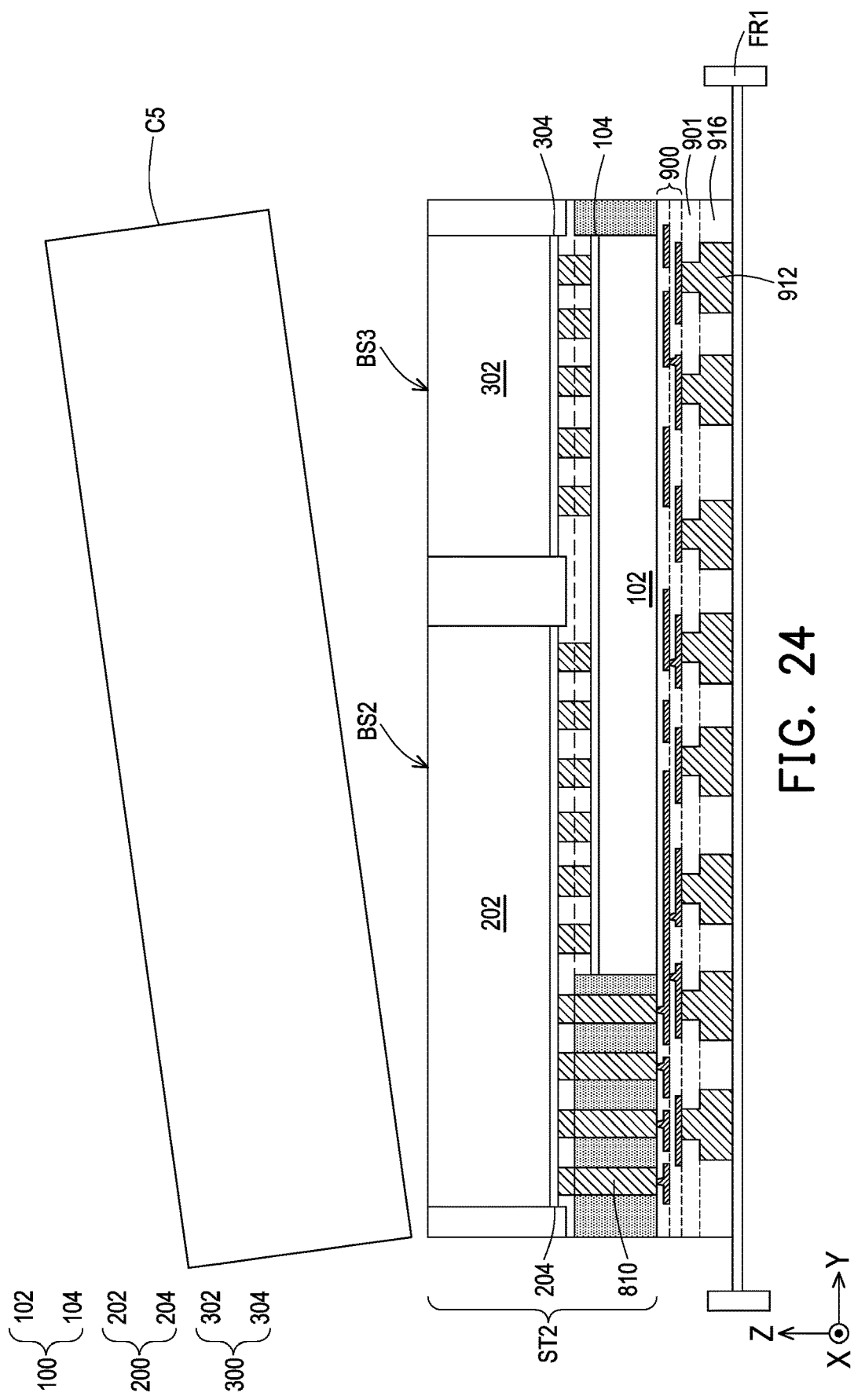

In FIG. 24, the structure of FIG. 23 is flipped upside down and placed on a frame structure FR1. The carrier substrate C5 is removed from the underlying structure through a de-bonding process. Subsequent to separating the carrier substrate C5 from the bonding layer BL5, the bonding layer BL5 is removed through a grinding process or buffering process, for example, such that the back side surfaces BS2, BS3 of the second semiconductor die 200 and the third semiconductor die 300 are revealed.

Figure 25:
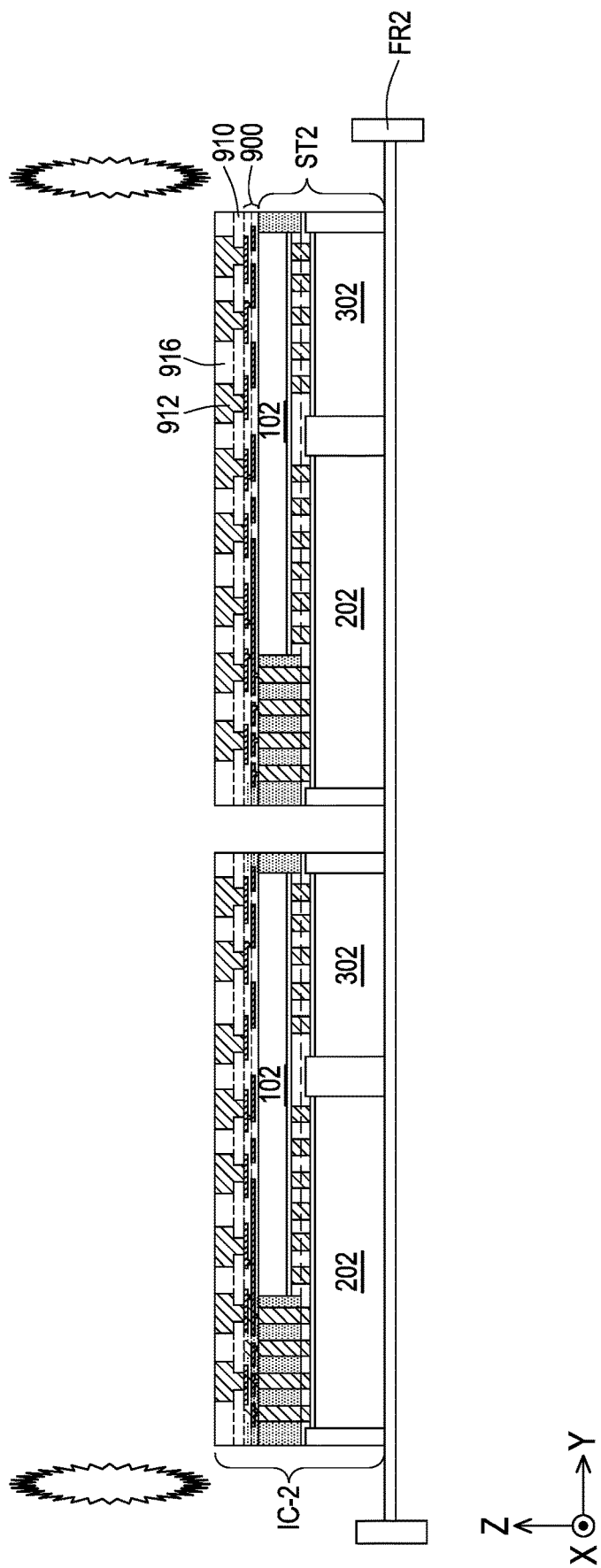

Further, the de-bonded structure is flipped upside down and placed on another frame structure FR2, followed by performing a singulation process to obtain multiple singulated structures as shown in FIG. 25. The singulated structures may also be referred to as integrated circuits IC-2. In some embodiments, each integrated circuit IC-2 includes one of the die stack structure ST2 and the first redistribution structure 900 stacked thereon; the protection layers 910, 916 and the conductive pillars 912 embedded in the protection layers 910, 916.

Referring to FIG. 26 through FIG. 29, a semiconductor package PKG2 is fabricated and then connected to another semiconductor package SP to construct a package structure PS2. The semiconductor package PKG2 and the package structure PS2 may be fabricated in a similar process steps shown in FIG. 11 through FIG. 14, with similar features being labeled by similar numerical reference, and the detailed descriptions of the similar features are not repeated herein.

Figure 26:
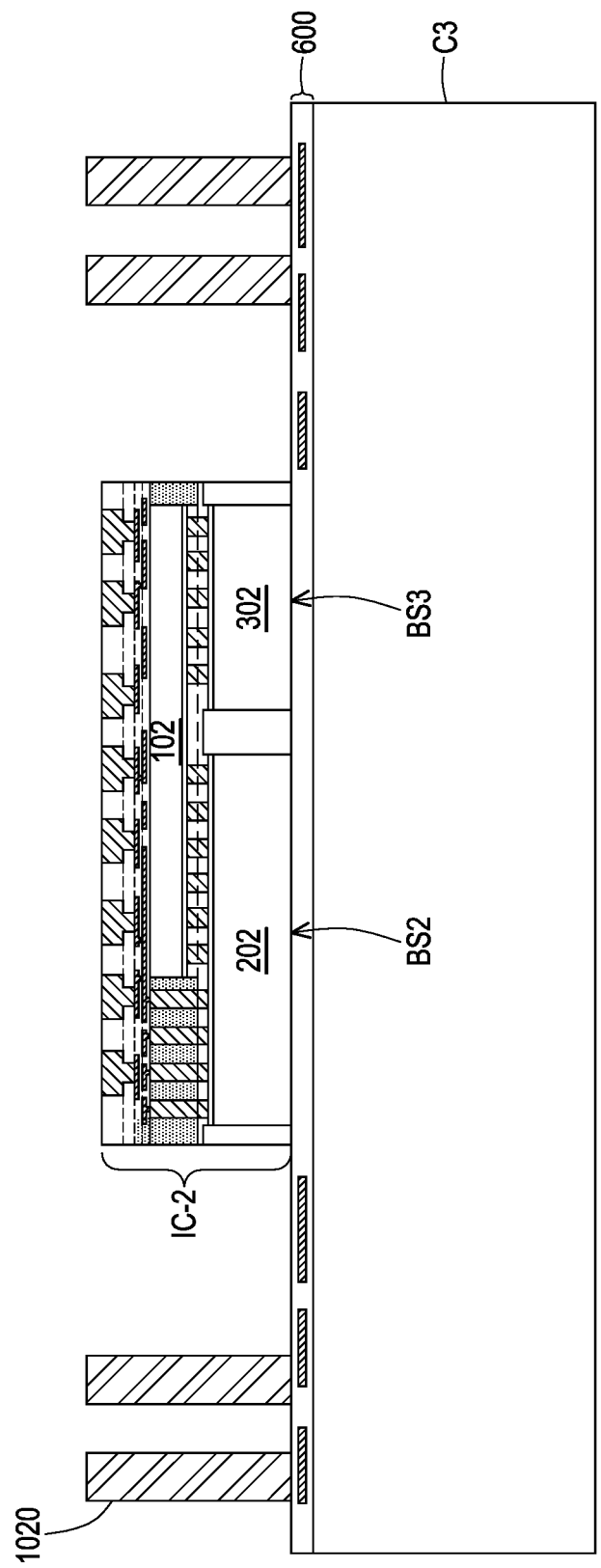

In FIG. 26, the integrated circuit IC-2 is picked and placed on a carrier substrate C3, such that the second semiconductor die 200 and the third semiconductor die 300 are positioned between the carrier substrate C3 and the first semiconductor die 100 and are attached to the carrier substrate C3 with an adhesion layer (not shown). As illustrated in FIG. 26, the back side surfaces BS2, BS3 of the second semiconductor die 200 and the third semiconductor die 300 are adhered to the redistribution structure 600 through the adhesion layer without forming an electric transmission path between the second semiconductor die 200, the third semiconductor die 300 and the redistribution structure 600, but the disclosure is not limited thereto. Further, one or more of conductive pillars, which may be referred to second TIVs 1020 hereafter in the disclosure, are formed on the redistribution structure 600 aside the integrated circuit IC-2 before attaching the integrated circuit IC-2 onto the carrier substrate C3. In some embodiments, the second TIVs 1020 may be formed of similar material and formed by similar process of the TIVs 620 shown in FIG. 11.

Figure 27:
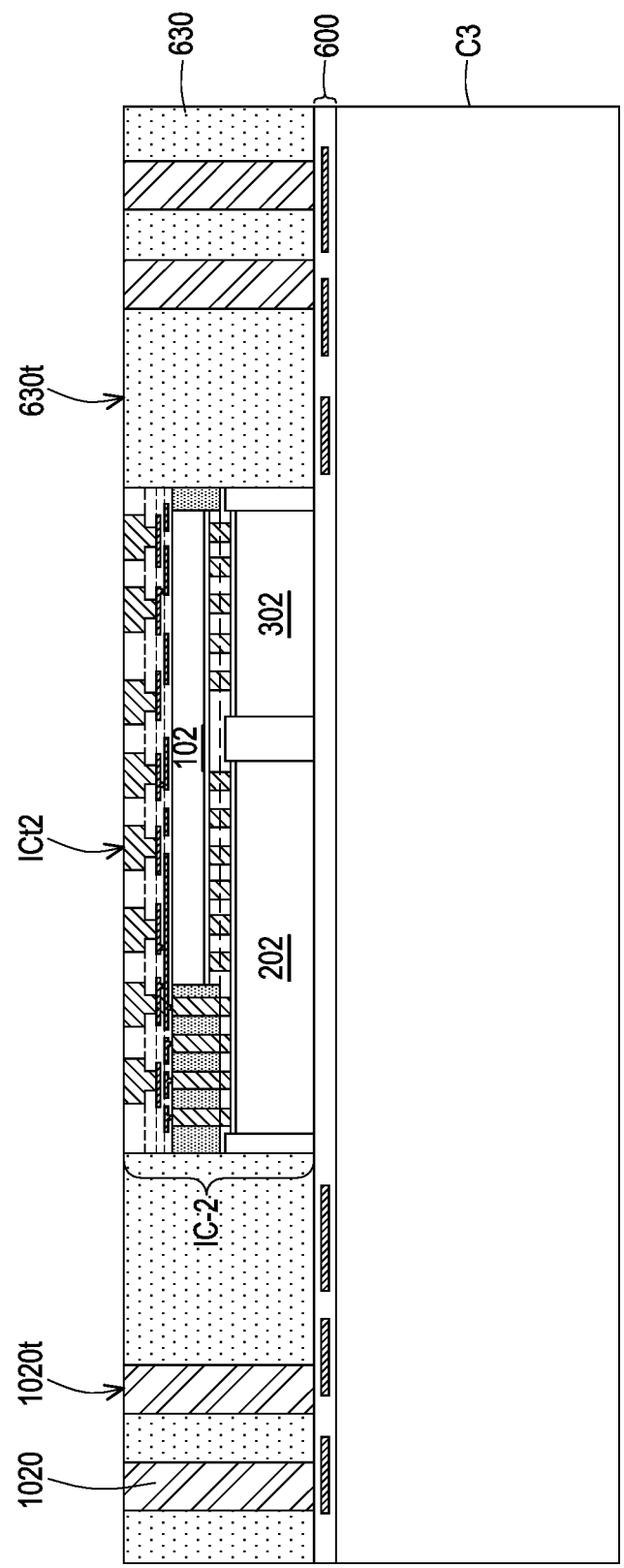

In FIG. 27, the second TIVs 1020 and the integrated circuit IC-2 are buried or covered by an encapsulant 630. In some embodiments, the encapsulant 630 may initially cover the second TIVs 1020 and the integrated circuit IC-2, and may be subsequently thinned until top surfaces 1020t of the second TIVs 1020 and a top surface ICt2 of the integrated circuit IC-2 are exposed. Following planarization, the top surfaces 1020t of the second TIVs 1020, the top surface ICt2 of the integrated circuit IC-2, and the top surface 630t of the encapsulant 630 may be substantially at the same level height.

Figure 28:
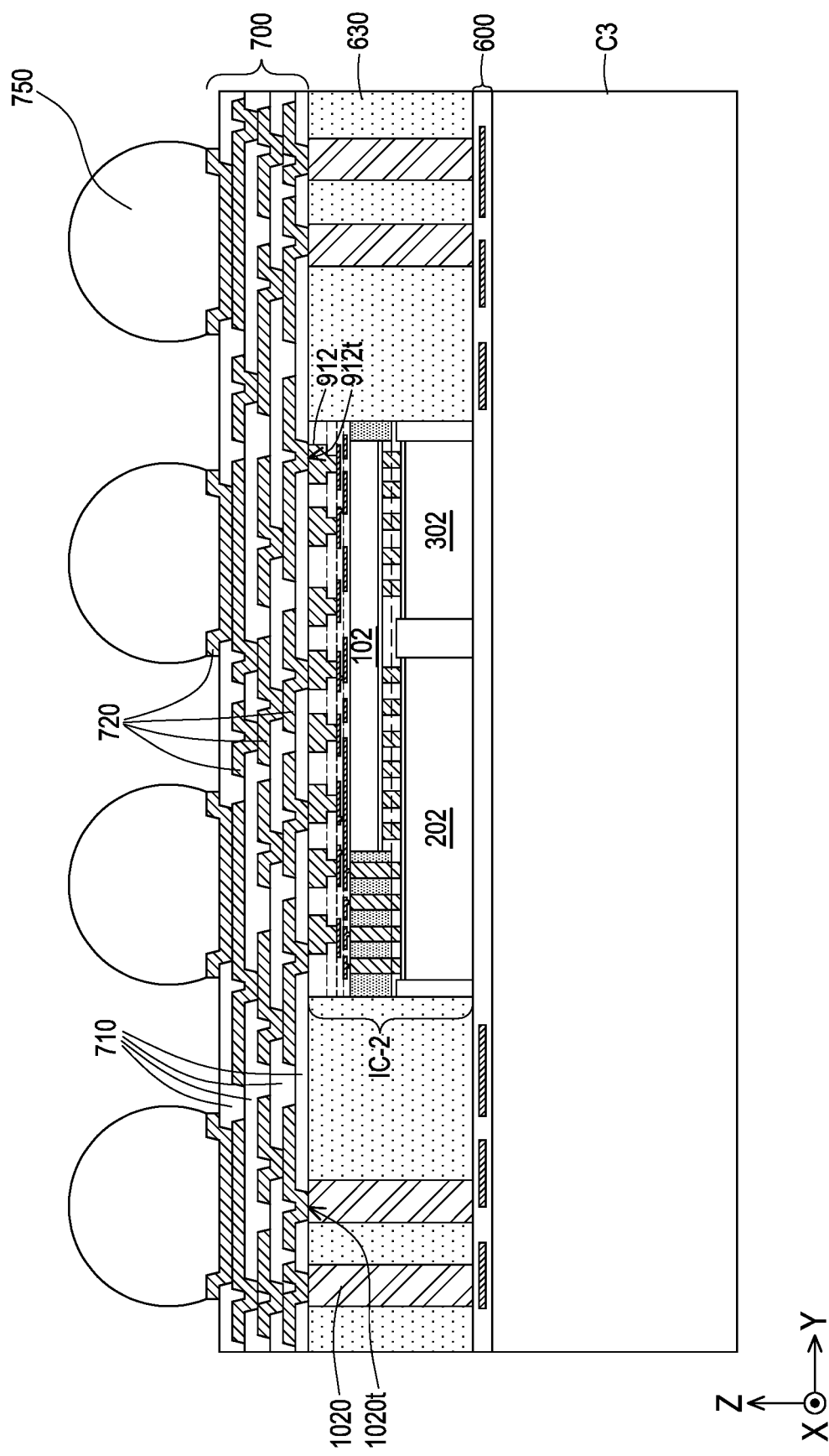

In FIG. 28, a second redistribution structure 700 and a plurality of conductive terminals 750 are sequentially formed over the integrated circuit IC-2, the second TIVs 1020, and the encapsulant 630. In some embodiments, the second redistribution structure 700 is electrically connected to the conductive pillars 912 of the integrated circuit IC-2 and the second TIVs 1020. Similar to FIG. 13, in some embodiments, the second redistribution structure 700 includes a plurality of inter-dielectric layers 710 and a plurality of redistribution conductive patterns 720 stacked alternately, and the bottommost inter-dielectric layer 710 has a plurality of openings exposing the top surfaces 912t of the conductive pillars 912 and the top surfaces 1020t of the second TIVs 1020. The bottommost redistribution conductive patterns 720 extend into the openings of the bottommost inter-dielectric layer 710 to be in physical contact with the top surfaces 912t of the conductive pillars 912 and the top surfaces 1020t of the second TIVs 1020. In addition, the topmost redistribution conductive patterns 720 include a plurality of pads which may include a plurality of UBM patterns for ball mount. The conductive terminals 750 may include solder balls and may be placed on the UBM patterns through a ball placement process or other suitable processes.

After forming the second redistribution structure 700 and the conductive terminals 750, the carrier substrate C3 is removed from the overlying structure through a de-bonding process. The remaining structure may be referred to as a semiconductor package PKG2, and the semiconductor package PKG2 is then connected to another semiconductor package SP to construct a package structure PS2, as illustrated in FIG. 29. The semiconductor package PKG2 and the package structure PS2 are respectively similar to the semiconductor package PKG1 and the package structure PS1 shown in FIG. 14, with the distinction that the integrated circuits IC-2 are used to fabricate the aforementioned package structure.

With reference to FIG. 29 and FIGS. 30A-30C, the relative positions of the semiconductor dies 100, 200, 300 and the first TIVs 810 in the package structure PS2 are illustrated. For example, FIG. 29 may be the schematic cross-sectional view taken along a cross-sectional lines II-II' depicted in FIGS. 30A-30C. It will be appreciated that FIGS. 30A-30C merely illustrate the semiconductor dies 100, 200, 300 and the first TIVs 810 for simplicity. Generally, the arrangements of semiconductor dies 100, 200, 300 in the package structure PS2 may be similar to those in the package structure PS1 shown in FIGS. 15A-15C, thus the details thereof are not repeated herein. Further, similar to the TDVs 110 shown in FIGS. 15A-15C, the first TIVs 810 may be located in the non-overlapped regions NOR, NOR' of the semiconductor dies 200 and 300 for external electrical connections.

FIG. 31 through FIG. 44 are schematic cross-sectional views illustrating intermediate steps during a process for forming a package structure in accordance with some embodiments of the disclosure. FIG. 45A through FIG. 45C are schematic top views illustrating relative positions of semiconductor dies and through insulation vias (TIVs) in a package structure in accordance with some embodiments of the disclosure. Similarly, in FIG. 31 through FIG. 44, one semiconductor package is shown for simplicity, the disclosure is not limited thereto. In addition, like elements are designated with similar numerical reference for ease of understanding and the details thereof are not repeated herein.

Figure 31:
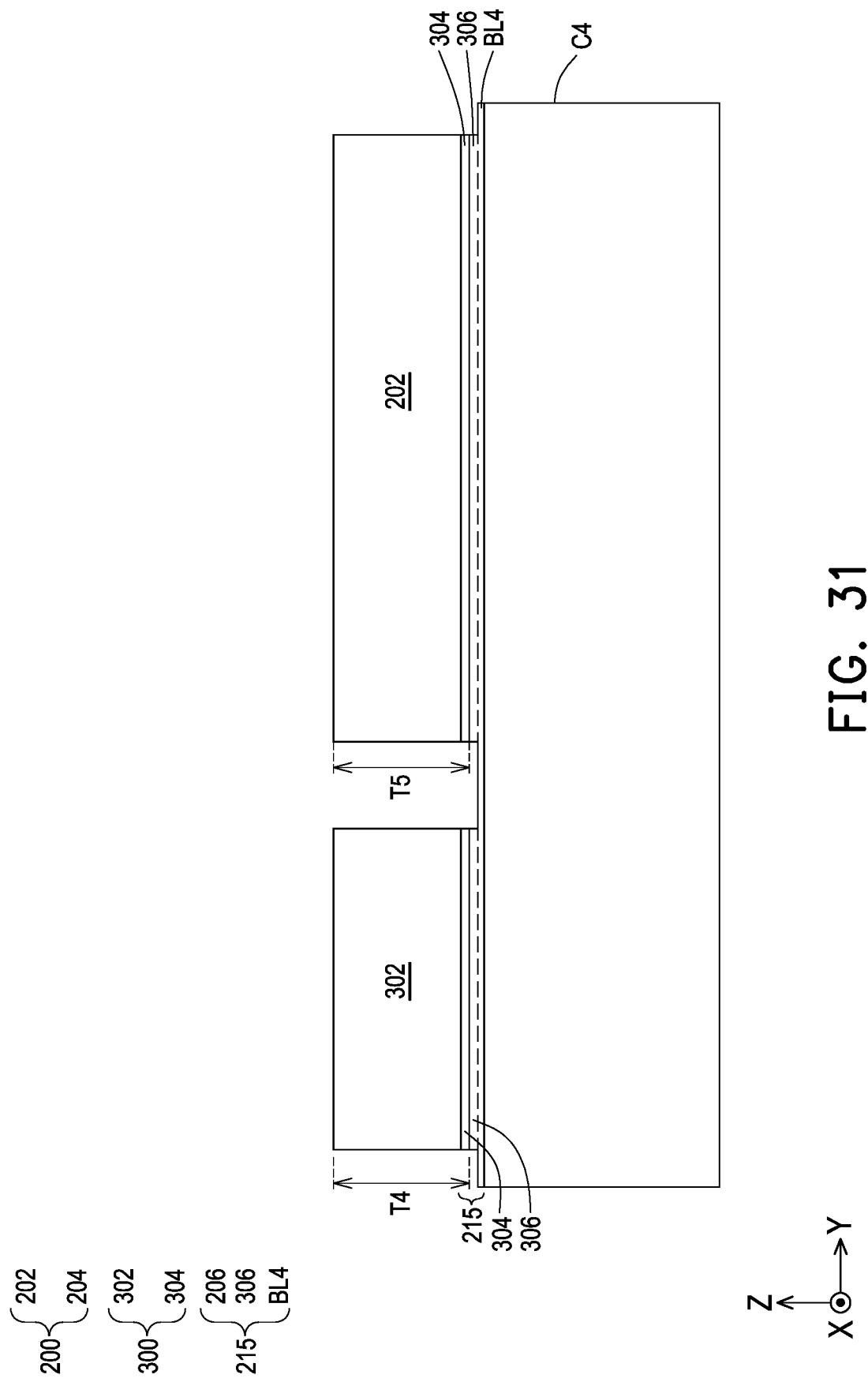
FIG. 31 through FIG. 44 are schematic cross-sectional views illustrating intermediate steps during a process for forming a package structure in accordance with some embodiments of the disclosure.

Referring to FIG. 31, a stacking structure similar to the structure of FIG. 16 is formed, with similar features being labeled by similar numerical reference, and the detailed descriptions of the similar features are not repeated herein.

Figure 32:
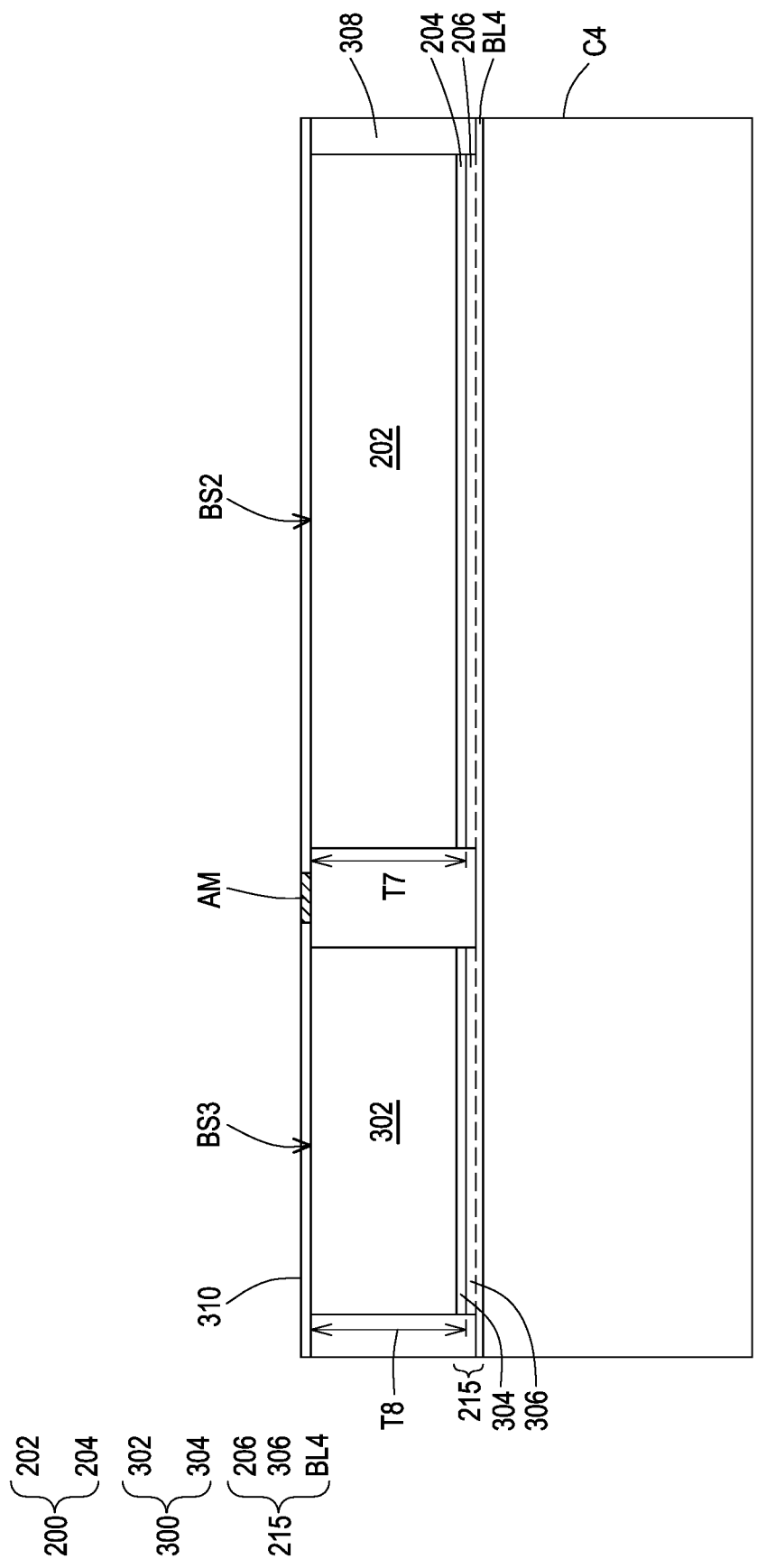

In FIG. 32, the second semiconductor die 200 and the third semiconductor die 300 are thinned to respectively have desire thicknesses T7 and T8. For example, the thicknesses T7 and T8 may range from about 10 μm to about 30 μm, although lesser and greater thicknesses may also be used. Further, a dielectric layer 308 is formed over the bonding layer BL4 and the second semiconductor die 200 and the third semiconductor die 300. In some embodiments, the dielectric layer 308 may be similar to the dielectric layer 108 shown in FIG. 2. A planarization process such as a CMP process or a mechanical grinding process may be performed to remove excess portions of the dielectric layer 308, so that the second semiconductor die 200 and the third semiconductor die 300 are exposed.

In some embodiments, an alignment mark AM is formed over the dielectric layer 308. In the illustrated embodiment, the alignment mark AM is located on between the second semiconductor die 200 and the third semiconductor die 300, but the disclosure is not limited thereto. The number, the shape, and the position of the alignment mark AM are not limited in the present invention. The alignment mark AM may be formed by deposition, photolithography, and etch processes. In some embodiments, metallic material is deposited over the dielectric layer 308, and the deposited metallic material is then patterned through, for example, a photolithography process followed by an etch process.

After forming the alignment mark AM, a bonding layer 310 may be formed over the dielectric layer 308 and back side surfaces BS2, BS3 of the semiconductor dies 200, 300, such that the alignment mark AM is covered by the bonding layer 310. The bonding layer 310 may be formed of similar material and formed by similar process of the bonding layer BL1 of the carrier substrate shown in FIG. 1.

Figure 33:
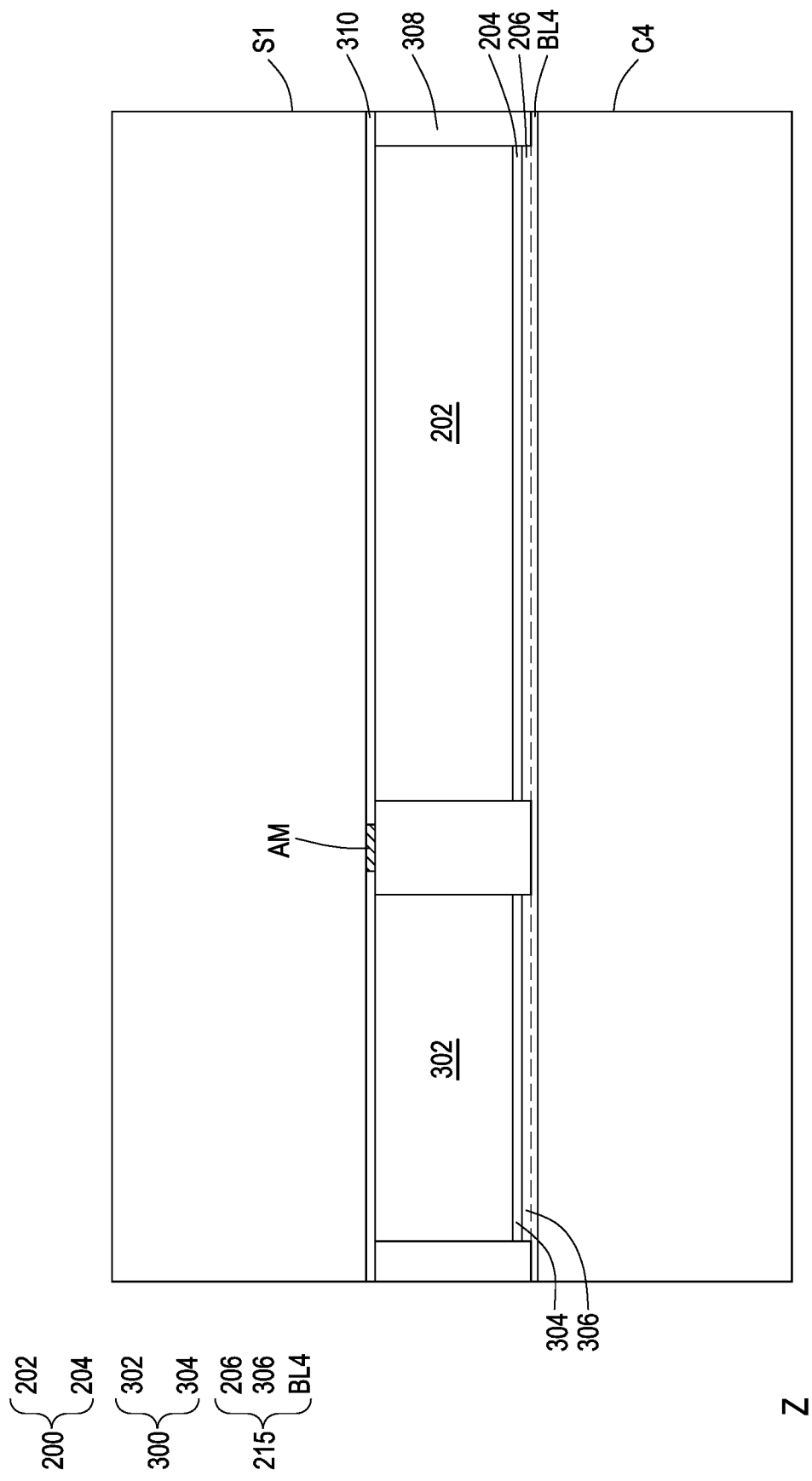

Referring to FIG. 33, after forming the alignment mark AM and the bonding layer 310, a support substrate S1 for heat dissipation is provided and placed over the bonding layer 310. The support substrate S1 is aligned with the structure of FIG. 32 by using the alignment mark AM. The thickness of the support substrate S1 may range from about 750 μm to about 800 μm. For example, the support substrate S1 is a semiconductor wafer (e.g., a silicon wafer), and the thickness of the support substrate S1 is about 775 micrometers. In some embodiments, a wafer-to-wafer fusion bonding process is performed such that a fusion bonding layer is formed between the support substrate S1 and the bonding layer 310.

Figure 34:
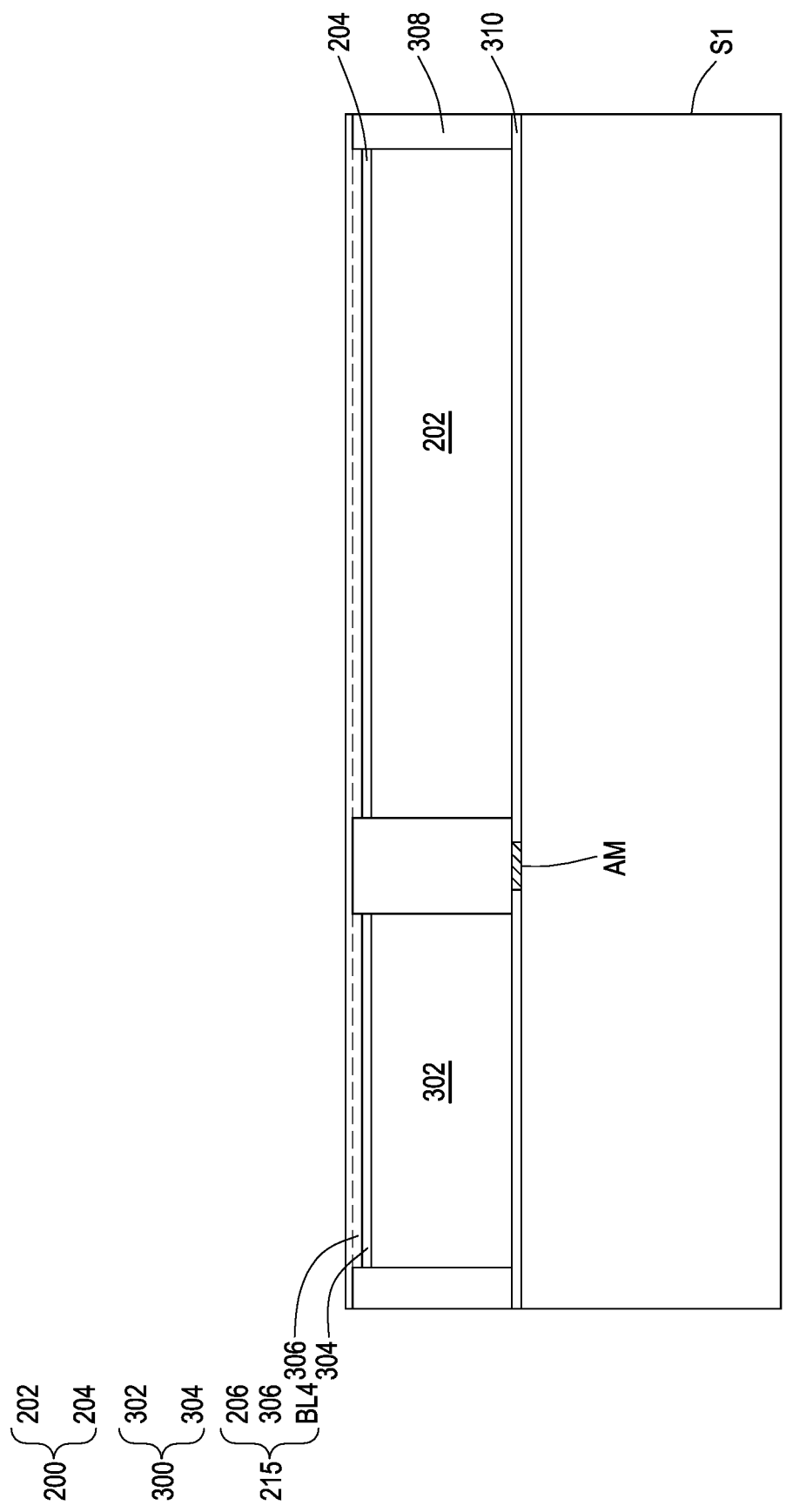
Figure 35:
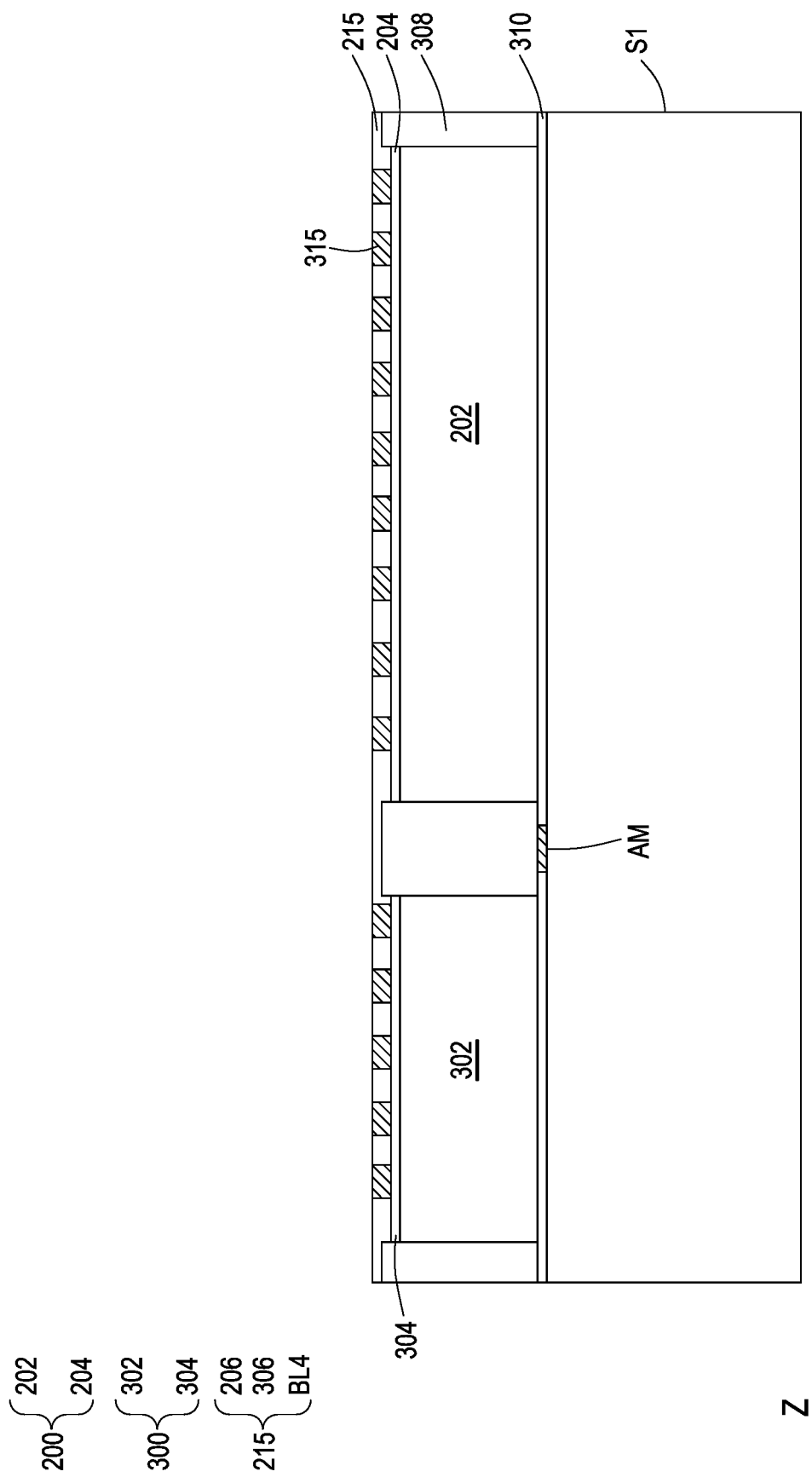
Figure 36:
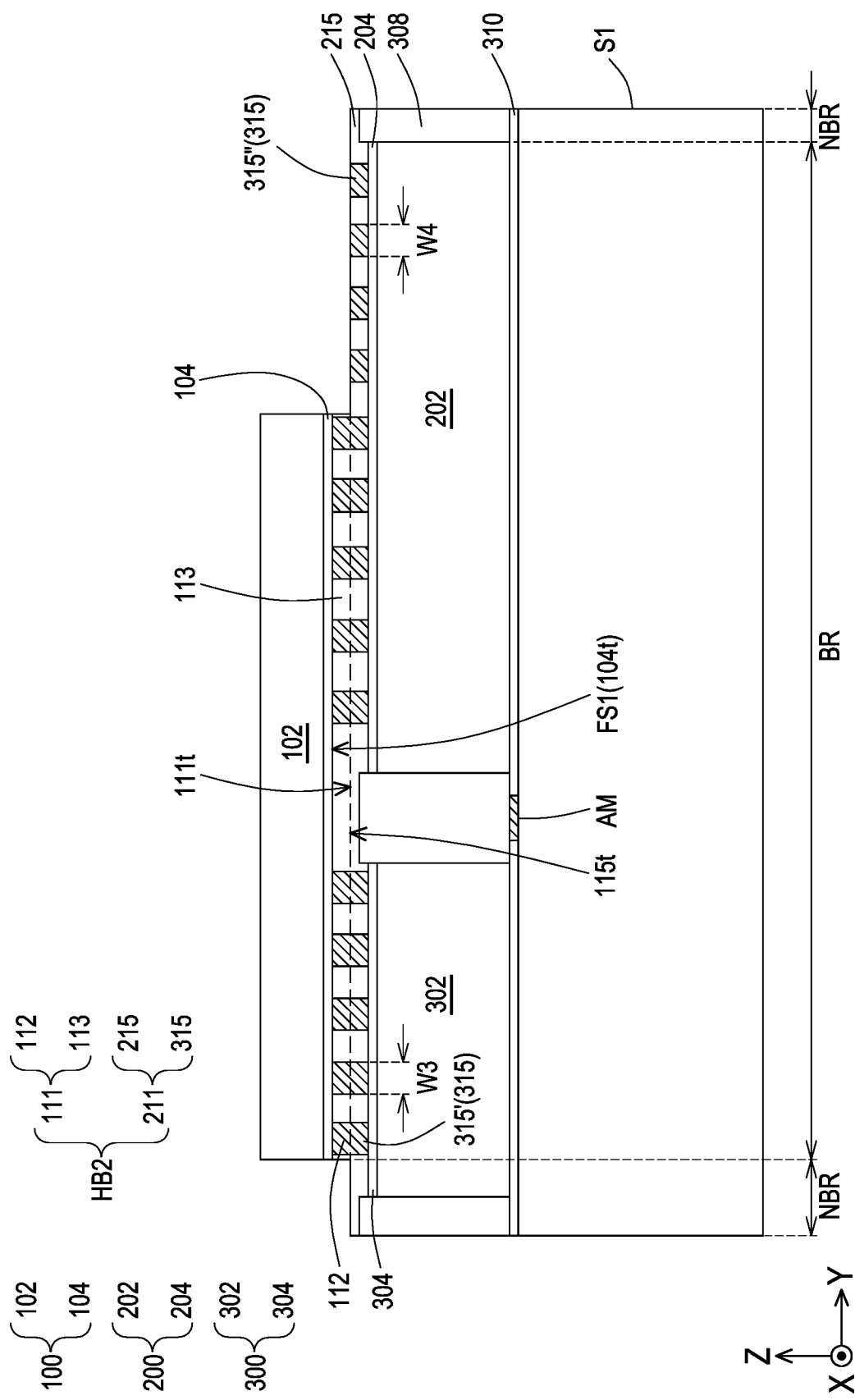

Referring to FIG. 34, the carrier substrate C4 is flipped upside down and then removed from the underlying structure such that the fusion bonding layer 215 between the carrier substrate C4 and the semiconductor dies 200, 300 is exposed. The aforementioned underlying structure is then flipped upside down for further processing.

Figure 37:
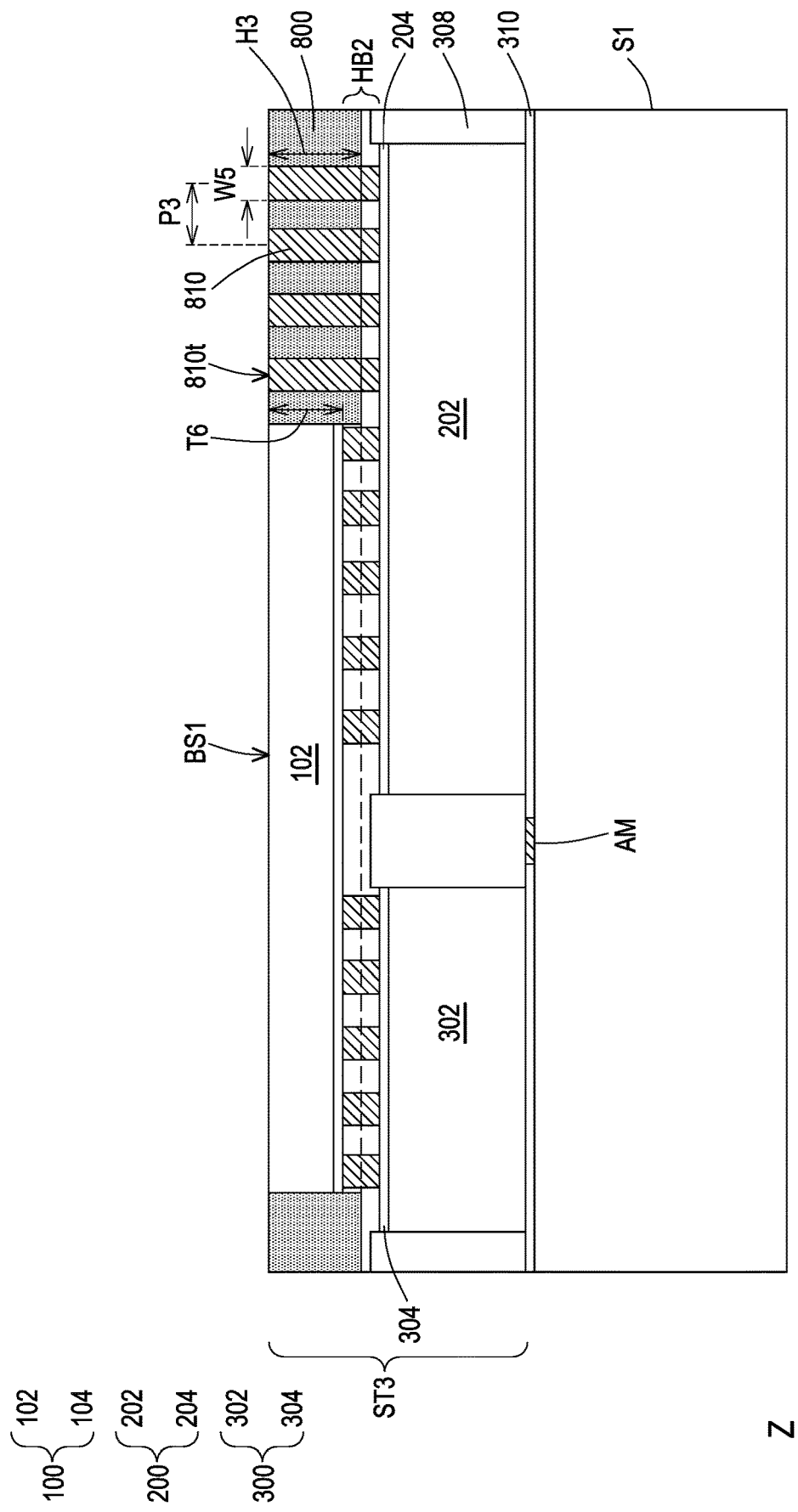
Figure 38:
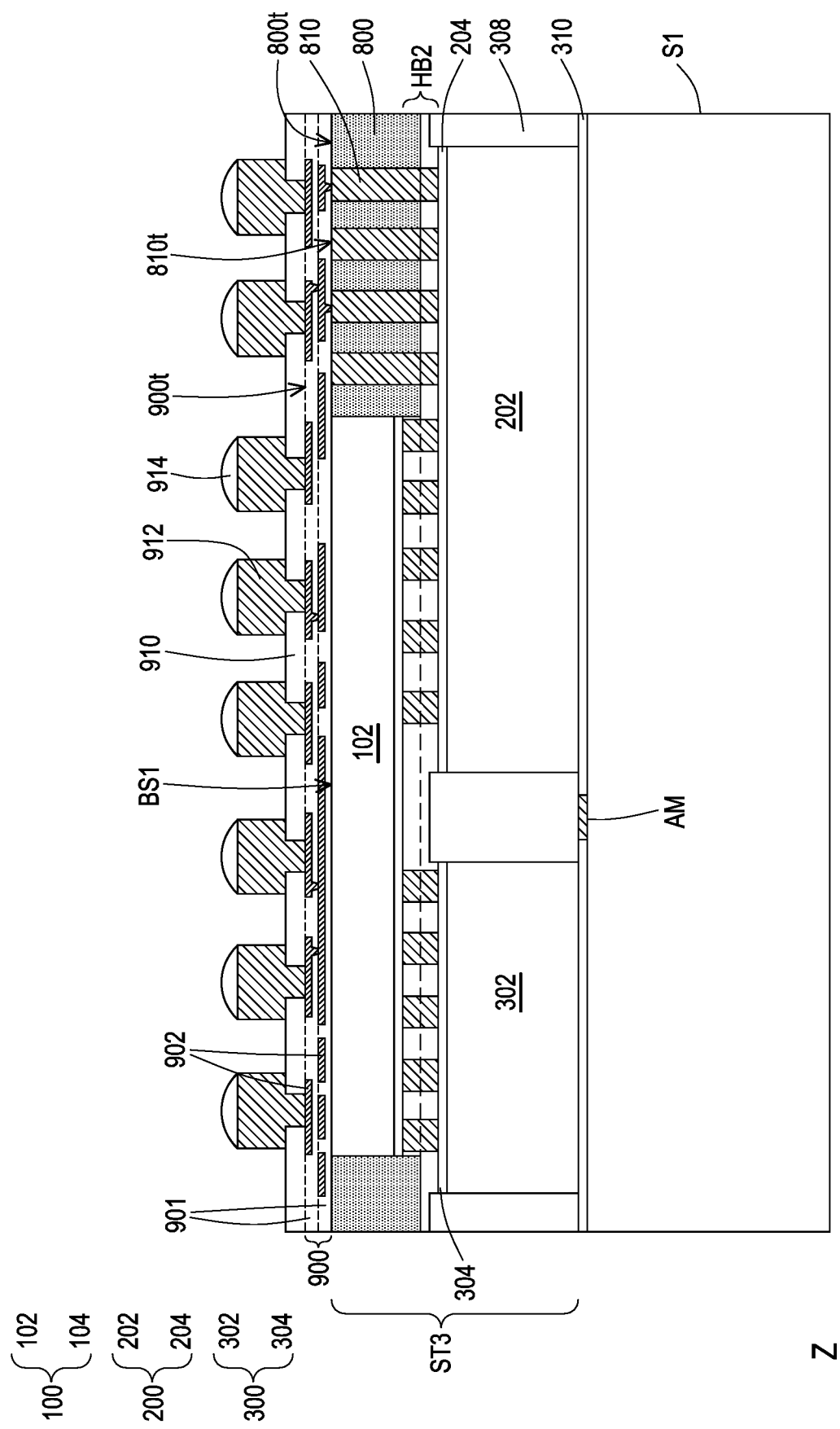
Figure 39:
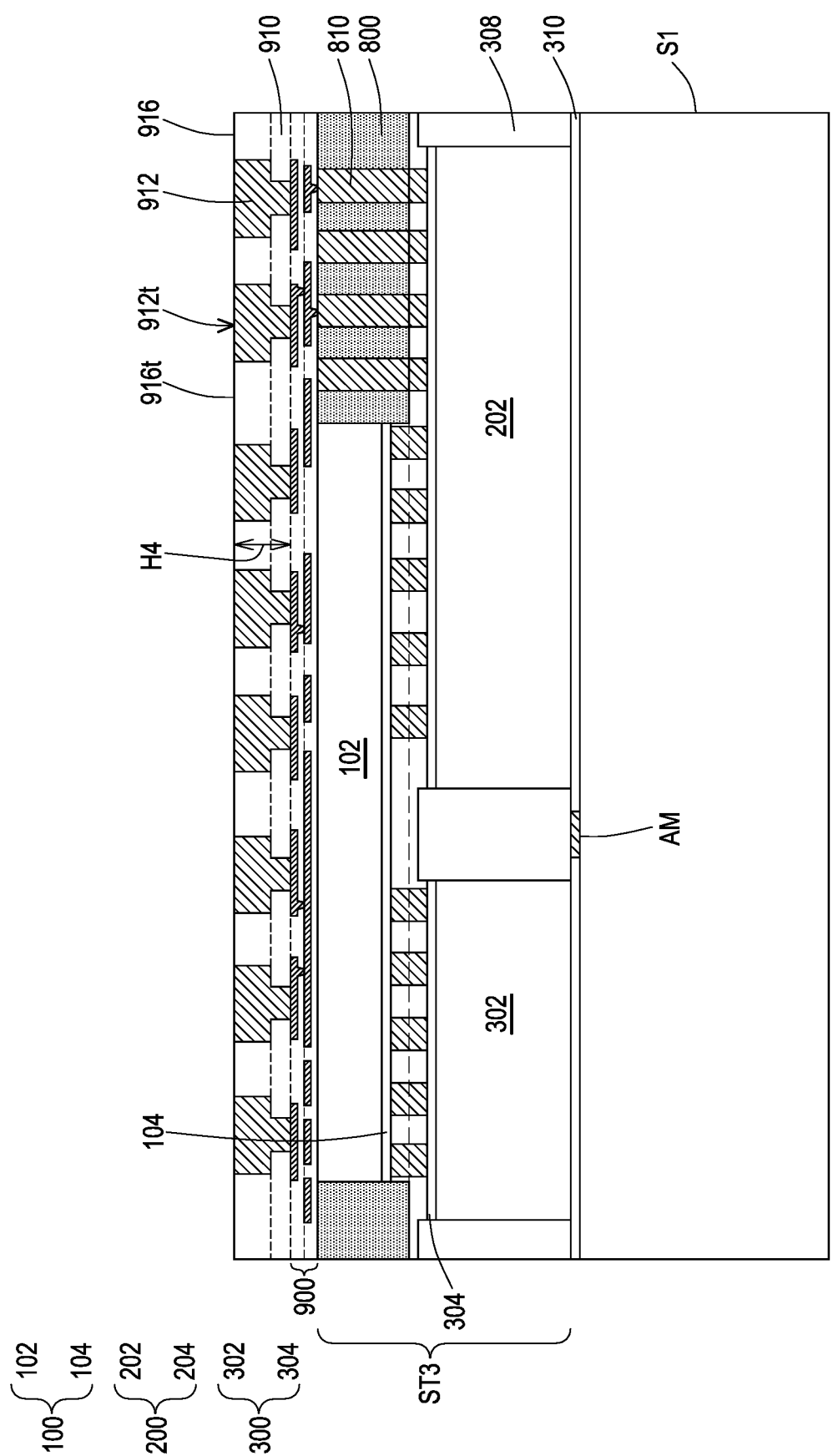

Referring to FIG. 35 through FIG. 39, process steps similar to those shown in FIG. 19 through FIG. 23 is carried out to obtain an intermediate structure including a die stack structure ST3, a first redistribution structure 900, the protect layers 910, 916 and the conductive pillars 912. As illustrated in FIG. 37, in some embodiments, the die stack structure ST3 includes the support substrate S1, the semiconductor dies 100, 200, 300, the first TIVs 810, the hybrid bonding structure HB2, the dielectric layer 308 and the insulation layer 800. Like elements are designated with similar numerical reference for ease of understanding and the details thereof are not repeated herein.

Figure 40:
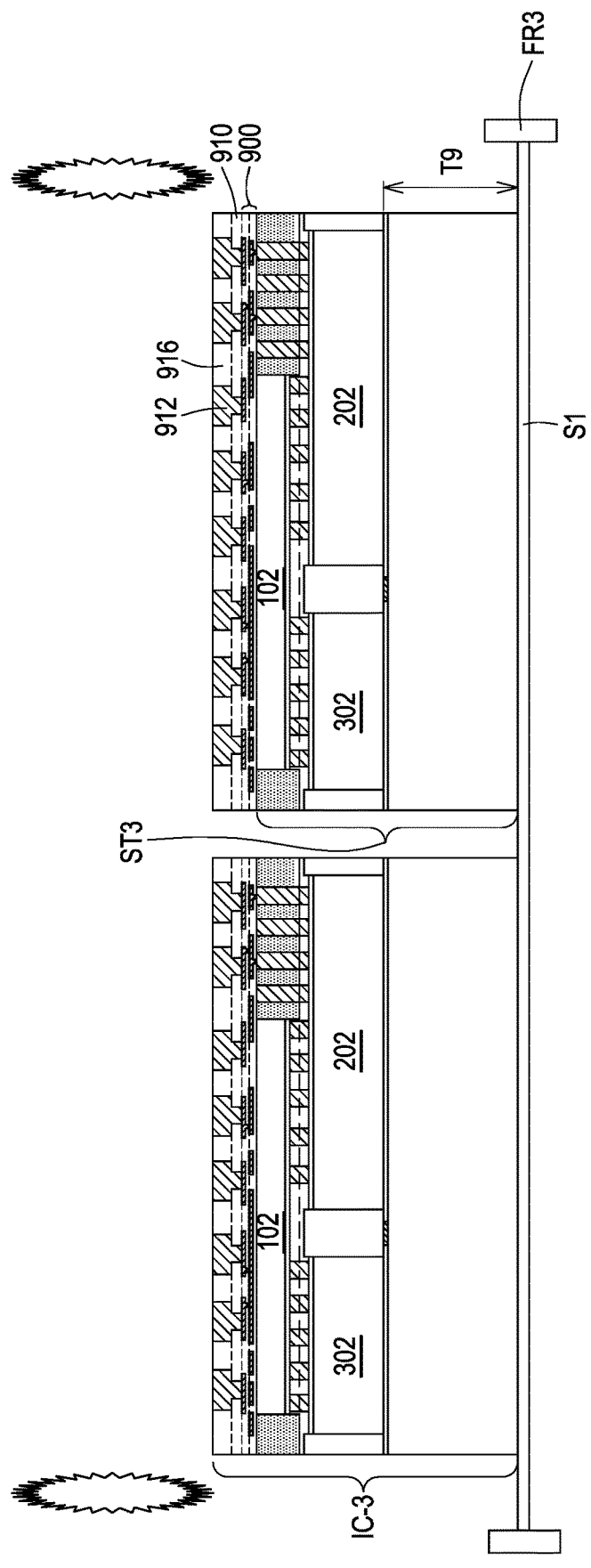
Figure 41:
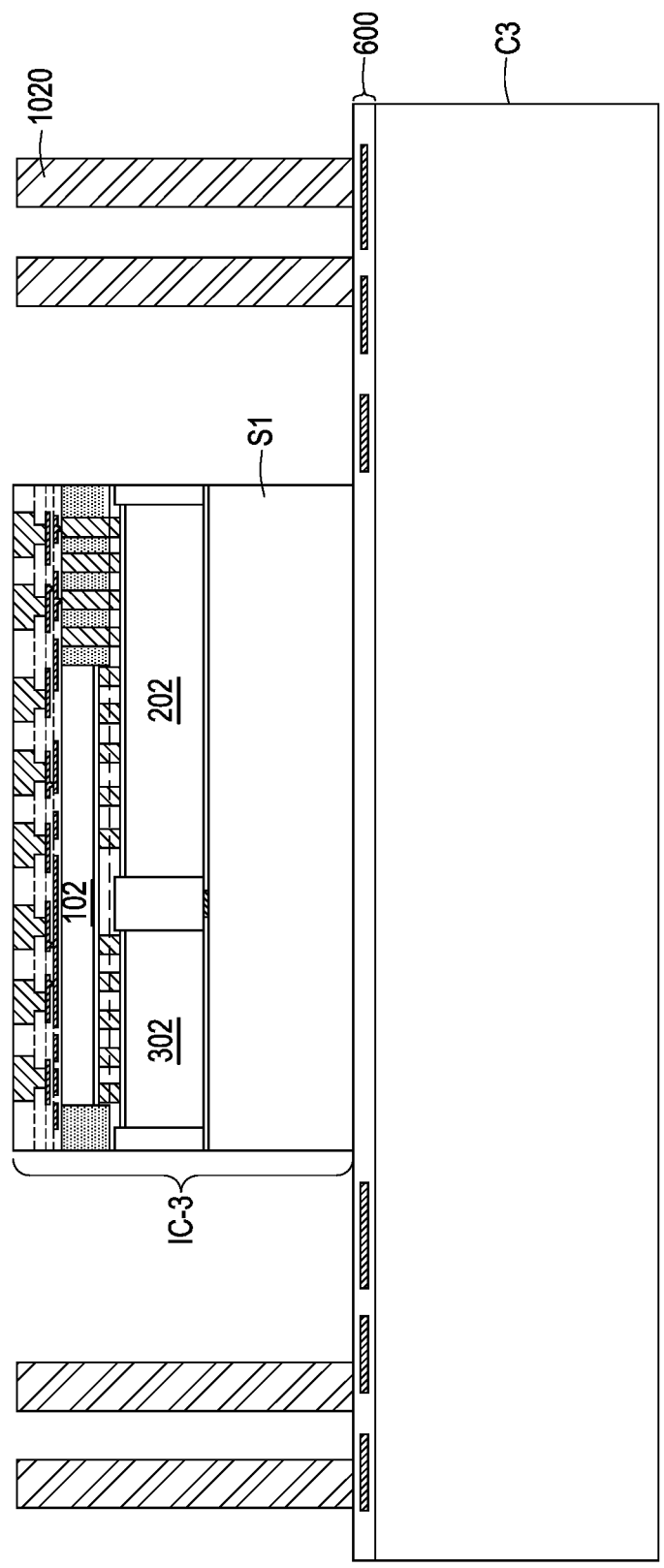
Figure 42:
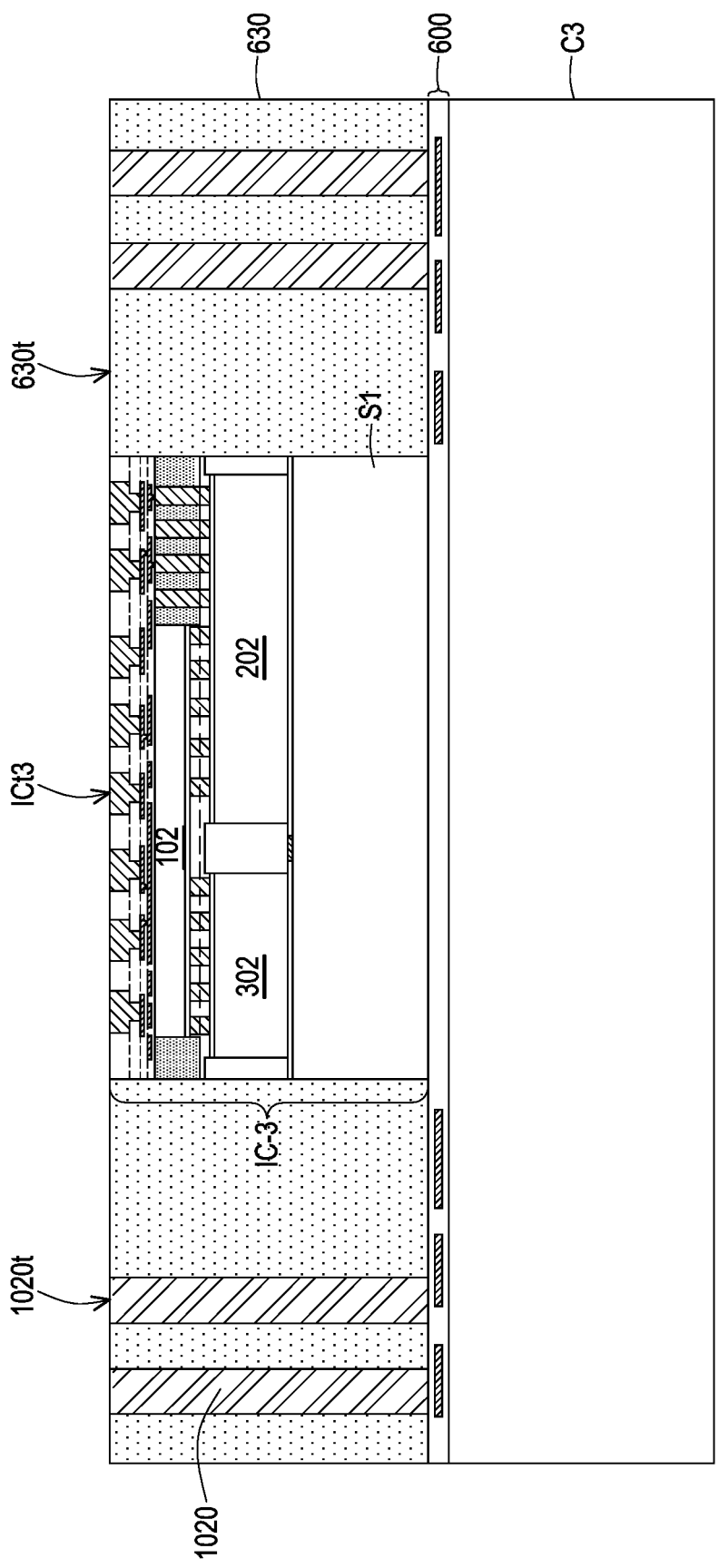
Figure 43:
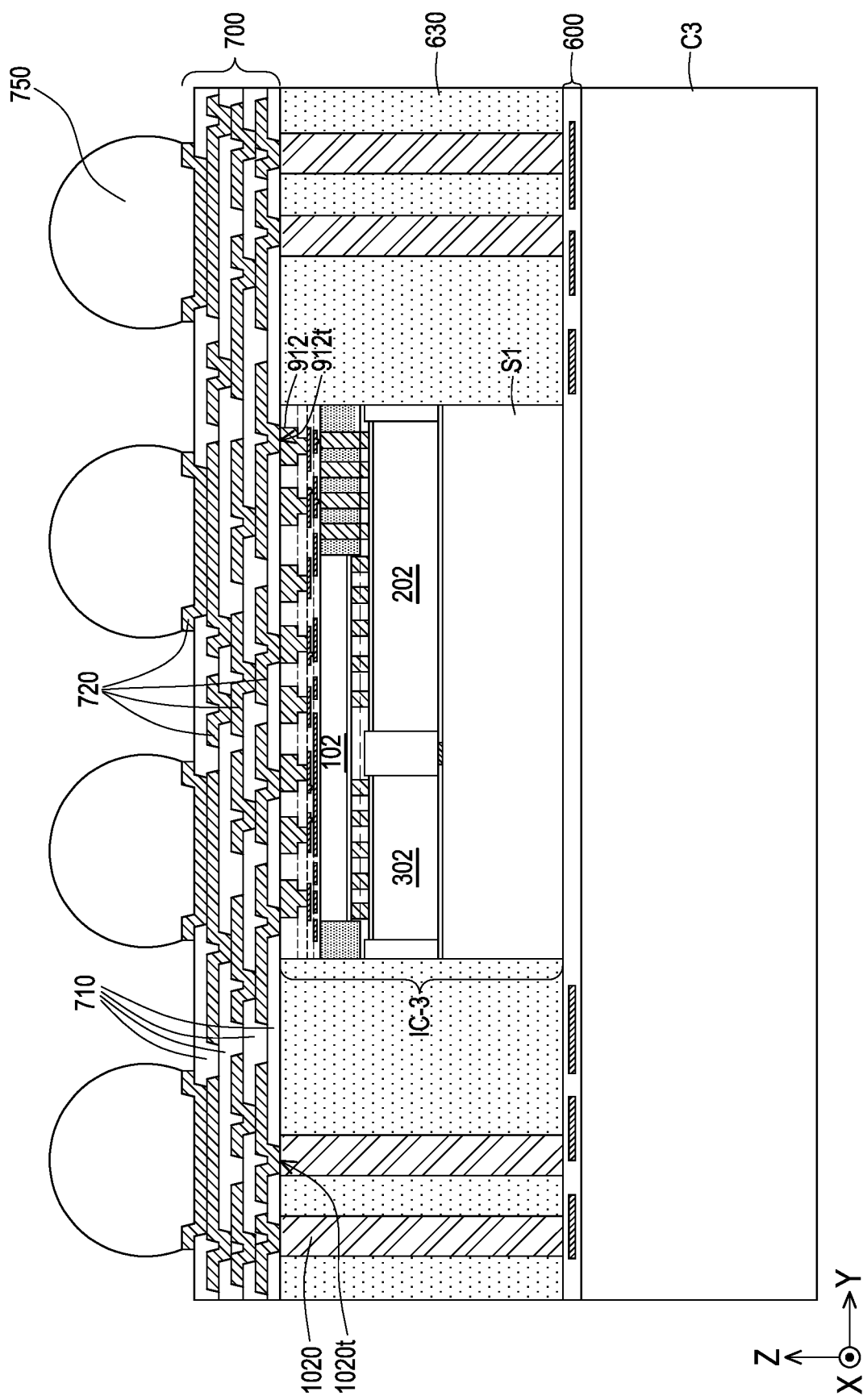

Particularly in FIG. 40, prior to the singulation process, the support substrate S1 is thinned to have a desire thickness T9. For example, the thickness T9 may range from about 150 μm to about 250 μm. The thinned structure is picked and placed on a frame structure FR3, followed by performing a singulation process to obtain multiple singulated structures as shown in FIG. 40. The singulated structures may also be referred to as integrated circuits IC-3. In some embodiments, each integrated circuit IC-3 includes one of the die stack structure ST3 and the first redistribution structure 900 stacked thereon; the protection layers 910, 916 and the conductive pillars 912 embedded in the protection layers 910, 916.

Figure 44:
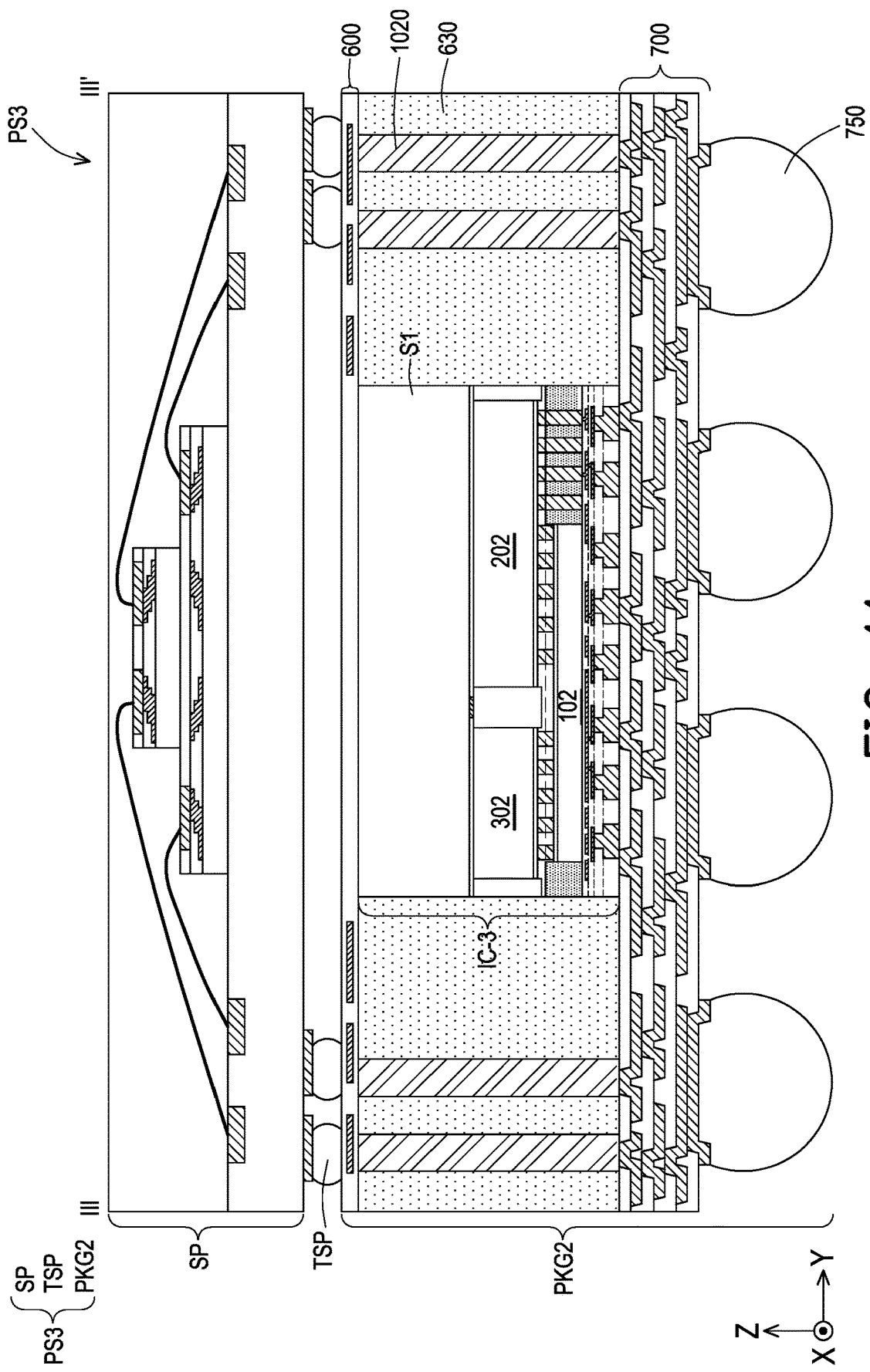
Figure 45C:
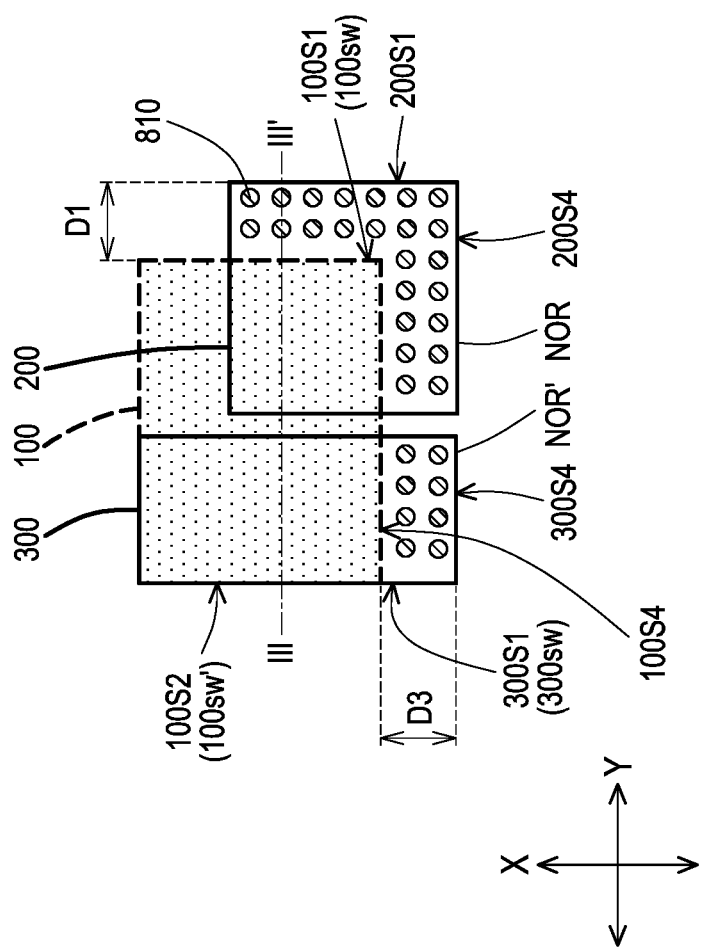

Referring to FIG. 41 through FIG. 44, a semiconductor package PKG3 is fabricated and then connected to another semiconductor package SP to construct a package structure PS3. The semiconductor package PKG3 and the package structure PS3 may be fabricated in a similar process steps shown in FIG. 26 through FIG. 29, with similar features being labeled by similar numerical reference, and the detailed descriptions of the similar features are not repeated herein. The semiconductor package PKG2 and the package structure PS2 shown in FIG. 44 are respectively similar to the semiconductor package PKG2 and the package structure PS2 shown in FIG. 29, with the distinction that the integrated circuits IC-3 are used to fabricate the aforementioned package structure.

Aside from the addition of the support substrate S1, another difference between the integrated circuits IC-3 and the integrated circuits IC-2 is the relative positions of the semiconductor dies 100, 200, 300, and the first TIVs 810. The relative positions of the semiconductor dies 100, 200, 300 and the first TIVs 810 in the package structure PS2 are clarified in FIG. 44 and FIGS. 45A-45C. FIG. 44 may be the schematic cross-sectional view taken along a cross-sectional lines III-III' depicted in FIGS. 45A-45C. It will be appreciated that FIGS. 45A-45C merely illustrate the semiconductor dies 100, 200, 300 and the first TIVs 810 for simplicity. For example, due to the process variations, the relative positions of the semiconductor dies 100, 200, 300 shown in FIGS. 45A-45C may be in a mirror relationship with those shown in FIGS. 30A-30C. However, the disclosure is not limited thereto. It should be noted that the positional relation between the semiconductor dies 100, 200, 300 may be adjusted according to design requirements such as signal transmission or warpage control.

Generally, the structures and methods of the present disclosure may be used to form a through-substrate-vias-free (TSV-free) semiconductor package, which may effectively reduce the process difficulties and manufacturing cost, as well as increase the areal density of the integrated circuits since there is no need to further form the TSVs extending through the substrate. In addition, the through dielectric vias (TDVs) or the through insulation vias (TIVs) may be used as a fine-pitch electrical connection and further enhance the performance of the application.

In accordance with some embodiments of the disclosure, a package structure includes a first semiconductor package, and the first semiconductor package includes an integrated circuit therein. The integrated circuit includes a first semiconductor die and a plurality of second semiconductor dies. The plurality of second semiconductor dies are stacked on the first semiconductor die, wherein at least one of orthogonal projections of the plurality of second semiconductor dies is partially overlapped an orthogonal projection of the first semiconductor die. The integrated circuit further includes first through vias and an encapsulant laterally encapsulating the first semiconductor die and the first through vias, wherein the first through vias are formed aside the first semiconductor and arranged in a non-overlapped region of the at least one of the orthogonal projections of the plurality of second semiconductor dies with the orthogonal projection of the first semiconductor die In accordance with some other embodiments of the disclosure, a package structure includes a first semiconductor package and a second semiconductor package connected to the first semiconductor package. The first semiconductor package includes an integrated circuit including a die stack structure of a first semiconductor die, a second semiconductor die and a third semiconductor die, wherein the second semiconductor die and the third semiconductor die are bonded to the first semiconductor die, and a sidewall of the second semiconductor die keeps a distance outwards from a first sidewall of the first semiconductor die.

In accordance with some other embodiments of the disclosure, a manufacturing method of a semiconductor package includes at least the following steps. A first semiconductor die and a plurality of second semiconductor dies are provided, and the plurality of second semiconductor dies are bonded to the first semiconductor die with a hybrid bonding structure therebetween to form a die stack structure. First through vias are formed over the hybrid bonding structure aside the first semiconductor die, a first encapsulant is formed to laterally encapsulates the first semiconductor die, wherein the first through vias extends through the first encapsulant. A first redistribution structure is formed over the first semiconductor die, the first through vias and the first encapsulant such that an integrated circuit is formed, and a second redistribution structure and a third redistribution structure are respectively formed on the opposite sides of the integrated circuit.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
a first semiconductor package comprising:
an integrated circuit comprising:
a first semiconductor die;
a first bonding structure disposed on the first semiconductor die, the first bonding structure comprising a first dielectric layer and first conductive pads in the first dielectric layer;
a plurality of second semiconductor dies stacked on the first semiconductor die, wherein at least one of orthogonal projections of the plurality of second semiconductor dies is partially overlapped an orthogonal projection of the first semiconductor die;
second bonding structures, each of the second bonding structures being respectively disposed on one of the second semiconductor dies, each of the second bonding structures respectively comprising a second dielectric layer and second conductive pads in the second dielectric layer, wherein the first conductive pads are bonded with the second conductive pads, and the first dielectric layer is bonded with the second dielectric layer;
first through vias aside the first semiconductor die and the first through vias are arranged in a non-overlapped region of the at least one of the orthogonal projections of the plurality of second semiconductor dies with the orthogonal projection of the first semiconductor die; and
a first encapsulant laterally encapsulating the first semiconductor die and the first through vias.

2. The package structure of claim 1, wherein the plurality of second semiconductor dies are stacked on the first semiconductor die in a manner that active surfaces of the plurality of second semiconductor dies face towards a back side surface of the first semiconductor die.

3. The package structure of claim 1, wherein the plurality of second semiconductor dies are stacked on the first semiconductor die in a manner that active surfaces of the plurality of second semiconductor dies face towards an active surface of the first semiconductor die.

4. The package structure of claim 1, wherein the second bonding structures are spaced apart from each other.

5. The package structure of claim 1, wherein the first semiconductor package further comprising:
second through vias aside the integrated circuit;
a second encapsulant laterally encapsulating the integrated circuit and the second through vias; and
a front-side redistribution structure on a first side of the integrated circuit.

6. The package structure of claim 5, wherein the first through vias extend through the first encapsulant and electrically connect the plurality of second semiconductor dies and the front-side redistribution structure.

7. The package structure of claim 5, wherein the integrated circuit further comprises a redistribution structure between the front-side redistribution structure and the first semiconductor die, and the redistribution structure is electrically connected to the first bonding structure through the first through vias.

8. The package structure of claim 5, wherein the package structure further comprising:
a back-side redistribution structure on a second side of the integrated circuit, wherein the front-side redistribution structure is electrically connected to the back-side redistribution structure through the second through vias; and
a second semiconductor package over the back-side redistribution structure, wherein the second semiconductor package is connected to the first semiconductor package through the back-side redistribution structure.

9. A package structure, comprising:
a first semiconductor package comprising:
an integrated circuit comprises a die stack structure of a first semiconductor die, a second semiconductor die and a third semiconductor die, wherein the second semiconductor die and the third semiconductor die are bonded to the first semiconductor die through a bonding structure, the bonding structure comprises stacked dielectric layers and conductive pads in the stacked dielectric layers, and a sidewall of the second semiconductor die keeps a distance outwards from a first sidewall of the first semiconductor die; and
a second semiconductor package connected to the first semiconductor package.

10. The package structure of claim 9, wherein a sidewall of the third semiconductor die is substantially aligned with a second sidewall of the first semiconductor die, and the second sidewall of the first semiconductor die is on opposite side of the first sidewall of the first semiconductor die.

11. The package structure of claim 9, wherein active surfaces of the second semiconductor die and the third semiconductor die and a back side surface of the first semiconductor die are in physical contact with the bonding structure therebetween.

12. The package structure of claim 11, wherein the integrated circuit further comprising:
a plurality of conductive pillars over the die stack structure;
a dielectric layer laterally encapsulating the first semiconductor die; and
through dielectric vias extending through the dielectric layer, wherein the through dielectric vias are aside the first semiconductor die and arranged between the plurality of the conductive pillars and a portion of the bonding structure, and the through dielectric vias are electrically connected to the second semiconductor die through the portion of the bonding structure.

13. The package structure of claim 9, wherein active surfaces of the second semiconductor die and the third semiconductor die and an active surface of the first semiconductor die are in physical contact with the bonding structure therebetween.

14. The package structure of claim 13, wherein the integrated circuit further comprises a semiconductor substrate, and the semiconductor substrate is on back surfaces of the second semiconductor die and the third semiconductor die.

15. The package structure of claim 13, wherein the integrated circuit further comprising:
a plurality of conductive pillars over the die stack structure;
an insulation layer laterally encapsulating the first semiconductor die; and
through insulation vias extending through the insulation layer, wherein the through insulation vias are aside the first semiconductor die and arranged between the plurality of the conductive pillars and a portion of the bonding structure, and the through insulation vias are electrically connected to the second semiconductor die through the portion of the bonding structure.

16. A manufacturing method of a package structure, comprising:
    providing a first semiconductor die and a plurality of second semiconductor dies;
    bonding the plurality of second semiconductor dies to the first semiconductor die with a hybrid bonding structure therebetween to form a die stack structure;
    forming first through vias over the hybrid bonding structure aside the first semiconductor die;
    forming a first encapsulant laterally encapsulating the first semiconductor die, wherein the first through vias extends through the first encapsulant;
    forming a first redistribution structure over the first semiconductor die, the first through vias and the first encapsulant such that an integrated circuit is formed; and
    forming a second redistribution structure and a third redistribution structure on the opposite sides of the integrated circuit.

17. The manufacturing method of claim 16, wherein at least one of orthogonal projections of the plurality of second semiconductor dies is partially overlapped an orthogonal projection of the first semiconductor die, and the first through vias are located in a non-overlapped region of the at least one of the orthogonal projections of the plurality of second semiconductor dies with the orthogonal projection of the first semiconductor die.

18. The manufacturing method of claim 17, wherein the first though vias are formed into an array in the non-overlapped region to electrically connect the plurality of the second semiconductor dies and the hybrid bonding structure.

19. The manufacturing method of claim 16, further comprising:
    forming a second encapsulant between the second redistribution structure and the third redistribution structure to laterally encapsulate the integrated circuit; and
    forming a plurality of second through vias extending through the second encapsulant aside the integrated circuit such that the second redistribution structure and the third redistribution structure are electrically connected.

20. The manufacturing method of claim 16, wherein the die stack structure comprises a support substrate bonded to a back side surface of the plurality of second semiconductor dies.

* * * * *